(12) United States Patent
Kim et al.

(10) Patent No.: US 12,484,271 B2
(45) Date of Patent: Nov. 25, 2025

(54) POWER SEMICONDUCTOR DEVICE AND METHOD FOR FABRICATING THE SAME

(71) Applicant: HYUNDAI MOBIS Co., Ltd., Seoul (KR)

(72) Inventors: Sin A Kim, Yongin-si (KR); Tae Yeop Kim, Yongin-si (KR); Jeong Mok Ha, Yongin-si (KR); Dong Hwan Choi, Yongin-si (KR); Hyuk Woo, Yongin-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 552 days.

(21) Appl. No.: 17/827,733

(22) Filed: May 29, 2022

(65) Prior Publication Data

US 2023/0009426 A1    Jan. 12, 2023

(30) Foreign Application Priority Data

Jul. 6, 2021   (KR) .................. 10-2021-0088592
Jul. 6, 2021   (KR) .................. 10-2021-0088603
(Continued)

(51) Int. Cl.
*H01L 29/15* (2006.01)
*H01L 29/08* (2006.01)
(Continued)

(52) U.S. Cl.
CPC ..... *H10D 62/8171* (2025.01); *H10D 30/0297* (2025.01); *H10D 30/668* (2025.01);
(Continued)

(58) Field of Classification Search
CPC ............. H10D 62/8171; H10D 62/153; H10D 62/154; H10D 62/111; H10D 62/393;
(Continued)

(56) References Cited

U.S. PATENT DOCUMENTS

| 6,627,950 B1 | 9/2003 | Bulucea et al. |
| 2007/0029597 A1 | 2/2007 | Lee et al. |

(Continued)

FOREIGN PATENT DOCUMENTS

| CN | 104885227 A | 9/2015 |
| CN | 107546268 A | 1/2018 |

(Continued)

OTHER PUBLICATIONS

Sachiko translation (Year: 2016).*
(Continued)

*Primary Examiner* — Steven B Gauthier
*Assistant Examiner* — Rhys Poniente Sheker
(74) *Attorney, Agent, or Firm* — MORGAN, LEWIS & BOCKIUS LLP

(57) ABSTRACT

A power semiconductor device includes an SiC semiconductor layer, a plurality of well regions disposed in the semiconductor layer such that two adjacent well regions at least partially make contact with each other, a plurality of source regions on the plurality of well regions in the semiconductor layer, a drift region in a first conductive type, a plurality of trenches recessed into the semiconductor layer from the surface of the semiconductor layer, a gate insulating layer on an inner wall of each trench, a gate electrode layer disposed on the gate insulating layer and including a first part disposed in each trench and a second part on the semiconductor layer, and a pillar region positioned under the plurality of well regions to make contact with the drift region and the plurality of well regions in the semiconductor layer, and having a second conductive type.

17 Claims, 70 Drawing Sheets

| (30) | Foreign Application Priority Data | |
|---|---|---|
| Jul. 6, 2021 | (KR) | 10-2021-0088645 |
| Jul. 6, 2021 | (KR) | 10-2021-0088709 |
| Jul. 6, 2021 | (KR) | 10-2021-0088710 |
| Dec. 17, 2021 | (KR) | 10-2021-0181266 |
| Dec. 17, 2021 | (KR) | 10-2021-0181267 |
| Dec. 17, 2021 | (KR) | 10-2021-0181268 |
| Jan. 3, 2022 | (KR) | 10-2022-0000357 |
| Jan. 3, 2022 | (KR) | 10-2022-0000358 |

(51) Int. Cl.
  *H01L 29/66*     (2006.01)
  *H01L 29/78*     (2006.01)
  *H10D 30/01*     (2025.01)
  *H10D 30/66*     (2025.01)
  *H10D 62/13*     (2025.01)
  *H10D 62/815*    (2025.01)
  *H10D 84/83*     (2025.01)

(52) U.S. Cl.
  CPC ......... *H10D 62/153* (2025.01); *H10D 62/154* (2025.01); *H10D 84/83* (2025.01)

(58) Field of Classification Search
  CPC ............. H10D 62/8325; H10D 62/124; H10D 30/029; H10D 30/668; H10D 30/635; H10D 30/60–798; H10D 30/021–0415; H10D 84/83
  See application file for complete search history.

(56) References Cited

U.S. PATENT DOCUMENTS

| | | | |
|---|---|---|---|
| 2007/0181939 A1 | 8/2007 | Huang et al. | |
| 2009/0146154 A1 | 6/2009 | Zhang et al. | |
| 2016/0155836 A1 | 6/2016 | Iwamuro et al. | |
| 2017/0365709 A1 | 12/2017 | Ohashi et al. | |
| 2020/0303494 A1* | 9/2020 | Shimizu | H10D 64/513 |
| 2022/0399460 A1* | 12/2022 | Lau | H10D 30/0297 |

FOREIGN PATENT DOCUMENTS

| | | | |
|---|---|---|---|
| CN | 109427886 A | | 3/2019 |
| CN | 109830527 A | | 5/2019 |
| CN | 112151619 A | | 12/2020 |
| JP | 5554417 B2 | | 7/2014 |
| JP | 2015-179782 A | | 10/2015 |
| JP | 2018010995 A | * | 1/2018 |
| JP | 2020-053605 A | | 4/2020 |
| KR | 10-2015-0076840 A | | 7/2015 |
| KR | 10-2018-0001044 A | | 1/2018 |
| WO | 2012/165329 A1 | | 12/2012 |

OTHER PUBLICATIONS

Office Action issued in corresponding Korean Patent Application No. 10-2021-0181266 dated Feb. 6, 2023, with English translation.
Office Action issued in corresponding Chinese Patent Application No. 202210563781.X dated May 24, 2025, with English translation.
Office Action issued in corresponding Chinese Patent Application No. 202210563781.X dated Jul. 30, 2025.
Office Action issued in corresponding Korean Patent Application No. 10-2021-0181267 dated Jul. 10, 2025, with English translation.

* cited by examiner

POWER SEMICONDUCTOR DEVICE AND METHOD FOR FABRICATING THE SAME

CROSS-REFERENCE TO RELATED APPLICATION

This application claims the benefit of priority to Korean Patent Application Nos. 10-2021-0088645, 10-2021-0181266, 2021-0088603, 2021-0181267, 2021-0088592, 2021-0181268, 2021-0088709, 2022-0000357, 2021-0088710, and 2022-0000358 filed in the Korean Intellectual Property Offices on Jul. 6, 2021, Dec. 17, 2021, Jul. 6, 2021, Dec. 17, 2021, Jul. 6, 2021, Dec. 17, 2021, Jul. 6, 2021, Jan. 3, 2022, Jul. 6, 2021, and Jan. 3, 2022, the entire contents of which are incorporated herein by reference.

TECHNICAL FIELD

The present disclosure relates to a semiconductor device, and more particularly, relates to a power semiconductor device capable of switching power transmission and a method for fabricating the same.

BACKGROUND

A power semiconductor device refers to a semiconductor device that operates in a high-voltage and high-current environment. The power semiconductor device has been used in a field requiring high power switching. For example, the power semiconductor device has been used in power conversion, a power converter, or an inverter. The power semiconductor device may include an insulated gate bipolar transistor (IGBT), or a Power metal oxide semiconductor field effect transistor (Power MOSFET).

The power semiconductor device should satisfy a high voltage characteristic and should operate stably at a higher temperature. Accordingly, studies and researches have been actively performed regarding a power semiconductor device using silicon carbide (SiC) instead of silicon (Si).

Silicon carbide (SiC), which is a wide gap semiconductor material having a bandgap higher than a bandgap of silicon (Si), may maintain stability even at a higher temperature, as compared to silicon (Si). Further, silicon carbide (SiC) exhibits a dielectric breakdown field remarkably higher than a dielectric breakdown field of silicon (Si). Accordingly, silicon carbide (SiC) may stably work even at a higher voltage. Accordingly, silicon carbide (SiC) has a breakdown voltage higher than that of silicon (Si), and represents a more excellent heat dissipation characteristic. Accordingly, silicon carbide (SiC) has an operable characteristic.

However, in the case of the power semiconductor device using the silicon carbide (SiC), a bandgap of the silicon carbide (SiC) surface may be increased upward due to the influence of a negative charge resulting from a trap existing in the interface between a gate and the silicon carbide interface, thereby increasing the threshold voltage, such that the channel resistance is increased. In addition, there is a limitation in increasing a channel density only through an existing planar or trench structure.

SUMMARY

The present disclosure has been made to solve the above-mentioned problems occurring in the prior art while advantages achieved by the prior art are maintained intact.

Embodiments of the present disclosure may provide following features.

First, as the hybrid-type structure including the trench-type gate structure and the planar-type gate structure is implemented, a current may flow through a channel (or an inversion channel) which is provided under the planar-type gate electrode layer and on the sidewall of the trench-type gate structure, thereby increasing the channel density.

Second, the pillar region is formed in the drift region, thereby forming the super junction, such that the higher breakdown voltage may be obtained under the condition of the equal epitaxial layer thickness.

Third, the well regions are formed under the trench to surround the trench. Accordingly, the size of the electric field concentrated on the corner of the trench may be reduced.

Fourth, the electric field concentrated on the corner of the trench may be reduced by forming the well regions surrounding opposite corners of the trench.

Fifth, the channel resistance may be reduced by partially implanting impurities, which is in the conductive type opposite to the conductive type of the well regions, into the well regions, such that counter-doping is achieved.

Sixth, the JFET resistance may be reduced in the flow of the current in the vicinity of the well region by implanting impurities, which is in the conducive type the same as the conductive type of the drift region, into the entire surface of the upper portion of the drift region.

However, the above objects are examples, and the scope and spirit of the present disclosure is not limited thereto.

The technical problems to be solved by the present disclosure are not limited to the aforementioned problems, and any other technical problems not mentioned herein will be clearly understood from the following description by those skilled in the art to which the present disclosure pertains.

According to an aspect of the present disclosure, a power semiconductor device may include a semiconductor layer of silicon carbide (SiC), a plurality of well regions disposed in the semiconductor layer such that two adjacent well regions at least partially make contact with each other, and having a second conductive type, a plurality of source regions disposed on the plurality of well regions, respectively, in the semiconductor layer, and having a first conductive type opposite to the second conductive type, a drift region disposed in the semiconductor layer while extending to a surface of the semiconductor layer from lower portions of the plurality of well regions through a region between the plurality of well regions, and having the first conductive type, a plurality of trenches disposed to be recessed into the semiconductor layer from the surface of the semiconductor layer, in which each trench connects two source regions of the plurality of source regions to each other while passing through a contact portion between the adjacent well regions of the plurality of well regions, a gate insulating layer disposed on an inner wall of each of the plurality of trenches, a gate electrode layer disposed on the gate insulating layer and including a first part disposed in each of the plurality of trenches and a second part disposed on the semiconductor layer, and a pillar region positioned under each of the plurality of well regions to make contact with the drift region and the plurality of well regions in the semiconductor layer, and having the second conductive type.

According to another aspect of the present disclosure, a method for fabricating a power semiconductor device may include forming a drift region having a first conductive type in a semiconductor layer of silicon carbide (SiC), forming a plurality of well regions disposed in the semiconductor layer such that two adjacent well regions at least partially make contact with each other, and having a second conductive type, forming a pillar region positioned under each of the plurality of well regions to make contact with the drift region and the plurality of well regions in the semiconductor layer, and having the second conductive type, forming a plurality of source regions having the first conductive type on the plurality of well regions, respectively, in the semiconductor layer, forming a plurality of trenches to be recessed into the semiconductor layer from the surface of the semiconductor layer, in which each trench connects two source regions from among the plurality of source regions to each other while passing through a contact portion between the adjacent well regions from among the plurality of well regions, forming a gate insulating layer on an inner wall of each of the plurality of trenches, and forming a gate electrode layer including a first part filled in each trench of the plurality of trenches and a second part formed on the semiconductor layer, on the gate insulating layer. The plurality of well regions may be formed to make contact with the drift region, such that the drift region extends from a lower portion of the plurality of well regions to the surface of the semiconductor layer through a region between the plurality of well regions.

According to another aspect of the present disclosure, a power semiconductor device may include a semiconductor layer of silicon carbide (SiC), a plurality of well regions disposed in the semiconductor layer to be spaced apart from each other, and having a second conductive type, a plurality of source regions disposed in the semiconductor layer on the plurality of well regions to be spaced apart from each other, and having a first conductive type opposite to the second conductive type, a drift region disposed in the semiconductor layer while extending to a surface of the semiconductor layer from lower portions of the plurality of well regions through a region between the plurality of well regions, and having the first conductive type, a plurality of trenches disposed to be recessed into the semiconductor layer from the surface of the semiconductor layer, in which each trench connects at least two source regions of the plurality of source regions to each other while passing through the space between the plurality of well regions, a gate insulating layer disposed on an inner wall of each of the plurality of trenches, a gate electrode layer disposed on the gate insulating layer and including a first part disposed in each of the plurality of trenches and a second part disposed on the surface of the semiconductor layer, and a pillar region positioned under each of the plurality of well regions to make contact with the drift region and the plurality of well regions in the semiconductor layer, and having the second conductive type.

According to another aspect of the present disclosure, a method for fabricating a power semiconductor device may include forming a drift region having a first conductive type, in a semiconductor layer of silicon carbide (SiC), forming a plurality of well regions disposed in the semiconductor layer to be spaced apart from each other, and having a second conductive type, forming a pillar region positioned under each of the plurality of well regions to make contact with the drift region and the plurality of well regions in the semiconductor layer, and having the second conductive type, forming a plurality of source regions having a first conductive type, in the semiconductor layer on the plurality of well regions, forming a plurality of trenches formed to be recessed into the semiconductor layer from the surface of the semiconductor layer, in which each trench connects at least two source regions of the plurality of source regions to each other while passing through the space between the plurality of well regions, forming a gate insulating layer formed on an inner wall of each of the plurality of trenches, forming a gate electrode layer formed on the gate insulating layer and including a first part filled in each of the plurality of trenches and a second part formed on the surface of the semiconductor layer. The plurality of well regions may be formed to make contact with the drift region, such that the drift region extends from lower portions of the plurality of well regions to the surface of the semiconductor layer while passing through the space between the plurality of well regions.

According to another aspect of the present disclosure, a power semiconductor device may include a semiconductor layer of silicon carbide (SiC), a plurality of well regions disposed in the semiconductor layer, such that adjacent well regions at least partially makes contact with each other, and having a second conductive type, a plurality of source regions disposed in the semiconductor layer on the plurality of well regions, and having a first conductive type opposite to the second conductive type, a drift region disposed in the semiconductor layer, while extending to a surface of the semiconductor layer from lower portions of the plurality of well regions through a region between the plurality of well regions, and having the first conductive type, a plurality of trenches disposed to be recessed into the semiconductor layer from the surface of the semiconductor layer, in which each trench connects at least two source regions of the plurality of source regions to each other while passing through a contact part between of the adjacent well regions of the plurality of well regions, a gate insulating layer disposed on an inner wall of each of the plurality of trenches, a gate electrode layer disposed on the gate insulating layer and including a first part disposed in each of the plurality of trenches and a second part disposed on the surface of the semiconductor layer, and a pillar region positioned under the plurality of well regions to make contact with the drift region and the plurality of well regions, in the semiconductor layer and having the second conductive type. The plurality of source regions may include counter doping regions that may include impurities of the first conductive type and contact the drift region. The counter doping regions may be formed by partially doping the first conductive type of impurities into the plurality of well regions making contact with the plurality of source regions.

According to another aspect of the present disclosure, a method for fabricating a power semiconductor device may include forming a drift region having a first conductive type, in a semiconductor layer of silicon carbide (SiC), forming a plurality of well regions disposed in the semiconductor layer, such that adjacent well regions at least partially makes contact with each other, and having a second conductive type, forming a pillar region positioned under each of the plurality of well regions to make contact with the drift region and the plurality of well regions in the semiconductor layer, and having the second conductive type, forming a plurality of source regions formed in the semiconductor layer on the plurality of well regions, and having a first conductive type, forming counter doping regions formed by partially doping the first conductive type of impurities into a portion of the plurality of well regions making contact with the plurality of source regions and the drift region, forming a plurality of trenches formed to be recessed into the semiconductor layer from the surface of the semiconductor layer, in which each trench connects at least two source regions of the plurality of source regions to each other while passing through a contact part between of the adjacent well regions of the plurality of well regions, forming a gate insulating layer formed on an inner wall of each of the plurality of trenches, forming a gate electrode layer formed on the gate insulating layer and including a first part filled in each of the plurality of trenches and a second part formed on the surface of the semiconductor layer. The plurality of well regions may be formed to make contact with the drift region, such that the drift region extends from lower portions of the plurality of well regions to the surface of the semiconductor layer while passing through the space between the plurality of well regions.

According to another aspect of the present disclosure, a power semiconductor device may include a semiconductor layer of silicon carbide (SiC), a plurality of well regions disposed in the semiconductor layer, such that adjacent well regions at least partially makes contact with each other, and having a second conductive type, a plurality of source regions disposed in the semiconductor layer on the plurality of well regions, and having a first conductive type opposite to the second conductive type, a first drift region disposed in the semiconductor layer and having the first conductive type, a second drift region disposed on the first drift region, while extending to a surface of the semiconductor layer from lower portions of the plurality of well regions through a region between the plurality of well regions, and having the first conductive type, a plurality of trenches disposed to be recessed into the semiconductor layer from the surface of the semiconductor layer, in which each trench connects at least two source regions of the plurality of source regions to each other while passing through a contact part between of the adjacent well regions of the plurality of well regions, a gate insulating layer disposed on an inner wall of each of the plurality of trenches, and a gate electrode layer disposed on the gate insulating layer and including a first part disposed in each of the plurality of trenches and a second part disposed on the surface of the semiconductor layer.

According to another aspect of the present disclosure, a method for fabricating a power semiconductor device may include forming a first drift region having a first conductive type in a semiconductor layer having silicon carbide (SiC), forming a second drift region having the first conductive type, on an entire surface of an upper portion of the first drift region, forming a plurality of well regions having the second conductive type, in the second drift region, such that adjacent well regions at least partially makes contact with each other, forming a plurality of source regions formed in the semiconductor layer on the plurality of well regions, and having the first conductive type, forming a plurality of trenches formed to be recessed into the semiconductor layer from the surface of the semiconductor layer, in which each trench connects at least two source regions of the plurality of source regions to each other while passing through a contact part between of the adjacent well regions of the plurality of well regions, forming a gate insulating layer formed on an inner wall of each of the plurality of trenches, and forming a gate electrode layer formed on the gate insulating layer and including a first part filled in each of the plurality of trenches and a second part formed on the surface of the semiconductor layer. The plurality of well regions may be formed to make contact with the second drift region, such that the second drift region extends from lower portions of the plurality of well regions to the surface of the semiconductor layer while passing through the space between the plurality of well regions.

According to another aspect of the present disclosure, a power semiconductor device may include a semiconductor layer of silicon carbide (SiC), a plurality of well regions disposed in the semiconductor layer, such that adjacent well regions at least partially makes contact with each other, and having a second conductive type, a plurality of source regions disposed in the semiconductor layer on the plurality of well regions, and having a first conductive type opposite to the second conductive type, a first drift region disposed in the semiconductor layer and having the first conductive type, a second drift region disposed on the first drift layer, while extending to a surface of the semiconductor layer from lower portions of the plurality of well regions through a region between the plurality of well regions, and having the first conductive type, a plurality of trenches disposed to be recessed into the semiconductor layer from the surface of the semiconductor layer, in which each trench connects at least two source regions of the plurality of source regions to each other while passing through a contact part between of the adjacent well regions of the plurality of well regions, a gate insulating layer disposed on an inner wall of each of the plurality of trenches, a gate electrode layer disposed on the gate insulating layer and including a first part disposed in each of the plurality of trenches and a second part disposed on the surface of the semiconductor layer, and a pillar region positioned under each of the plurality of well regions to make contact with the first drift region and the plurality of well regions in the semiconductor layer, and having the second conductive type.

According to another aspect of the present disclosure, a method for fabricating a power semiconductor device may include forming a first drift region having a first conductive type in a semiconductor layer having silicon carbide (SiC), forming a second drift region having the first conductive type, on an entire surface of an upper portion of the first drift region, forming a plurality of well regions having the second conductive type, in the second drift region, such that adjacent well regions at least partially makes contact with each other, forming a pillar region positioned under each of the plurality of well regions to make contact with the first drift region and the plurality of well regions in the semiconductor layer, and having the second conductive type, forming a plurality of source regions formed in the semiconductor layer on the plurality of well regions, and having the first conductive type, forming a plurality of trenches formed to be recessed into the semiconductor layer from the surface of the semiconductor layer, in which each trench connects at least two source regions of the plurality of source regions to each other while passing through a contact part between of the adjacent well regions of the plurality of well regions, forming a gate insulating layer formed on an inner wall of each of the plurality of trenches, and forming a gate electrode layer formed on the gate insulating layer and including a first part filled in each of the plurality of trenches and a second part formed on the surface of the semiconductor layer. The plurality of well regions may be formed to make contact with the second drift region, such that the second drift region extends from lower portions of the plurality of well regions to the surface of the semiconductor layer while passing through the space between the plurality of well regions.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Figure 1:
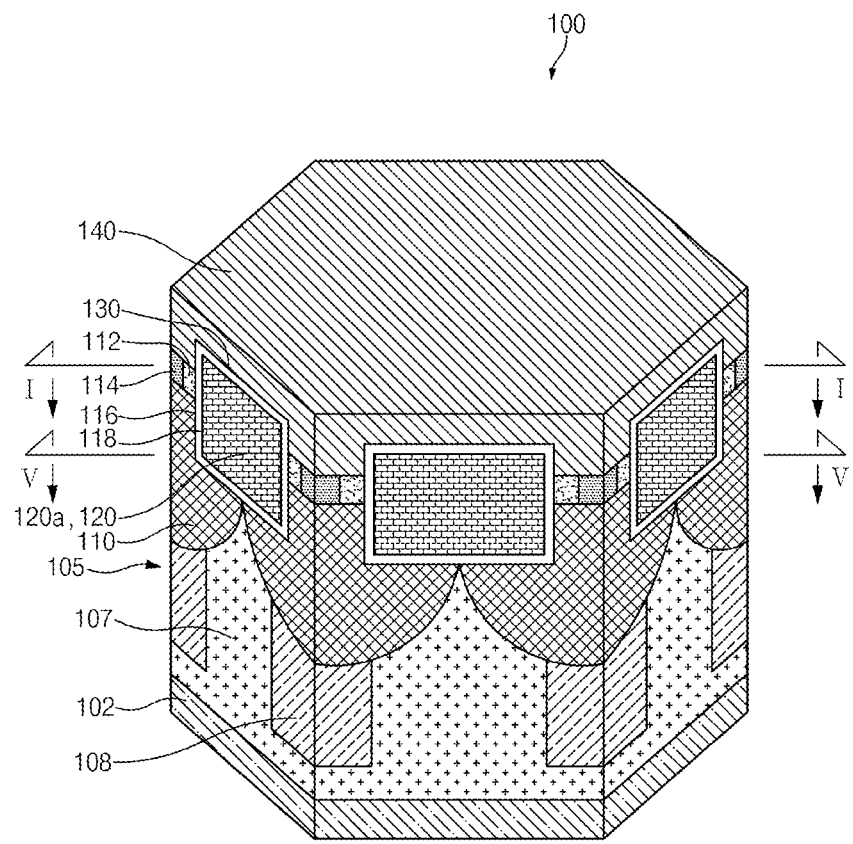
FIG. 1 is a perspective view schematically illustrating the structure of a power semiconductor device, according to an embodiment of the present disclosure.

Below, an embodiment of the present disclosure will be described in detail with reference to accompanying drawings. However, the present disclosure may be implemented in various different forms and should not be construed as being limited to embodiments to be disclosed below. Rather, these embodiments are provided as examples so that this disclosure will be thorough and complete and will fully convey the scope and spirit of the invention to one skilled in the art. For the convenience of explanation, some components in accompanying drawings may be exaggerated or reduced in size. The same reference numerals will be assigned to the same components in drawings.

Unless otherwise defined, all terms used herein are to be interpreted as commonly understood by one skilled in the art. In drawings, sizes of layers and regions are exaggerated for description, and are thus provided to describe normal structures of the present disclosure.

The same reference signs indicate the same components. It will be understood that, when a component, such as a layer, an region, or a substrate, is referred to as being "on" another component, the component can be "directly" or "indirectly" on the another component, or one or more intervening components may also be present between the component and the another component. On the other hand, when a first component is described as being "directly on" a second component, it is understood as any intermediate component is not interposed therebetween.

Figure 2:
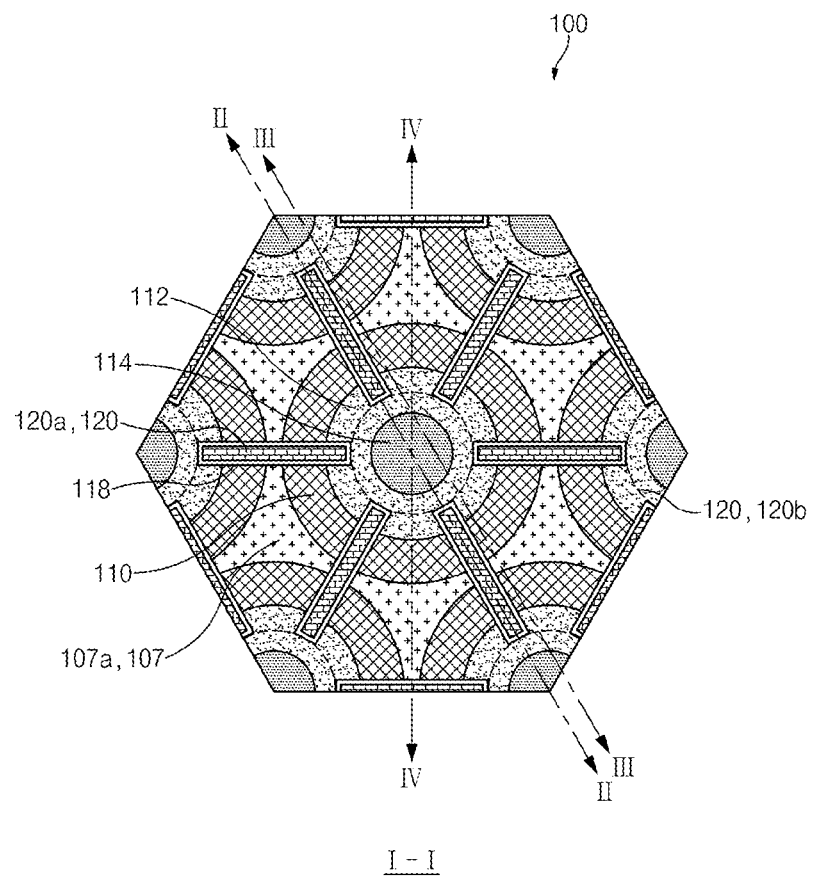
FIG. 2 is a plan view illustrating the structure taken along line I-I of FIG. 1.
Figure 3:
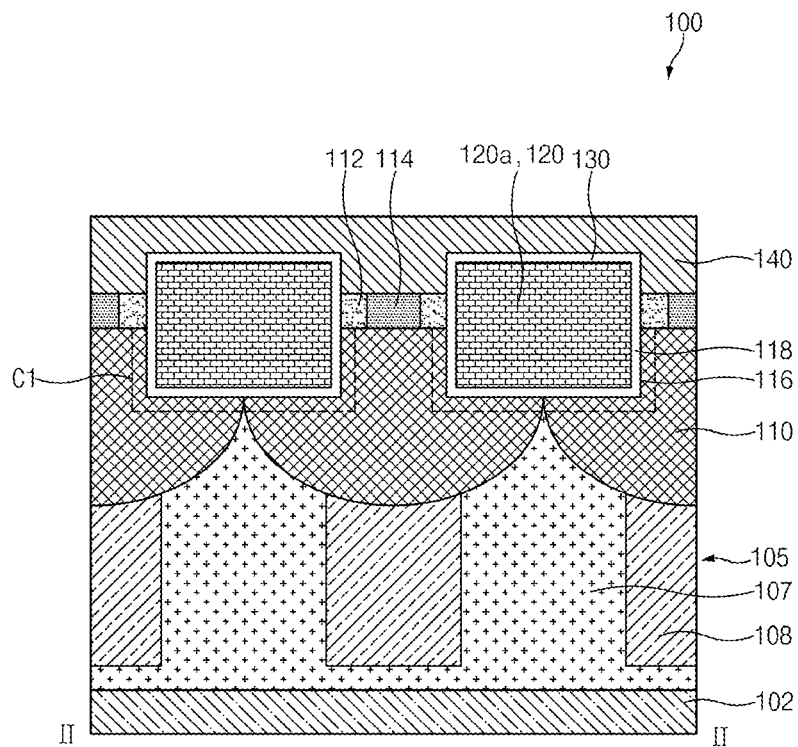
FIG. 3 is a cross-sectional view illustrating the structure taken along dotted line II-II of FIG. 2.
Figure 4:
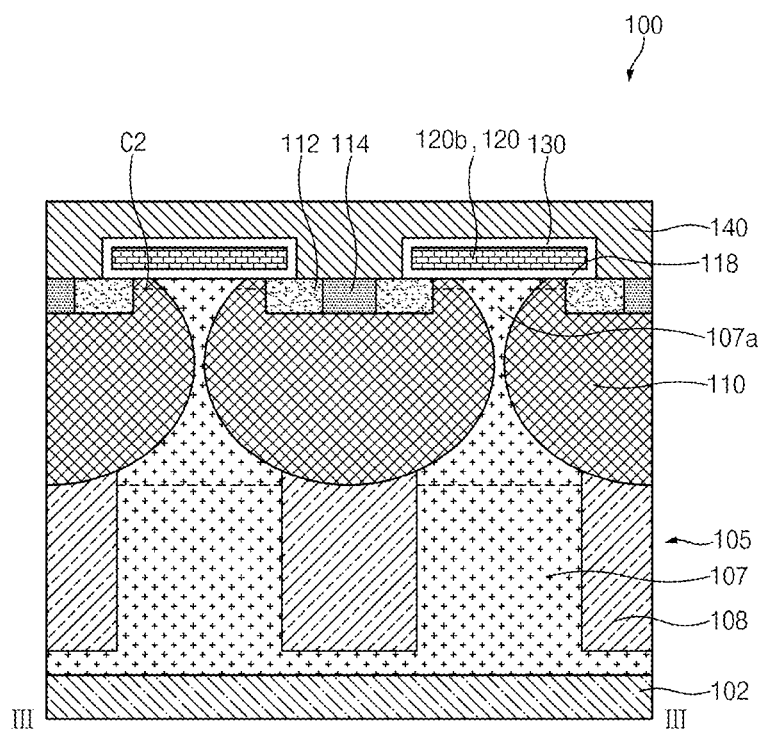
FIG. 4 is a cross-sectional view illustrating the structure taken along dotted line III-III of FIG. 2.
Figure 5:
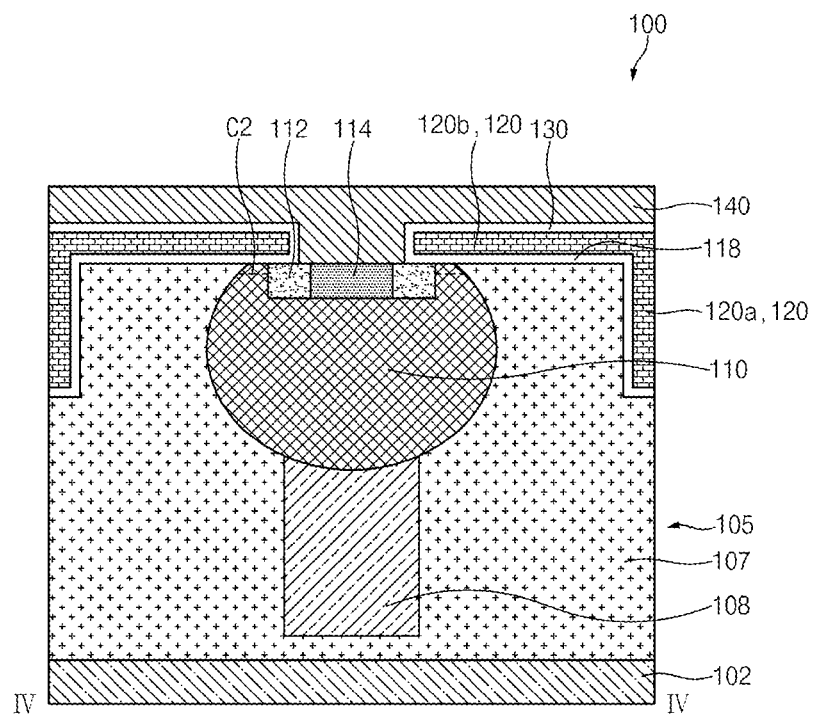
FIG. 5 is a cross-sectional view illustrating the structure taken along dotted line IV-IV of FIG. 2.
Figure 6:
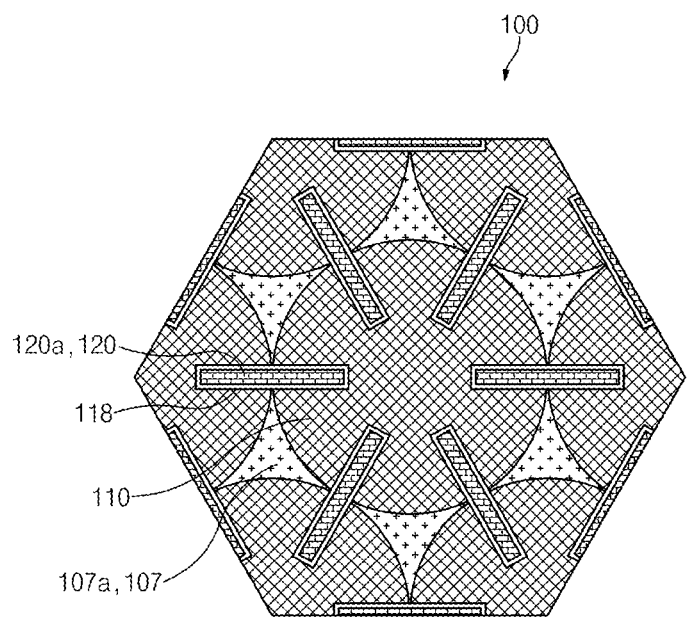
FIG. 6 is a plan view illustrating the structure taken along dotted line V-V of FIG. 1.

FIG. 1 is a perspective view schematically illustrating the structure of a power semiconductor device, according to an embodiment of the present disclosure, and FIG. 2 is a plan view (horizontal sectional view) illustrating the structure taken along line I-I of FIG. 1. In addition, FIG. 3 is a cross-sectional view taken along dotted line II-II of FIG. 2, FIG. 4 is a cross-sectional view illustrating the structure taken along dotted line III-III of FIG. 2, FIG. 5 is a cross-sectional view illustrating the structure taken along dotted line IV-IV of FIG. 2, and FIG. 6 is a plan view (horizontal sectional view) illustrating the structure taken along dotted line V-V of FIG. 1 (horizontal sectional view).

Referring to FIGS. 1 to 6, a power semiconductor device 100 may at least include a semiconductor layer 105, a gate insulating layer 118, a gate electrode layer 120, a plurality of interlayer insulating layer 130, and a source electrode layer 140. For example, the power semiconductor device 100 has a power MOSFET structure.

The semiconductor layer 105 may include a single semiconductor material layer or a plurality of semiconductor material layers. For example, the semiconductor layer 105 may include a single epitaxial layer or multiple epitaxial layers. Alternatively, the semiconductor layer 105 may include a single epitaxial layer or multiple epitaxial layers formed on a semiconductor substrate. For example, the semiconductor layer 105 may include silicon carbide (SiC). Alternatively, the semiconductor layer 105 may include at least one SiC-epitaxial layer.

As silicon carbide (SiC) has a bandgap higher than a bandgap of silicon (Si), the silicon carbide (SiC) may maintain stability even at a higher temperature, as compared to silicon (Si). Further, the silicon carbide (SiC) exhibits a dielectric breakdown field remarkably higher than that of silicon (Si). Accordingly, silicon carbide (SiC) may stably work even at a higher voltage. Accordingly, the power semiconductor device 100 having the semiconductor layer 105 including the silicon carbide (SiC) may exhibit a more excellent heat dissipation characteristic with a higher breakdown voltage, and may exhibit a stable operating characteristic at a higher temperature, when compared to the silicon (Si)

In more detail, the semiconductor layer 105 may include a drain region 102, a drift region 107, a plurality of pillar regions 108, a plurality of well regions 110, a plurality of source regions 112, a plurality of well contact regions 114, and a plurality of trenches 116.

In this case, the drift region 107 may be formed in a first conductive type (for example, the N type) and may be formed by implanting impurities (first conductive type of impurities) having the first conductive type into a portion of the semiconductor layer 105. For example, the drift region 107 may be formed by implanting the first conductive type of impurities into the SiC epitaxial layer. The drift region 107 may provide a moving path of charges, when the power semiconductor device 100 operates.

The well regions 110 may be formed in the semiconductor layer 105 and may have impurities (second conductive type of impurities) in a second conductive type. For example, the well regions 110 may be formed in the semiconductor layer 105 to make contact with at least a portion of the drift region 107. According to an embodiment, the well region 110 may be formed by implanting the second conductive type of impurities (for example, the P type of impurities), which is opposite to the first conductive type, into the semiconductor layer 105 or the drift region 107.

The pillar region 108 may be formed in the semiconductor layer 105 provided under the well region 110 such that the pillar region 108 is connected to the well region 110. The pillar region 108 may be formed to make contact with the drift region 107 to form a super junction with the drift region 107. For example, the pillar region 108 may be disposed under the well region 110 such that a top surface of the pillar region 108 makes contact with the well region 110, and a lateral side and a bottom surface of the pillar region 108 make contact with the drift region 107, respectively.

The pillar region 108 may be formed in the semiconductor layer 105 to have a conductive type opposite to the conductive type of the drift region 107 such that the pillar region 108 forms the super junction with the drift region 107. For example, the pillar region 108 may include impurities (second conductive type of impurities) having a second conductive type which is the type opposite to the type of the drift region 107 and the same as the type of the well region 110. For example, the doping concentration of the second conductive type of impurities of the pillar region 108 may be equal to or lighter than the doping concentration of the second conductive type of impurities of the well region 110, but the present disclosure is not limited thereto.

For example, FIGS. 1, 3, 4, and 5 illustrate that one pillar region 108 is formed integrally with the well region 110 under the well region 110. However, according to another embodiment, a plurality of pillar regions 108 may be formed under each well region 110. In other words, the plurality of pillar regions 108 having a width narrower than the width of the pillar region 108 illustrated in FIGS. 1, 3, 4, and 5 may be formed under one well region 110. In this case, the plurality of pillar region 108 disposed under one well region 110 may be alternately disposed such that lateral sides of the pillar regions 108 make contact with the drift region 107.

According to an embodiment, the pillar region 108 may be formed under the well region 110. According to an embodiment, the pillar region 108 may be formed to have a width narrower than a width of the well region 110 to expose at least a portion of a bottom surface of the well region 110, and to be retracted inward from an end portion of the well region 110. Accordingly, the well region 110 may further protrude toward a protrusion part 107a of the drift region 107, as compared to the pillar region 108.

The source regions 112 may be formed in the well regions 110, and may be formed in the first conductive type. For example, the source regions 112 may be formed by implanting the first conductive type of impurities into the semiconductor layer 105 or the well region 110. The source regions 112 may be formed by implanting the first conductive type of impurities having a concentration higher than the concentration of the first conductive type of impurities of the drift region 107.

The plurality of well contact regions 114 may be formed in the source regions 112 and on the well regions 110. For example, the plurality of well contact regions 114 may be formed on the well regions 110 to be connected to the well regions 110 through the source regions 112. The well contact region 114 may include the second conductive type of impurities.

The well contact regions 114 may be connected to the source electrode layer 140. The well contact regions 114 may include the second conductive type of impurities at the higher doping concentration. According to an embodiment, the well contact regions 114 may be doped with the second conductive type of impurities having a doping concentration higher than a doping concentration of the second conductive type of impurities of the well regions 110. For example, the well contact region 114 may be a P+ region.

According to an embodiment, the well contact regions 114 may be formed in a recess groove making contact with the well regions 110. In this case, the source electrode layer 140 may be formed to be filled in the recess groove and to be connected to the well contact region 114.

In addition, the drain region 102 may be formed in the semiconductor layer 105 under the drift region 107 and may include the first conductive type of impurities. For example, the drain region 102 may include the first conductive type of impurities implanted at a doping concentration higher than the concentration of the first conductive type of impurities of the drift region 107.

According to an embodiment, the drain region 102 may be provided in the form of a SiC-substrate having the first conductive type. In this case, the drain region 102 may be formed in the form of a portion of the semiconductor layer 105 or a substrate separate from the semiconductor layer 105. In addition, the drift region 107 may include at least one epitaxial layer formed on the drain region 102.

According to an embodiment, the well regions 110 may be formed in the semiconductor layer 105 such that two adjacent well regions at least partially contact each other. Two adjacent well regions 110 may make contact with each other at the center of the bottom surface of the trench 116. In addition, the well regions 110 may have the form in which a width increased toward the inner part of the semiconductor layer 105 from the surface of the semiconductor layer 105 and then decreased. In detail, two well regions, which are adjacent to each other, from among the well regions 110 may make contact with each other at portions having the widest widths as illustrated in FIG. 6, and may be spaced from each other on the surface of the semiconductor layer 105 as illustrated in FIG. 2.

According to an embodiment, the drift region 107 may be formed in the semiconductor layer 105 such that the drift region 107 is connected to the surface of the semiconductor layer 105 while extending between the well regions 110 from the lower portions of the well regions 110. For example, the drift region 107 may include the protrusion part 107a extending to the surface of the semiconductor layer 105 while passing through a space between the well regions 110. In this case, the protrusion part 107a may represent a region corresponding to the depth which is formed from the lowermost end portion of the well region 110 to the surface of the semiconductor layer 105, as illustrated in FIG. 4. In other words, the protrusion parts 107a may correspond to regions positioned to make contact with the lateral side of the well regions 110.

The plurality of trenches 116 may be formed to be recessed into the semiconductor layer 105 from the surface (top surface) of the semiconductor layer 105 by a specific depth. For example, each of the trenches 116 may be formed to connect two source regions 112, which are disposed at opposite sides of the trench 116, from among the source regions 112 while passing through the contact portion between adjacent well regions 110 from among the well regions 110. In more detail, each trench 116 may be formed in the type of a line to connect one source region 112 to an adjacent source region 112 while passing through one well region 110 surrounding the source region 112, the protrusion part 107a of the drift region 107, and an adjacent well region 110.

For example, each of the trenches 116 may be formed through a portion of the source region 112 and formed to be recessed to a specific depth of the well region 110 and the protrusion part 107a of the drift region 107. Accordingly, opposite corners of each trench 116 may be surrounded by the well regions 110. In addition, when viewed from the cross section of the trenches 116 taken along an extending direction thereof, a bottom surface of the trench 116 may be fully surrounded by the well regions 110. For example, the well regions 110, which are adjacent to each other, of the well regions 110 may be formed to make contact with each other on the bottom surface of each of the trenches 116 or in the vicinity of the bottom surface of each trench 116. Accordingly, the bottom surface of the trench 116 may be surrounded by the well regions 110 on a line provided in a direction in which the trench 116 extends.

The gate insulating layer 118 may be formed on inner walls of the trenches 116 and at least a portion of the semiconductor layer 105. For example, the gate insulating layer 118 may be formed on the inner surfaces of the trenches 116 and on the surface of the semiconductor layer 105. The thickness of the gate insulating layer 118 may be uniform, or portions, which are formed on the bottom surface and a corner of the trench 116, of the gate insulating layer 118 may have thicknesses thicker than the thickness of a portion, which is formed on a sidewall of the trench 116, of the gate insulating layer 118, such that an electric field concentrated on the corner of the trench 116 is lowered.

For example, the gate insulating layer 118 may include an insulating material, such as a silicon oxide, a silicon carbide oxide, a silicon nitride, a hafnium oxide, a zirconium oxide, or an aluminum oxide, or may include a stack structure thereof.

The gate electrode layer 120 may be formed on the gate insulating layer 118. For example, the gate electrode layer 120 may include a first part 120a, which is filled in the trench 116, and a second part 120b formed on the surface of the semiconductor layer 105. For example, the first part 120a of the gate electrode layer 120 may have a trench-type gate structure, and the second part 120b may have a planar-type gate structure. Accordingly, the gate electrode layer 120 may have a hybrid-type structure including both the trench-type gate structure and the planar-type gate structure.

For example, the second part 120b of the gate electrode layer 120 may be formed on the protrusion part 107a of the drift region 107 and the well regions 110. In more detail, the second part 120b of the gate electrode layer 120 may be formed on the protrusion part 107a of the drift region 107, the surfaces of the well regions 110, and surfaces of portions of edges of the source regions 112, which are exposed on the surface of the semiconductor layer 105. The well contact region 114 and remaining portions of the source regions 112 may be disposed outside the gate electrode layer 120 and may be exposed out of the gate electrode layer 120.

At least bottom corner portions of the first part 120a of the gate electrode layer 120 may be surrounded by the well regions 110. In addition, when viewed from the cross section of the first part 120a taken along an extending direction of the first part 120a, an entire portion of a bottom surface of the first part 120a may be surrounded by the well regions 110. For example, portions, which surround the bottom surface of the first part 120a, of the well regions 110 may be the thinnest portions at the center of the bottom surface of the first part 120a, and may gradually become thicker toward the corner portions of the first part 120a.

For example, the gate electrode layer 120 may include a conductive material, such as polysilicon, metal, a metal nitride, or a metal silicide, or may include a stack structure thereof.

The interlayer insulating layer 130 may be formed on the gate electrode layer 120. For example, the interlayer insulating layer 130 may include an insulating material, such as an oxide layer, a nitride layer, or the stack structure thereof, for electrical insulation between the gate electrode layer 120 and the source electrode layer 140.

The source electrode layer 140 may be formed on the interlayer insulating layer 130. The source electrode layer 140 may be commonly connected to the source region 112 and the well contact region 114. In addition, the source electrode layer 140 may be electrically connected to the source regions 112 and the well contact regions 114. For example, the source electrode layer 140 may be connected to the source regions 112 and the well contact regions 114 through a portion exposed out of the gate electrode layer 120 and may be disposed to additionally extend along a top surface of the gate electrode layer 120. For example, the source electrode layer 140 may include a conductive material such as metal.

A first channel region C1 may be formed in the semiconductor layer 105 along the trench 116 to correspond to the first part 120a of the gate electrode layer 120, such that the first channel region C1 is connected to the source regions 112 and the drift region 107. For example, the first channel region C1 may be formed in the semiconductor layer 105 along sidewalls of the trench 116 to connect the drift region 107 (that is, the protrusion part 107a of the drift region 107), which are positioned under the trench 116 or on the lateral side of the trench 116, and the source region 112, which makes contact with the trench 116, to each other. Accordingly, the first channel region C1 may have the trench-type channel structure.

A second channel region C2 may be formed in the semiconductor layer 105 under the second part 120b of the gate electrode layer 120 such that the second channel region C2 makes contact with the source regions 112. For example, the second channel region C2 may be formed on the semiconductor layer 105 among the protrusion part 107a of the drift region 107 and the source regions 112. The second channel region C2 may be formed to cover surfaces of the well regions 110. Accordingly, the second channel region C2 may have a planar-type channel structure.

For example, the first channel region C1 and the second channel region C2 may have the first conductive type such that an accumulation channel is formed. For example, the first channel region C1 and the second channel region C2 may have a doping type opposite to a doping type of the well regions 110. The density of electrons is increased in the first channel region C1 and the second channel region C2, thereby lowering a channel resistance between the first channel region C1 and the second channel region C2.

For example, the first channel region C1 and the second channel region C2 may have a doping type the same as doping types of the source region 112 and the drift region 107. In this case, the source region 112, the first channel region C1 or the second channel region C2, and the drift region 107 may have structure normally electrically connected to each other. However, in the structure of the semiconductor layer 105 including SiC, negative charges appear due to the trap present on the interface between the gate insulating layer 118 and an SiC interface. Accordingly, the bands of the first channel region C1 and the second channel region C2 are curved upward while forming a potential barrier. Accordingly, the movement of the current may be blocked.

Accordingly, according to the present embodiment, even if the source regions 112 are formed to make contact with the protrusion parts (vertical parts) 107a of the drift region 107, when the operating voltage is applied to the gate electrode layer 120, a channel may be formed to allow the flow of the current. In this case, an operating voltage (threshold voltage) to be applied to the gate electrode layer 120 to form the channel in the first channel region C1 or the second channel region C2 may be considerably lower than an operating voltage to be applied to the gate electrode layer 120 to form a typical channel.

For example, the first channel region C1 and the second channel region C2 may be portions of the well regions 110. In more detail, the first channel region C1 may be a portion of the well regions 110, which are adjacent to a lower portion of the first part 120a of the gate electrode layer 120. In more detail, the second channel region C2 may correspond to a portion of the well regions 110, which are adjacent to a lower portion of the second part 120b of the gate electrode layer 120. In other words, the second channel region C2 may be formed in a region between the protrusion part 107a of the drift region 107 and the source region 112.

In this case, the first channel region C1 and the second channel region C2 may be integrally formed with the well regions 110 or may be formed to be continuously connected to the well regions 110. The doping concentration of the first conductive type of impurities, which are provided in the first channel region C1 and the second channel region C2, may be adjusted depending on a threshold voltage value.

The second channel region C2 and the source region 112 may be formed on opposite sidewall of the vertical part 107a to be connected to each other. The vertical part 107a of the drift region 107, the second channel region C2, and the source region 112, which are connected to each other, may be a moving path of a current when the power semiconductor device 100 operates.

According to an embodiment, three well regions 110, which are adjacent to each other, from among the well regions 110 may have equal spacing. Further, three source regions 112, which are adjacent to each other, from among the source regions 112 may have equal spacing. For example, centers of three adjacent well regions 110 may be respectively disposed at vertexes of a regular triangle, and centers of three adjacent source regions 112 on the well regions 110 may also be respectively disposed at the vertexes of the same regular triangle. For example, the well regions 110 and the source regions 112 may be understood as indicating three parts forming a triangle as illustrated in FIG. 2.

According to an embodiment, the centers of seven adjacent well regions 110 from among the well regions 110 may be respectively disposed at the center and vertexes of a regular hexagon. In addition, the centers of seven source regions 112 present on the seven adjacent well regions 110 from among the source regions 112 may be respectively disposed at the center and vertexes of the regular hexagon. For example, FIGS. 1 to 5 may be understood as illustrating seven well regions 110 and seven source regions 112.

In this structure, the well regions 110 and the source regions 112 may be disposed in a hexagonal closed packed arrangement structure, which is similar to a planar arrangement structure. In addition, the well regions 110 may have equal spacing between two adjacent well regions 110, and the source regions 112 may have equal spacing between two adjacent source regions 112.

In this structure, each of the trenches 116 may be disposed to form (or to include) a portion of a line, which connects two adjacent source regions to each other from among the source regions 112 disposed at the center and vertexes of the regular hexagon, such that seven adjacent source regions 112 are connected. In detail, in FIG. 2, the trenches 116 may include six lines linking one source region 112, which is disposed at the center of the regular hexagon, to six source regions 112 which are disposed at the vertexes of the regular hexagon, and six lines linking two adjacent source regions 112 to each other from among the six source regions 112 disposed the vertexes of the regular hexagon.

According to an embodiment, the well regions 110 may be a portion of a spherical shape. When viewed from a cross section of the well regions 110, a region including the source region 112 and the well contact region 114 form a circular shape, and a region, which does not include the source region 112 and the well contact region 114, may have a ring shape or a doughnut shape. Further, the well contact regions 114 may be formed in the ring shape or the doughnut shape, when viewed from a plane view. For example, when viewed from a plan view, the well contact regions 114 having the ring shape may be formed in the well regions 110 having the ring shape, and the source regions 112 having the circular shape may be formed in the well contact region 114 having the ring shape. The well contact regions 114 may be connected to the well regions 110, when viewed from a bottom view. When viewed from the plan view, the source regions 112 may be formed in a doughnut shape to surround the well contact regions 114. The shape when viewed from the plan view may be formed to a specific depth from the surface of the semiconductor layer 105.

According to an embodiment, a portion, which is formed under the bottom surface of each trench 116, of the well regions 110, for example, the first channel region C1 formed in the well region 110 in the vicinity of the bottom surface of the trench 116, may be connected to the protrusion part 107a under the relevant portion.

For example, when the whole thickness of the well region 110 under the bottom surface of each trench 116 is thicker than the thickness of the first channel region C1, the first channel region C1 may not be connected to the drift region 107 formed under each trench 116. However, when each well region 110 has a spherical shape, since at least a lateral side of the trench 116 is exposed out of the well region 110 and is surrounded by the protrusion part 107a of the drift region 107, the first channel region C1 may be connected while extending from the protrusion part 107a of the drift region 107, which is provided on the lateral side of the trench 116 or on the sidewall of the first part 120a of the gate electrode layer 120, to the source region 112.

Although the above description has been made in that the first conductive type and the second conductive type are opposite to each other and are an N type and a P type, respectively, the first conductive type and the second conductive type may be the P type and the N type In more detail, when the power semiconductor device 100 is an N-type MOSFET, the drift region 107 may be an N– region, the source region 112 and the drain region 102 may be N+ regions, the first channel region C1 and the second channel region C2 may be N+ regions, the well region 110 and the pillar region 108 may be P– regions, and the well contact region 114 may be a P+ region.

According to the power semiconductor device 100, a depth of each well region 110 may be deeper than the depth of the trench 116 and the gate electrode layer 120. At least a portion, which is positioned on the bottom surface of the trench 116, of the first part 120a of the gate electrode layer 120 may be surrounded by the well regions 110. In addition, the whole bottom surface of the first part 120a may be surrounded by the well regions 110, and such a structure may alleviate the concentration of the electric field on the corner of the bottom surface of the trench in the trench-type gate structure.

When the operating voltage is applied to the gate electrode layer 120, the electric field may be concentrated to the lower corner portions of the gate electrode layer 120. When the electric field is concentrated, the gate insulating layer 118 in the relevant region may receive severe stress, so dielectric breakdown of the gate insulating layer 118 may be caused. Therefore, according to the present embodiment, a lower portion, which is formed in the well region 110, of the gate electrode layer 120 may be surrounded by the well region 110 having the P type to achieve charge sharing, thereby preventing the dielectric breakdown of the gate insulating layer 118, which is caused as the electric field is concentrated on corner portions of the gate insulating layer 118.

When the power semiconductor device 100 operates, a current may generally flow in a vertical direction from the drain region 102 along the drift region 107, and may then flow to the source region 112 through the first channel region C1 and the second channel region C2.

The power semiconductor device 100 may have a hybrid-type structure including both the trench-type gate structure and the planar-type gate structure. In addition, the power semiconductor device 100 may have a regular hexagon arrangement structure and may implement the high channel density through the combination of the trench-type gate structure and the planar-type gate structure, thereby exhibiting the higher degree of integration. In addition, as compared to when the power semiconductor device 100 has only a planar-type structure, the power semiconductor device 100 may maintain the degree of integration while enhancing the channel mobility, as the power semiconductor device 100 is additionally provided in the trench-type structure.

Meanwhile, because the power semiconductor device 100 is used for high-power switching, the power semiconductor device 100 requires a high voltage characteristic. When a high voltage is applied to the drain region 102, a depletion region may be expanded from the semiconductor layer 105 adjacent to the drain region 102 such that a voltage barrier of a channel is lowered. This phenomenon is called "drain induced barrier lowering (DIBL)".

The DIBL may make the first channel region C1 and the second channel region C2 abnormally turned on, and furthermore, may cause a punch through phenomenon, in which a depletion region is expanded between the drain region 102 and the source region 112, such that the drain region 102 and the source region 112 make contact with each other.

However, the power semiconductor device 100 described above may secure an appropriate withstand voltage characteristic by reducing the resistance between the drift region 107, and the first channel region C1 and the second channel region C2, and suppressing an abnormal current flow and the punch through phenomenon caused by the DIBL, by using the pillar region 108 forming the super junction with the drift region 107. Accordingly, even if the thickness of the drift region 107 forming the body is reduced, the higher breakdown voltage may be maintained.

In addition, since the current flows through the vertical parts 107a of the drift region 107 in the power semiconductor device 100, the moving path of the current is reduced to increase the resistance (JFET resistance). However, according to the present embodiment, in the power semiconductor device 100, the JFET resistance may be reduced by using the pillar region 108 forming the super junction together with the drift region 107. For example, a charge amount in the pillar region 108 and a charge amount in the drift region 107 are adjusted to reduce the JFET resistance.

When a charge amount of the pillar region 108 is greater than a charge amount of the drift region 107, and when the power semiconductor device 100 operates, a breakdown voltage may be increased by allowing the maximum electric field to be formed in the drift region 107 on the same line as the bottom surface of the pillar region 108. For example, the charge amount of the pillar region 108 may become greater than the charge amount of the drift region 107 by making a doping concentration of the second conductive type of impurities of the pillar region 108 higher than a doping concentration of the first conductive type of impurities of the drift region 107, thereby enhancing the high voltage characteristic in the power semiconductor device 100, such that the JFET resistance is reduced.

Figure 7:
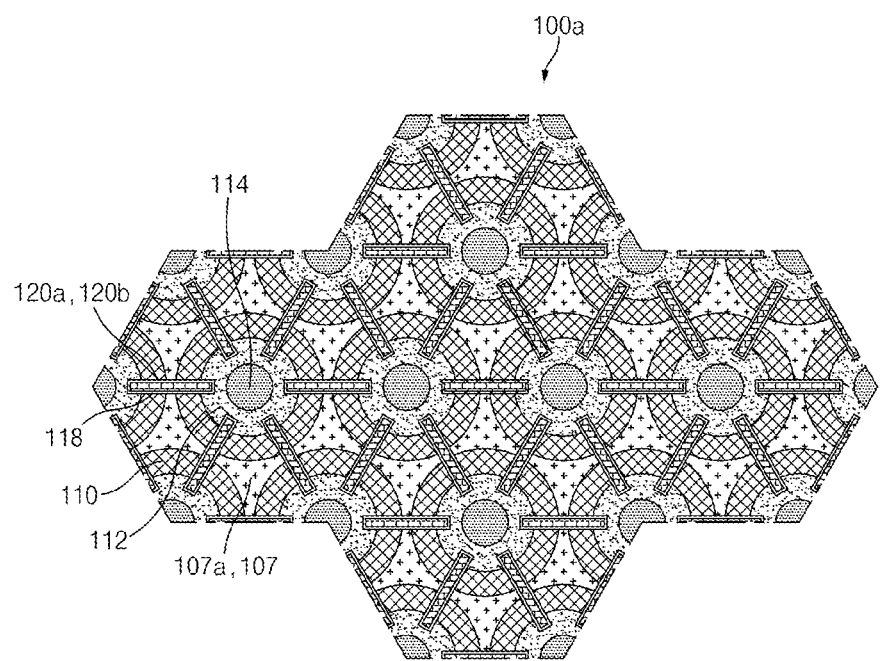
FIG. 7 is a plan view schematically illustrating the structure of a power semiconductor device, according to another embodiment of the present disclosure.

FIG. 7 is a plan view (or a horizontal sectional view) illustrating a power semiconductor device 100a according to another embodiment of the present disclosure.

Referring to FIG. 7, the power semiconductor device 100a shows a portion of a structure, in which a plurality of power semiconductor devices 100 in FIGS. 1 to 6 are arranged, and the same reference numerals of the components of power semiconductor devices 100 in FIGS. 1 to 6 will be assigned to components of the power semiconductor device 100a. Accordingly, the duplication thereof will be omitted.

As the power semiconductor device 100a is formed by repeating a hexagonal closed packed arrangement structure illustrated in FIGS. 1 to 6, the power semiconductor device 100a may have the degree of higher integration.

Figure 8:
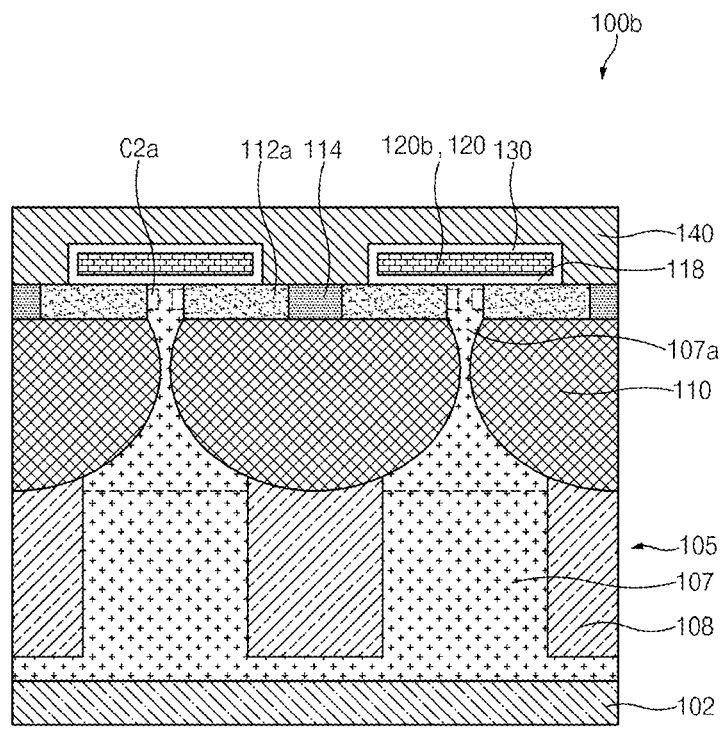
FIGS. 8 and 9 are cross-sectional views illustrating a power semiconductor device, according to another embodiment of the present disclosure.
Figure 9:
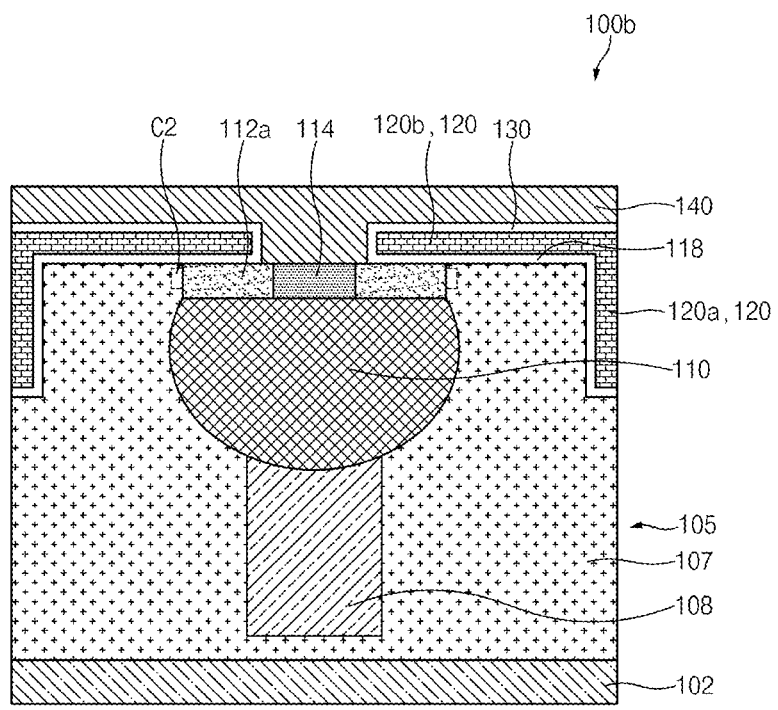

FIGS. 8 and 9 are cross-sectional views illustrating a power semiconductor device 100b according to another embodiment of the present disclosure. The power semiconductor device 100b may be implemented by modifying a partial configuration of the power semiconductor devices 100 of FIGS. 1 to 6, and the description of the power semiconductor device 100b and the description of the power semiconductor device 100 make references to each other. Accordingly, the duplicated descriptions of the power semiconductor device 100b and the power semiconductor device 100 will be omitted.

Referring to FIGS. 8 and 9, in the power semiconductor device 100b, a second channel region C2a may be formed in the semiconductor layer 105 between the drift region 107 and the source region 112. For example, the second channel region C2a may be formed in the semiconductor layer 105 between the protrusion part 107a of the drift region 107 and a first source region 112a. The second channel region C2a may have the first conductive type of impurities to form an accumulation channel. The accumulation channel may refer to that holes are accumulated in the well region having the P type which is the second conductive type. However, according to an embodiment of the present disclosure, the term "accumulation channel" is employed in the case of exhibiting the effect of, for example, forming a channel having the first conductive type by forming the second conductive type (for example, the P type) having a lower concentration on the surface by adjusting the energy for forming the well region 110, or the case of ion-implanting the first conductive type of impurities.

For example, the second channel region C2a may have the doping type the same as the doping types of the source region 112a and the drift region 107. In this case, the source region 112a, the second channel region C2a, and the drift region 107 may have structure normally electrically connected to each other. The semiconductor layer 105 including SiC has negative charges, as a trap is present in the interface with the gate insulating layer. Accordingly, the band of the second channel region C2a is curved upward to form a potential barrier, thereby increasing the threshold voltage. However, when the well region 110 is formed such that the second conductive type concentration is reduced on the surface of the well region 110, the threshold voltage applied to the gate electrode layer 120 may be lowered.

According to an embodiment, the second channel region C2a may be a portion of the drift region 107. In more detail, the second channel region C2a may be a portion of the protrusion part 107a of the drift region 107. For example, the second channel region C2a may be integrally formed with the drift region 107. Accordingly, in the power semiconductor device 100b, the source regions 112a may directly make contact with the drift region 107 (for example, the protrusion part 107a of the drift region 107), and the second channel region C2a may be defined in a portion of the drift region 107 by the contact portion.

For example, a doping concentration of the first conductive type of impurities of the second channel region C2a may be adjusted to adjust the threshold voltage.

According to an embodiment, the well region 110 may be formed under the source regions 112a to further protrude toward the protrusion part 107a of the drift region 107, as compared to the source regions 112a. In this case, the second channel region C2a may be formed in the semiconductor layer 105 on the protruding portion of the well region 110. For example, the protrusion part 107a of the drift region 107 may further extend into a groove portion between the well region 110, and the second part 120b of the gate electrode layer 120, and the second channel region C2a may be formed at the extending protruding part. The above structure may define the second channel region C2a between the second part 120b of the gate electrode layer 120 and the well region 110.

In the power semiconductor device 100b, the first channel region C1 may be provided in the form of an accumulation channel, which is similar to the power semiconductor device 100 of FIGS. 1 to 6.

Figure 10:
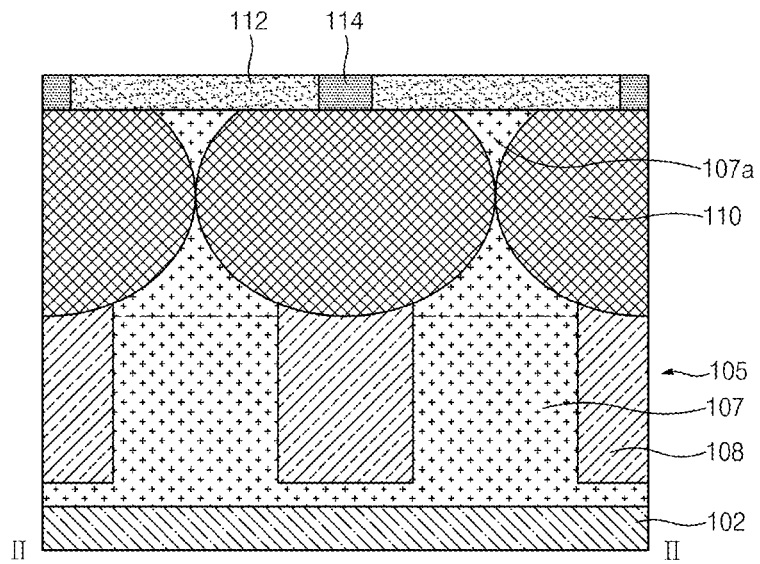
FIGS. 10 to 12 are perspective views schematically illustrating a method for fabricating the power semiconductor device of FIG. 1.
Figure 11:
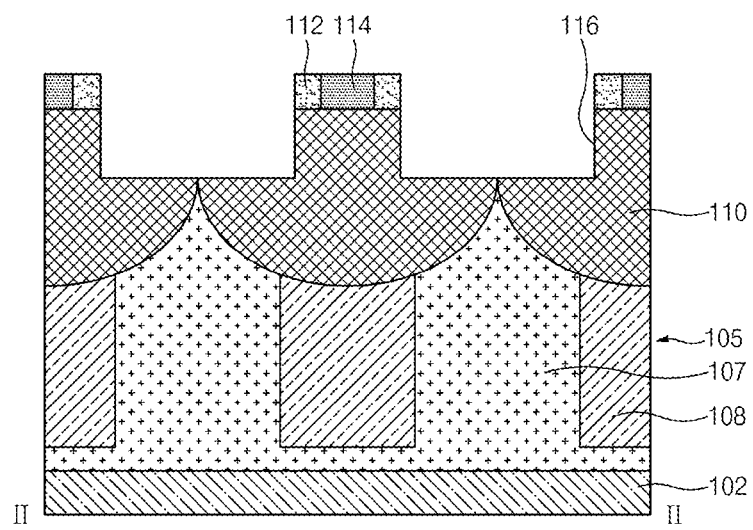
Figure 12:
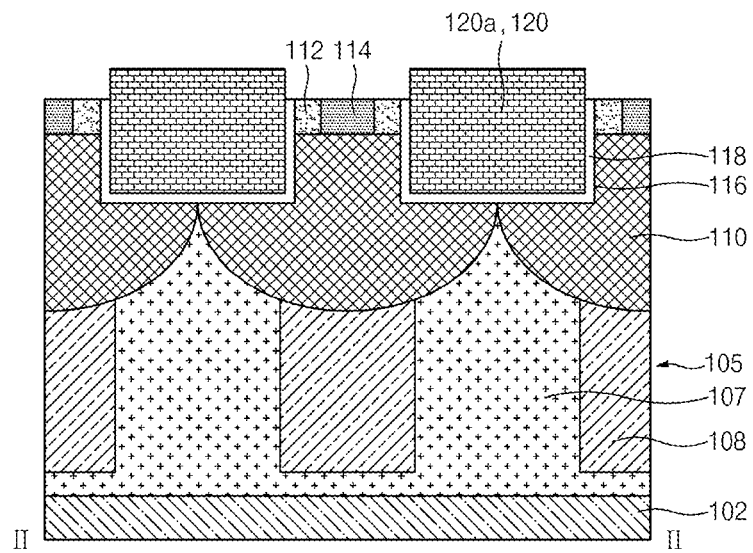
Figure 13:
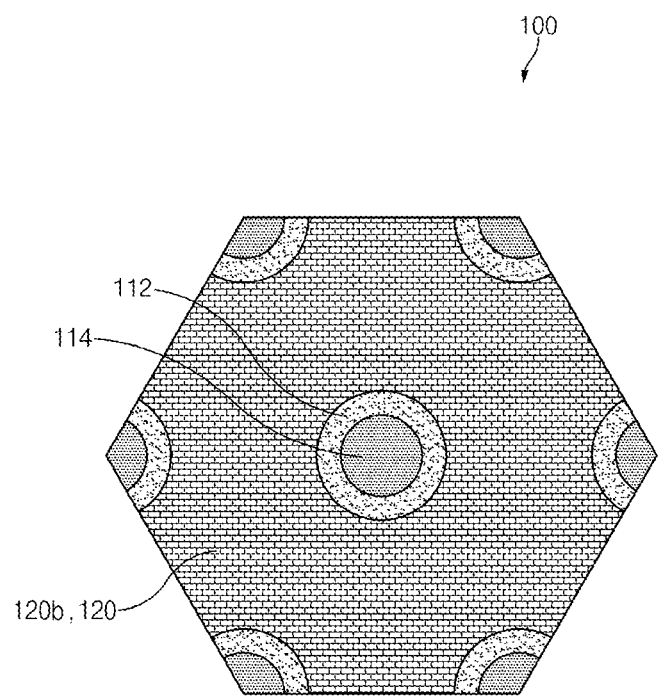
FIG. 13 is a plan view schematically illustrating the structure of the power semiconductor device of FIG. 12.

FIGS. 10 to 12, and 14 are cross-sectional views illustrating a method for fabricating the power semiconductor device 100, according to an embodiment of the present disclosure, and FIG. 13 is a plan view (a vertical sectional view) of FIG. 12.

Referring to FIG. 10, the drift region 107 having the first conductive type may be formed in the semiconductor layer 105 including silicon carbide (SiC) to provide a vertical moving path of a charge. For example, the drift region 107 may be formed on the drain region 102 having the first conductive type. According to an embodiment, the drain region 102 may be implemented with a substrate having the first conductive type, and the drift region 107 may include one or more epitaxial layers formed on the substrate.

Next, the well regions 110 having the second conductive type may be formed in the semiconductor layer 105 to make contact with the drift region 107. For example, two adjacent well regions from among the well regions 110 may be formed to at least partially make contact with each other. In addition, the forming of the well regions 110 may include implanting the second conductive type of impurities into the semiconductor layer 105. The well regions 110 may be actually formed at a specific depth from the surface of the semiconductor layer 105.

For example, the well regions 110 may be formed in the semiconductor layer 105, such that the drift region 107 includes the protrusion parts 107a, at least portions of which are surrounded by the well regions 110. In more detail, the well regions 110 may be formed by doping impurities having a conductive type, which is opposite to that of the drift region 107, into the drift region 107.

The pillar region 108 may be formed in the semiconductor layer 105 provided under the well region 110 to make contact with the well region 110. The pillar region 108 may have the second conductive type to form a super junction with the drift region 107. For example, the pillar region 108 may be formed by implanting the second conductive type of impurities into the drift region 107.

The source regions 112 having the first conductive type may be formed in the semiconductor layer 105 in the well regions 110 or on the well regions 110. For example, the forming of the source regions 112 may be performed by implanting the first conductive type of impurities into the well regions 110 and the drift region 107. The source regions 112 may be actually formed to a specific depth from the surface of the semiconductor layer 105.

In addition, the well contact regions 114 having the second conductive type may be formed in the source regions 112 or on the well regions 110. For example, the well contact regions 114 may be formed by implanting the second conductive type of impurities into the well regions 110 or into the source regions 112 at a high concentration. For example, the well contact regions 114 may be formed to have a circular shape when viewed from a plan view.

According to an embodiment, the well regions 110 may be formed to make contact with the drift region 107, in such a manner that the drift region 107 is connected to the surface of the semiconductor layer 105 while extending from the lower portion of the well regions 110 through a region between the well regions 110.

According to a modification of the present embodiment, the sequence of doping impurities into the well regions 110, the pillar region 108, the well contact regions 114, and the source regions 112 may be arbitrarily changed.

In the above fabricating method, the impurity implantation or the impurity doping may be performed such that the impurities are mixed, when the impurities are implanted into the semiconductor layer 105 or an epitaxial layer is formed. However, an ion implantation method using a mask pattern may be used to implant impurities into a selective region.

Alternatively, a heat treatment process for activating or diffusing the impurities may be performed after the ion implantation.

Referring to FIG. 11, the plurality of trenches 116 may be formed to be recessed, by a specific depth, into the semiconductor layer 105 from the surface of the semiconductor layer 105.

For example, each of the trenches 116 may be formed through a portion of the source region 112 and formed to be recessed to a specific depth of the well region 110 and the protrusion part 107a of the drift region 107. For example, each of the trenches 116 may be formed from the surface of the semiconductor layer 105 into the semiconductor layer 105, to connect two source regions 112, which are disposed at opposite sides of the trench 116, from among the source regions 112 while passing through the contact portion between adjacent well regions 110 of the well regions 110.

For example, the trenches 116 may be formed by forming a photo mask through photo lithography and then etching the semiconductor layer 105 by using the photo mask as an etching protection layer.

Referring to FIGS. 12 and 13, the gate insulating layer 118 may be formed on the inner walls of the trenches 116 and the surface of the semiconductor layer 105. For example, the gate insulating layer 118 may formed with an oxide by oxidizing the semiconductor layer 105 or may be formed by depositing an insulating material, such as an oxide or a nitride, on the semiconductor layer 105.

For example, the first part 120a, which is filled in the trench 116, and the second part 120b formed on the surface of the semiconductor layer 105 may be formed on the gate insulating layer 118 to form each gate electrode layer 120. In this case, the gate electrode layer 120 may not be formed in the well contact region 114 and in a partial region of the source regions 112 adjacent to the well contact region 114. For example, the gate electrode layer 120 may be formed after forming a conductive layer on the gate insulating layer 118 and patterning the conductive layer. The gate electrode layer 120 may be formed by doping impurities in polysilicon or may be formed to include a conductive metal or metal silicide.

The patterning process may be performed through photo lithography and etching processes. The photo lithography process may include a process of forming a photoresist pattern as a mask layer by using a lithography process and a development process, and the etching process may include a process of selectively etching an underlying structure by using the photoresist pattern.

Figure 14:
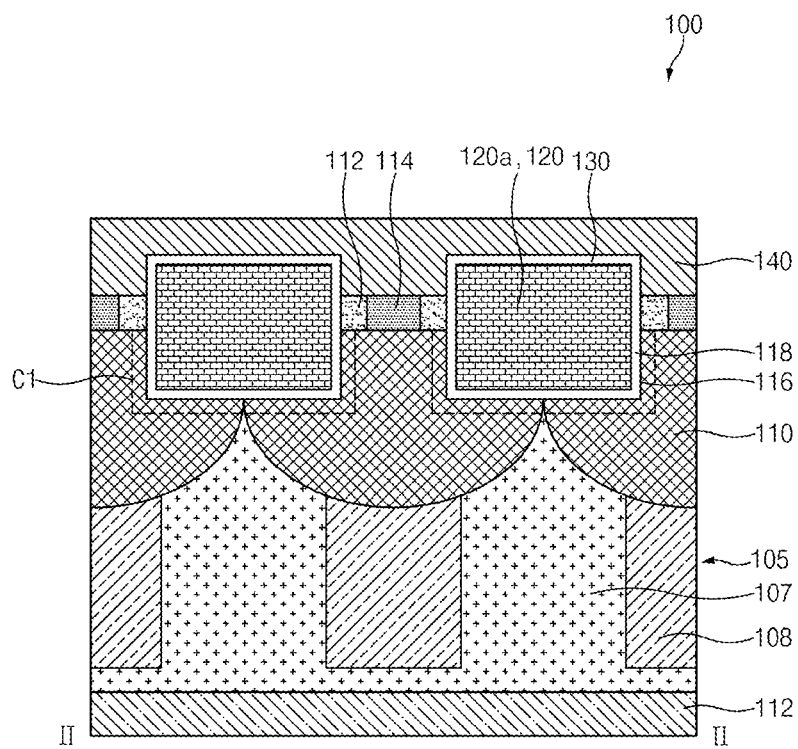
FIG. 14 is a cross-sectional view schematically illustrating a method for fabricating the power semiconductor device, after the processes of FIG. 12.

Referring to FIG. 14, the interlayer insulating layer 130 may be formed on the gate electrode layer 120.

Subsequently, the source electrode layer 140 may be formed on the interlayer insulating layer 130. In addition, the source electrode layer 140 may be formed to be commonly connected to the source region 112 and the well contact region 114. For example, the source electrode layer 140 may be formed by forming a conductive layer, for example, a metal layer on the interlayer insulating layer 130 and patterning the conductive layer.

According the fabricating method described above, the MOSFET structure having the hexagonal closed packed arrangement in the semiconductor layer 105 may be economically formed.

Figure 15:
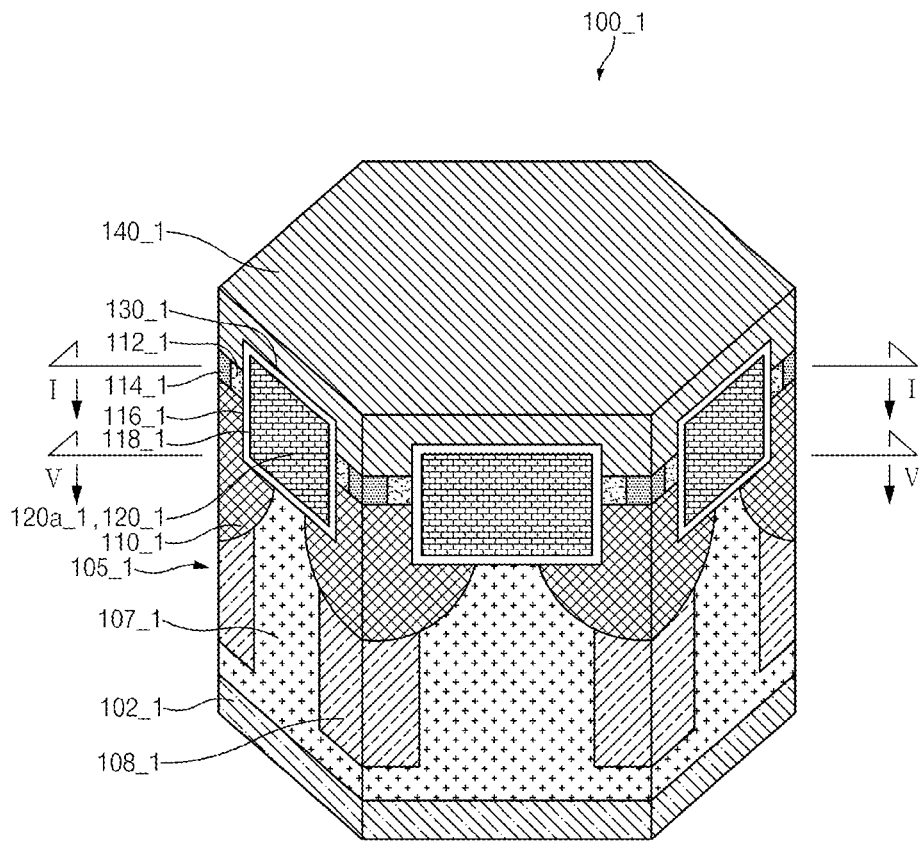
FIG. 15 is a perspective view schematically illustrating the structure of a power semiconductor device, according to an embodiment of the present disclosure.
Figure 16:
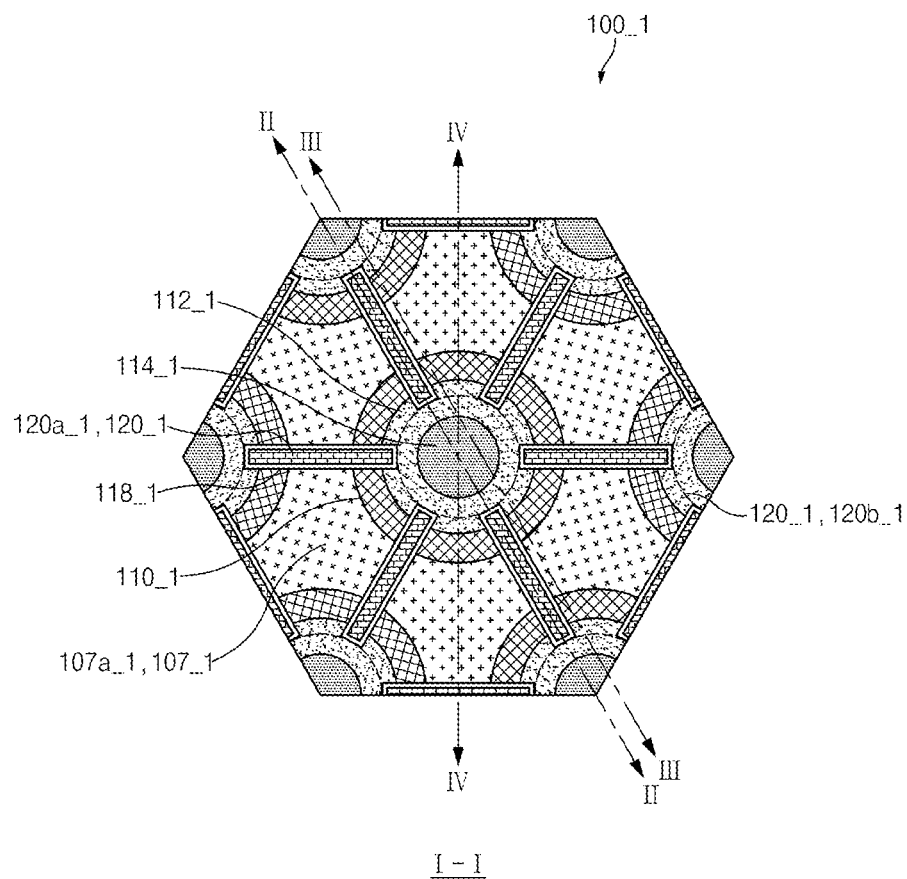
FIG. 16 is a plan view illustrating the structure taken along line I-I of FIG. 15.
Figure 17:
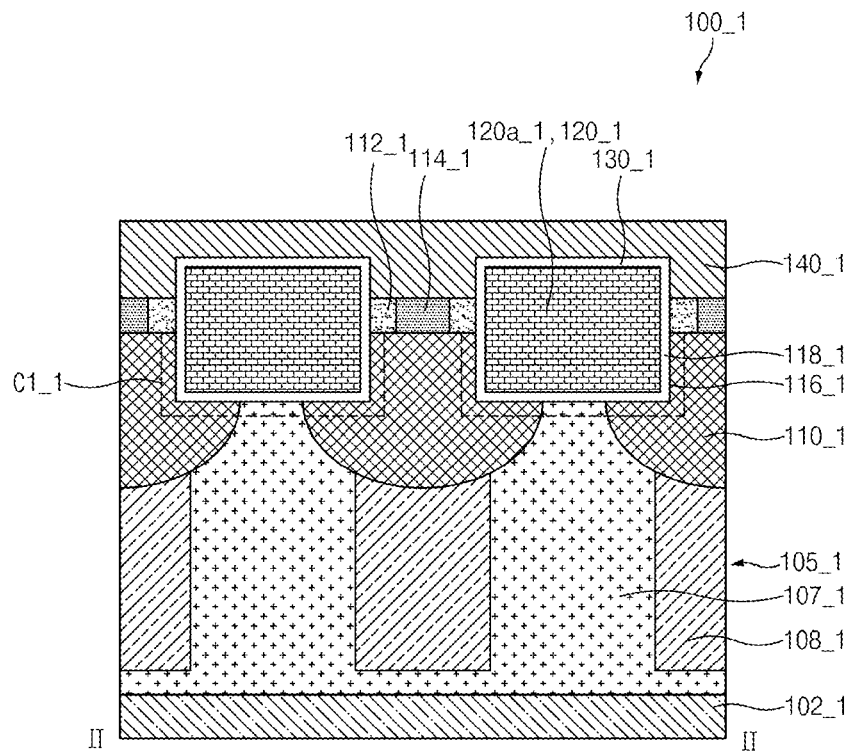
FIG. 17 is a cross-sectional view illustrating the structure taken along dotted line II-II of FIG. 16.
Figure 18:
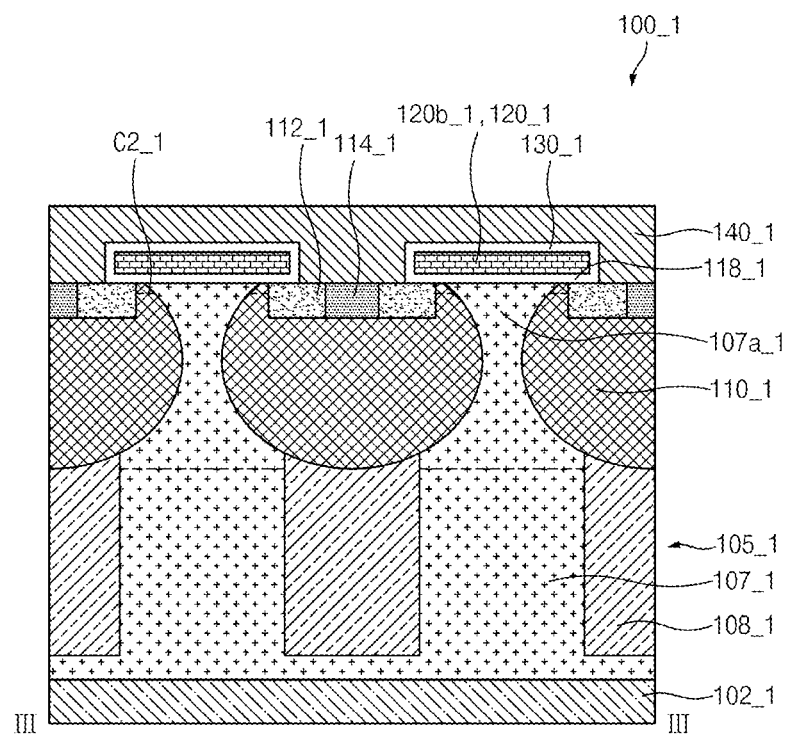
FIG. 18 is a cross-sectional view illustrating the structure taken along line III-III of FIG. 16.
Figure 19:
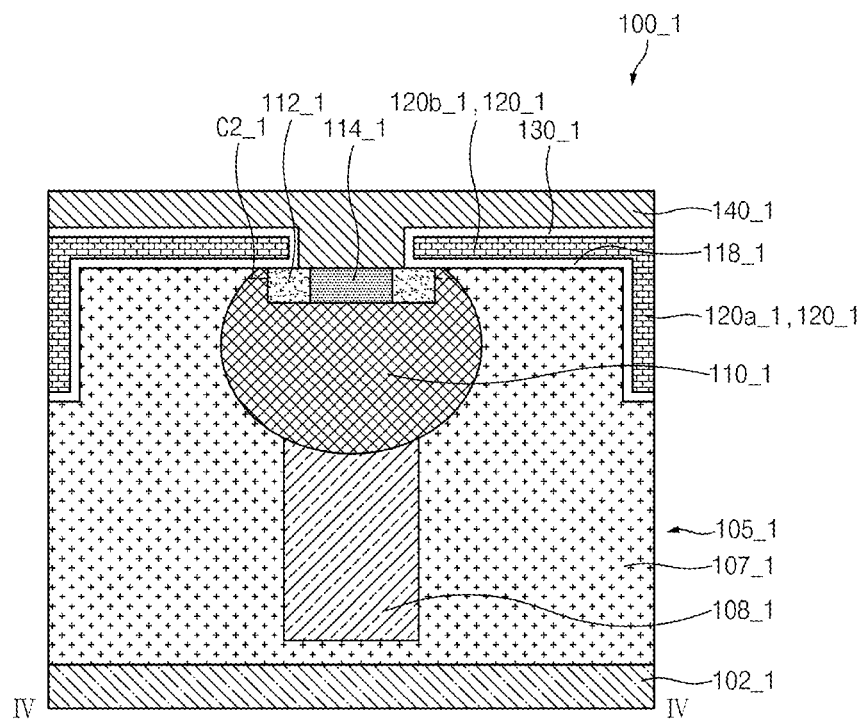
FIG. 19 is a cross-sectional view illustrating the structure taken along line IV-IV of FIG. 16.
Figure 20:
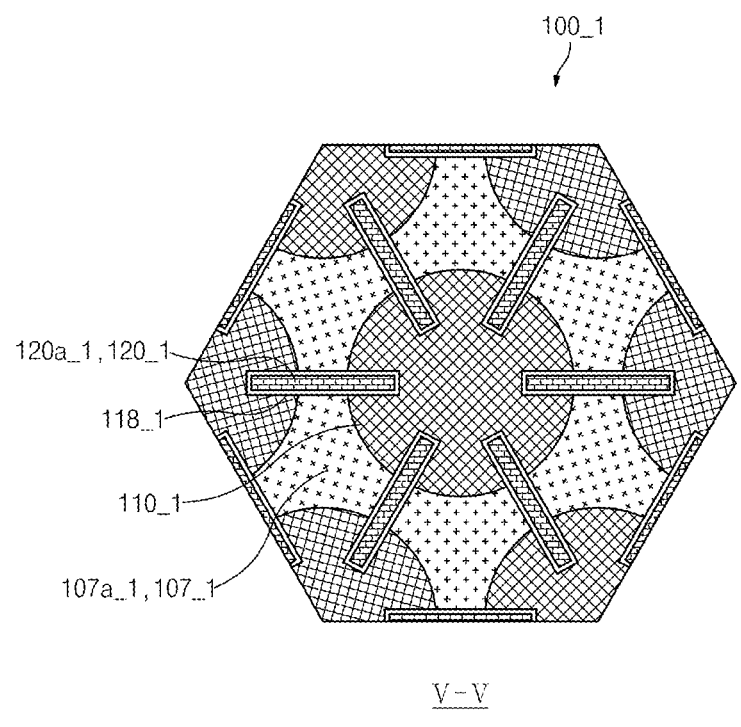
FIG. 20 is a plan view illustrating the structure taken along line V-V of FIG. 15.

FIG. 15 is a perspective view schematically illustrating the structure of a power semiconductor device, according to an embodiment of the present disclosure, and FIG. 16 is a plan view (horizontal sectional view) illustrating the structure taken along line I-I of FIG. 15. FIG. 17 is a cross-sectional view illustrating the structure taken along line II-II of FIG. 16, FIG. 18 is a cross-sectional view illustrating the structure taken along line III-III of FIG. 16, FIG. 19 is a cross-sectional view illustrating the structure taken along line IV-IV of FIG. 16, and FIG. 20 is a plan view (horizontal sectional view) illustrating the structure taken along line V-V of FIG. 15.

Referring to FIGS. 15 to 20, a power semiconductor device 100_1 may at least include a semiconductor layer 105_1, a gate insulating layer 118_1, a gate electrode layer 120_1, and a plurality of interlayer insulating layer 130_1, and a source electrode layer 140_1. For example, the power semiconductor device 100_1 may have a power MOSFET structure.

The semiconductor layer 105_1 may include a single semiconductor material layer or a plurality of semiconductor material layers. For example, the semiconductor layer 105_1 may include a single epitaxial layer or multiple epitaxial layers. Alternatively, the semiconductor layer 105_1 may include a single epitaxial layer or multiple epitaxial layers formed on a semiconductor substrate. For example, the semiconductor layer 105_1 may include silicon carbide (SiC). Alternatively, the semiconductor layer 105_1 may include at least one SiC-epitaxial layer.

As silicon carbide (SiC) has a bandgap higher than a bandgap of silicon (Si), silicon carbide (SiC) may maintain stability even at a higher temperature, as compared to silicon (Si). Further, silicon carbide (SiC) exhibits a dielectric breakdown field remarkably higher than that of silicon (Si). Accordingly, silicon carbide (SiC) may stably work even at a higher voltage. Accordingly, the power semiconductor device 100_1 having the semiconductor layer 105_1 including silicon carbide (SiC) may exhibit a more excellent heat dissipation characteristic with a higher breakdown voltage, and may exhibit a stabler operating characteristic at a higher temperature, when compared to silicon (Si)

In more detail, the semiconductor layer 105_1 may include a drain region 102_1, a drift region 107_1, a plurality of pillar regions 108_1, a plurality of well regions 110_1, a plurality of source regions 112_1, a plurality of well contact regions 114_1, and a plurality of trenches 116_1.

In this case, the drift region 107_1 may be formed in a first conductive type (for example, the N type) and may be formed by implanting the first conductive type of impurities into a portion of the semiconductor layer 105_1. For example, the drift region 107_1 may be formed by implanting the first conductive type of impurities into the SiC epitaxial layer. The drift region 107_1 may provide a moving path of charges, when the power semiconductor device 100_1 operates.

The well regions 110_1 may be formed in the semiconductor layer 105_1 and may have the second conductive type of impurities. For example, the well regions 110_1 may be formed to be spaced apart from each other in the drift region 107_1 of the semiconductor layer 105_1. According to an embodiment, the well region 110_1 may be formed by implanting impurities in the second conductive type (for example, the P type), which is opposite to the first conductive type, into the semiconductor layer 105_1 or the drift region 107_1.

The pillar region 108_1 may be formed in the semiconductor layer 105_1 under the well region 110_1 such that the pillar region 108_1 is connected to the well region 110_1. The pillar region 108_1 may be formed to make contact with the drift region 107_1 to form a super junction with the drift region 107_1. For example, the pillar region 108_1 may be disposed under the well region 110_1 such that a top surface of the pillar region 108 makes contact with the well region 110_1, and a lateral side and a bottom surface of the pillar region 108 make contact with the drift region 107_1, respectively.

The pillar region 108_1 may be formed in the semiconductor layer 105_1 to have a conductive type opposite to the conductive type of the drift region 107_1 such that the pillar region 108_1 forms the super junction with the drift region 107_1. For example, the pillar region 108_1 may include impurities in the second conductive type which is the type opposite to the type of the drift region 107_1 and the same as the type of the well region 110_1, and the doping concentration of the second conductive type of impurities of the pillar region 108_1 may be adjusted. For example, the doping concentration of the second conductive type of impurities of the pillar region 108_1 may be equal to or lighter than the doping concentration of the second conductive type of impurities of the well region 110_1, but the present disclosure is not limited thereto.

For example, FIGS. 15, 17, 18, and 19 illustrate that one pillar region 108_1 is formed integrally with the wall region 110_1 under each well region 110_1. However, according to another embodiment, a plurality of pillar regions 108_1 may be formed under the well region 110_1. In other words, the plurality of pillar regions 108_1 having a width narrower than the width of the pillar region 108_1 illustrated in FIGS. 15, 17, 18, and 19 may be formed under one well region 110_1. In this case, the plurality of pillar region 108_1 disposed under one well region 110_1 may be alternately disposed such that lateral sides of the pillar regions 108_1 make contact with the drift region 107_1.

However, according to another embodiment, a plurality of pillar regions 108_1 may be formed under the well region 110_1. According to an embodiment, the pillar region 108_1 may be formed to have a width narrower than a width of the well region 110_1 to expose at least a portion of a bottom surface of the well region 110_1, and to be retracted inward from an end portion of the well region 110_1. Accordingly, the well region 110_1 may further protrude toward a protrusion part (vertical part) 107a_1 of the drift region 107_1, as compared to the pillar region 108_1.

Source regions 112_1 may be formed in the well regions 110_1, respectively, and may be formed in the first conductive type. For example, the source regions 112_1 may be formed by implanting the first conductive type of impurities into the semiconductor layer 105_1 or the well region 110_1. The source regions 112_1 may be formed by implanting the first conductive type of impurities having a concentration higher than the concentration of the first conductive type of impurities of the drift region 107_1.

A plurality of well contact regions 114_1 may be formed in the source regions 112_1 and on the well regions 110. For example, the plurality of well contact regions 114_1 may be formed on the well regions 110_1 to be connected to the well regions 110_1 through the source regions 112_1. The well contact region 114_1 may include the second conductive type of impurities.

The well contact regions 114_1 may be connected to a source electrode layer 140_1 The well contact region 114_1 may be doped with the second conductive type of impurities at a higher concentration. According to an embodiment, the well contact regions 114_1 may be doped with the second conductive of impurities having a doping concentration higher than a doping concentration of the second conductive type of impurities of the well regions 110_1. For example, the well contact region 114_1 may be a P+ region.

According to an embodiment, the well contact regions 114_1 may be formed in a recess groove making contact with the well regions 110_1. In this case, the source electrode layer 140_1 may be formed to be filled in the recess groove and to be connected to the well contact region 114_1.

In addition, a drain region 102_1 may be formed in the semiconductor layer 105_1 under the drift region 107_1 and may include the first conductive type of impurities. For example, the drain region 102_1 may include the first conductive type of impurities implanted at a doping concentration higher than the concentration of the first conductive type of impurities of the drift region 107_1.

According to an embodiment, the drain region 102_1 may be provided as a SiC-substrate in the first conductive type. In this case, the drain region 102_1 may be formed as a portion of the semiconductor layer 105_1 or as a substrate separate from the semiconductor layer 105_1. In addition, the drift region 107_1 may include at least one epitaxial layer formed on the drain region 102_1.

According to an embodiment, the well regions 110_1 may be formed to be spaced apart from each other in the semiconductor layer 105_1. Adjacent well regions 110_1 of the well regions 110_1 may be disposed in the semiconductor layer 105_1 to be spaced apart from each other, instead of making contact with each other. Two adjacent well regions 110_1 may be spaced apart from at the center of the bottom surface of the trench 116_1 by a specific distance. In this case, a central portion of a bottom surface of the first part 120a_1 of a gate electrode layer 120_1 may be exposed by the well regions 110_1, but at least opposite bottom corners of the gate electrode layer 120_1 may be surrounded by the well regions 110_1. According to an embodiment, since the well regions 110_1 are spaced apart from each other, the peripheral portion of the center of the bottom surface of the trenches 116_1 may make contact with the drift region 107_1.

In addition, each of the well regions 110_1 may have a shape in which the width of the well region 110_1 is increased inwardly from the surface of the semiconductor layer 105_1 and then decreased. In more detail, the adjacent well regions 110_1 of the well regions 110_1 may be spaced apart from each other by a specific distance on the surface of the semiconductor layer 105_1 as illustrated in FIG. 16. In addition, the adjacent well regions 110_1 of the well regions 110_1 may be spaced apart from each other at portions thereof having the widest width inside the semiconductor layer 105_1, as illustrated in FIG. 20.

According to an embodiment, the drift region 107_1 may be formed in the semiconductor layer 105_1 such that the drift region 107_1 is connected to the surface of the semiconductor layer 105_1 while extending to pass through a space between the well regions 110_1 from the lower portions of the well regions 110_1. For example, the drift region 107_1 may include a protrusion part 107a_1 extending to the surface of the semiconductor layer 105_1 while passing through a space between the well regions 110_1. In this case, the protrusion part 107a_1 may represent a region corresponding to the depth which is formed from the lowermost end portion of the well region 110_1 to the surface of the semiconductor layer 105_1, as illustrated in FIG. 18. In other words, the protrusion parts 107a_1 may correspond to regions positioned to make contact with the lateral side of the well regions 110_1.

A plurality of trenches 116_1 may be formed to be recessed inwardly from the surface (top surface) of the semiconductor layer 105_1 by a specific depth. For example, each of the trenches 116_1 may be formed to connect two source regions 112_1, which are disposed at opposite sides of the trench 116_1, of the source regions 112_1, to each other, while extending by passing through the space between adjacent well regions 110_1 of the well regions 110_1. In more detail, each trench 116_1 may be formed in the type of a line to connect one source region 112_1 to an adjacent source region 112_1 while passing through one well region 110_1 surrounding the source region 112_1, the protrusion part 107a_1 of the drift region 107_1, and an adjacent well region 110_1.

For example, each of the trenches 116_1 may be formed through a portion of the source regions 112_1 and formed to be recessed to a specific depth of the well regions 110_1 and the protrusion parts 107a_1 of the drift region 107_1. Accordingly, at least opposite corners of each trench 116_1 may be surrounded by the well regions 110_1. In addition, when viewed from the cross section of the trench 116_1 taken along an extending direction thereof, a bottom surface of the trench 116_1 may be partially surrounded by the well regions 110_1. For example, adjacent well regions 110_1 of the well regions 110_1 may be formed to be spaced apart from each other on the bottom surface of each of the trenches 116_1 or in the vicinity of the bottom surface of each trench 116_1. Accordingly, opposite sides the bottom surface of the trench 116 may be partially surrounded by the well regions 110_1 on a line provided in a direction in which the trench 116 extends.

A gate insulating layer 118_1 may be formed on inner walls of the trenches 116_1 and at least a portion of the semiconductor layer 105_1. For example, the gate insulating layer 118_1 may be formed on the inner surfaces of the trenches 116_1 and on the surface of the semiconductor layer 105_1. The thickness of the gate insulating layer 118_1 may be uniform, or portions, which are formed on the bottom surface and a corner of the trench 116_1, of the gate insulating layer 118_1 may have thicknesses thicker than the thickness of a portion, which is formed on a sidewall of the trench 116_1, of the gate insulating layer 118, such that an electric field concentrated on the corner of the trench 116 is lowered.

For example, the gate insulating layer 118_1 may include an insulating material, such as a silicon oxide, a silicon carbide oxide, a silicon nitride, a hafnium oxide, a zirconium oxide, or an aluminum oxide, or may include a stack structure thereof.

A gate electrode layer 120_1 may be formed on the gate insulating layer 118_1. For example, the gate electrode layer 120_1 may include a first part 120a_1, which is filled in the trench 116_1, and a second part 120b_1 formed on the surface of the semiconductor layer 105_1. For example, the first part 120a_1 of the gate electrode layer 120_1 may have a trench-type gate structure, and the second part 120b_1 may have a planar-type gate structure. Accordingly, the gate electrode layer 120_1 may have a hybrid-type structure including both the trench-type gate structure and the planar-type gate structure.

For example, the second part 120b_1 of the gate electrode layer 120_1 may be formed on the protrusion parts 107a_1 of the drift region 107_1 and the well regions 110_1. In more detail, the second part 120b_1 of the gate electrode layer 120_1 may be formed on the protrusion parts 107a_1 of the drift region 107_1, which are exposed onto the surface of the semiconductor layer 105_1, on the surfaces of the well regions 110_1, and on the surface of a portion of an edge of the source regions. The well contact regions 114_1 and remaining portions of the source regions 112_1 may be disposed outside the gate electrode layer 120_1 and may be exposed from the gate electrode layer 120_1.

At least opposite corner portions of the bottom surface of the first part 120a_1 of the gate electrode layer 120_1 may be surrounded by the well regions 110_1. In addition, when viewed from the cross section of the first part 120a_1 taken along an extending direction of the first part 120a_1, a portion of opposite sides of the bottom surface of the first part 120a_1 may be surrounded by the well regions 110_1. For example, a portion, which surrounds a portion of the corner of the bottom surface of the first part 120a_1, of the well regions 110_1 may be gradually thickened toward the corner of the well regions 110_1.

For example, the gate electrode layer 120_1 may include a conductive material, such as polysilicon, metal, a metal nitride, or a metal silicide, or may include a stack structure thereof.

The interlayer insulating layer 130_1 may be formed on the gate electrode layer 120_1. For example, the interlayer insulating layer 130_1 may include an insulating material, such as an oxide layer, a nitride layer, or the stack structure thereof, for electrical insulation between the gate electrode layer 120_1 and the source electrode layer 140_1.

A source electrode layer 140_1 may be formed on the interlayer insulating layer 130_1. The source electrode layer 140_1 may be commonly connected to the source regions 112_1 and the well contact region 114_1. In addition, the source electrode layer 140_1 may be electrically connected to the source regions 112_1 and the well contact regions 114_1. For example, the source electrode layer 140_1 may be connected to the source regions 112_1 and the well contact regions 114_1 through a portion thereof exposed by the gate electrode layer 120_1 and may be disposed to additionally extend along a top surface of the gate electrode layer 120_1. For example, the source electrode layer 140_1 may include a conductive material such as metal.

A first channel region C1_1 may be formed in the semiconductor layer 105_1 along the trench 116_1 to correspond to the first part 120a_1 of the gate electrode layer 120_1, such that the first channel region C1_1 is connected to the source regions 112_1 and the drift region 107_1. For example, the first channel region C1_1 may be formed in the semiconductor layer 105_1 along sidewalls of the trench 116_1 to connect the drift region 107_1 (that is, the protrusion part 107a_1 of the drift region 107_1), which is positioned under the trench 116_1 or on a lateral side of the trench 116_1, and the source region 112_1, which makes contact with the trench 116_1, to each other Accordingly, the first channel region C1_1 may have a trench-type channel structure.

A second channel region C2_1 may be formed in the semiconductor layer 105_1 under the second part 120b_1 of the gate electrode layer 120_1 such that the second channel region C2_1 makes contact with the source regions 112_1. For example, the second channel region C2_1 may be formed on the semiconductor layer 105_1 among the protrusion part 107a_1 of the drift region 107_1 and the source regions 112_1. The second channel region C2_1 may be formed to cover surfaces of the well regions 110_1. Accordingly, the second channel region C2_1 may have a planar-type channel structure.

For example, the first channel region C1_1 and the second channel region C2_1 may have the first conductive type such that an accumulation channel is formed. For example, the first channel region C1_1 and the second channel region C2_1 may have a doping type opposite to a doping type of the well regions 110_1.

For example, the first channel region C1_1 and the second channel region C2_1 may form (or together include) an inversion channel (in the first conductive type) in the well region 110_1 having the second conductive type (P type), as a gate bias is applied, or may form (or together include) an accumulation channel (in the first conductive type), as the surface of the well region 110_1 has the second conductive type at a light concentration, when the well region 110_1 is formed. Accordingly, the electron density is increased, such that the channel resistances of the first channel region C1_1 and the second channel region C2_1 are decreased.

In addition, the first channel region C1_1 and the second channel region C2_1 may have a doping type the same as doping types of the source region 112_1 and the drift region 107_1. In this case, the source region 112_1, the first channel region C1_1 or the second channel region C2_1, and the drift region 107_1 may have structure normally electrically connected to each other. However, in the structure of the semiconductor layer 105_1 including SiC, negative charges appear due to the trap present on the interface between the gate insulating layer 118_1 and an SiC interface. Accordingly, the bands of the first channel region C1_1 and the second channel region C2_1 are curved upward while forming a potential barrier. Accordingly, the movement of the current may be blocked.

Accordingly, according to the present embodiment, even if the source regions 112_1 are formed to make contact with the vertical parts 107a_1 of the drift region 107_1, when the operating voltage is applied to the gate electrode layer 120_1, a channel may be formed to allow the flow of the current. In this case, an operating voltage (threshold voltage) to be applied to the gate electrode layer 120_1 to form channels in the first channel region C1_1 or the second channel region C2_1 may be considerably lower than an operating voltage to be applied to the gate electrode layer 120_1 to form a typical channel.

For example, the first channel region C1_1 and the second channel region C2_1 may be portions of the well regions 110_1. In more detail, the first channel region C1_1 may be a portion of the well regions 110_1, which are adjacent to a lower portion of the first part 120a_1 of the gate electrode layer 120_1. In more detail, the second channel region C2_1 may correspond to a portion of the well regions 110_1, which are adjacent to a lower portion of the second part 120b_1 of the gate electrode layer 120_1. In other words, the second channel region C2_1 may be formed in a region between the protrusion part 107a_1 of the drift region 107_1 and the source region 112_1.

In this case, the first channel region C1_1 and the second channel region C2_1 may be integrally formed with the well regions 110_1 or may be formed to be continuously connected to the well regions 110. The doping concentration of the first conductive type of impurities, which are provided in the first channel region C1_1 and the second channel region C2_1, may be adjusted depending on a threshold voltage value.

The second channel region C2_1 and the source region 112_1 may be formed on opposite sidewall of the vertical part 107a_1 to be connected to each other. The vertical part 107a_1 of the drift region 107_1, the second channel region C2_1, and the source region 112_1, which are connected to each other, may be a moving path of a current when the power semiconductor device 100_1 operates.

According to an embodiment, three well regions 110_1, which are adjacent to each other, among the well regions 110_1 may have equal spacing. Further, three source regions 112_1, which are adjacent to each other, among the source regions 112_1 may have equal spacing. For example, centers of three adjacent well regions 110_1 may be respectively disposed at vertexes of a regular triangle, and centers of three adjacent source regions 112_1 on the well regions 110_1 may also be respectively disposed at the vertexes of the same regular triangle. For example, the well regions 110_1 and the source regions 112_1 may be understood as indicating three parts forming a triangle as illustrated in FIG. 16.

According to an embodiment, the centers of seven adjacent well regions 110_1 among the well regions 110_1 may be respectively disposed at the center and vertexes of a regular hexagon. In addition, the centers of seven source regions 112_1 present on the seven adjacent well regions 110_1 from among the source regions 112_1 may be respectively disposed at the center and vertexes of the regular hexagon. For example, FIGS. 15 to 19 may be understood as illustrating seven well regions 110_1 and seven source regions 112_1.

In this structure, the well regions 110_1 and the source regions 112_1 may be disposed in a hexagonal closed packed arrangement structure, which is similar to a planar arrangement structure. Further, the adjacent well regions 110_1 may have equal spacing therebetween, and the adjacent source regions 112_1 may have equal spacing therebetween.

In this structure, the trenches 116_1 may be disposed to form portions of lines each linking two adjacent to each other from among the center and vertexes of the regular hexagon such that seven adjacent source regions 112_1 are connected. In more detail, in FIG. 16, the trenches 116_1 may include six lines linking six source regions 112_1 disposed at the vertexes with one source region 112_1 disposed at the center of the regular hexagon, and six lines each connecting two adjacent source regions from among six source regions 112_1 which are disposed at the vertexes.

According to an embodiment, the well regions 110_1 may be a portion of a spherical shape. When viewed from a plan view of the well regions 110_1, the cross-section of the well region has a circular shape at a region including the source region 112_1 and the well contact region 114_1 form a circular shape, and may have a ring shape or a doughnut shape at a region which does not include the source region 112_1 and the well contact region 114_1. Further, the well contact regions 114_1 may be formed in the ring shape or the doughnut shape, when viewed from a plane view. For example, when viewed from a plan view, the well contact regions 114_1 having the ring shape may be formed in the well regions 110_1 having the ring shape, and the source regions 112_1 having the circular shape may be formed in the well contact region 114_1 having the ring shape. The well contact regions 114_1 may be connected to the well regions 110_1, when viewed from a bottom view. When viewed from the plan view, the source regions 112_1 may be formed in a doughnut shape to surround the well contact regions 114_1. The shape when viewed from the plan view may be formed to a specific depth from the surface of the semiconductor layer 105_1.

According to an embodiment, a portion, which is formed under bottom surfaces of the trenches 116_1, of the well regions 110_1, for example, the first channel region C1_1 formed in the well regions 110_1 in the vicinity of the bottom surfaces of the trenches 116_1, may be connected to the protrusion part 107a_1 under the relevant portion.

For another example, when the whole thickness of the well region 110_1 under the bottom surface of each trench 116_1 is thicker than the thickness of the first channel region C1_1, the first channel region C1_1 may not be connected to the drift region 107_1 formed under each trench 116_1. However, when each well region 110_1 has a spherical shape, since at least a lateral side of the trench 116_1 is exposed from the well region 110_1 and is surrounded by the protrusion part 107a_1 of the drift region 107_1, the first channel region C1_1 may be connected from the protrusion part 107a_1 of the drift region 107_1, which is provided on the lateral side of the trench 116 or on the sidewall of the first part 120a_1 of the gate electrode layer 120_1, to the source region 112_1.

Although the above description has been made in that the first conductive type and the second conductive type are opposite to each other and are an N type and a P type, respectively, the first conductive type and the second conductive type may be the P type and the N type In more detail, when the power semiconductor device 100_1 is an N-type MOSFET, the drift region 107_1 may be an N− region, the source region 112_1 and the drain region _ 102 may be N+ regions, the first channel region C1_1 and the second channel region C2_1 may be N− regions, the well region 110_1 and the pillar region 108_1 may be P− regions, and the well contact region 114_1 may be a P+ region.

According to the power semiconductor device 100_1, a depth of the well regions 110_1 may be deeper than that of the trenches 116_1 and the gate electrode layer 120_1. Accordingly, opposite corners, which are positioned on the bottom surface of the trench 116, of the first part 120a_1 of the gate electrode layer 120_1 may be surrounded by the well regions 110_1. Further, a portion of the opposite corners of the bottom surface of the first part 120a_1 may be surrounded by the well regions 110_1. Such a structure may alleviate the concentration of the electric field on a partial corner portion of the bottom surface of the trench in the trench-type gate structure.

When the operating voltage is applied to the gate electrode layer 120_1, the electric field may be concentrated to the lower corner portions of the gate electrode layer 120_1. When the electric field is concentrated, the gate insulating layer 118_1 in the relevant region may receive severe stress, so dielectric breakdown of the gate insulating layer 118_1 may be caused. Therefore, according to the present embodiment, as lower opposite corner portions, which are formed in the well region 110_1, of the gate electrode layer 120_1 may be surrounded by the well region 110_1 in the P type to achieve charge sharing, thereby preventing the dielectric breakdown of the gate insulating layer 118_1, as the electric field is concentrated on corner portions of the gate insulating layer 118_1.

When the power semiconductor device 100_1 operates, a current may mainly flow in a vertical direction from the drain region 102_1 along the drift region 107_1, and may then flow to the source region 112_1 through the first channel region C1_1 and the second channel region C2_1.

The power semiconductor device 100_1 may have a hybrid structure including both the trench-type gate structure and the planar-type gate structure. In addition, the power semiconductor device 100_1 may have a regular hexagon arrangement structure and may provide the high degree of integration with the high channel density by combining the trench-type gate structure and the planar-type gate structure. In addition, when compared to the case where only a planar-type structure is provided, the power semiconductor device 100_1 may maintain the degree of integration through the addition of the trench-type structure and may improve the channel mobility.

Meanwhile, since the power semiconductor device 100_1 is used for high-power switching, the power semiconductor device 100-2 requires a high withstand voltage characteristic. When a high voltage is applied to the drain region 102_1, a depletion region may be expanded from the semiconductor layer 105_1 adjacent to the drain region 102_1 such that a voltage barrier of a channel is lowered. This phenomenon is called "drain induced barrier lowering (DIBL)".

The DIBL may make the first channel region C1_1 and the second channel region C2_1 abnormally turned on, and furthermore, may cause a punch through phenomenon, in which a depletion region is expanded between the drain region 102_1 and the source region 112_1 such that the drain region 102_1 and the source region 112 make contact with each other.

However, the power semiconductor device 100_1 described above may secure an appropriate withstand voltage characteristic by reducing the resistance between the drift region 107_1, and the first channel region C1_1 and the second channel region C2_1, and suppressing an abnormal current flow and the punch through phenomenon caused by the DIBL, by using the pillar region 108_1 forming the super junction with the drift region 107_1. Accordingly, even if the thickness of the drift region 107_1 forming the body is reduced, the higher breakdown voltage may be maintained.

In addition, since the current flows through the vertical parts 107a_1 of the drift region 107_1 in the power semiconductor device 100_1, the moving path of the current is reduced to increase the resistance (JFET resistance). However, according to the present embodiment, in the power semiconductor device 100_1, the JFET resistance may be reduced by using the pillar region 108_1 forming the super junction together with the drift region 107_1. For example, a charge amount in the pillar region 108_1 and a charge amount in the drift region 107_1 are adjusted to reduce the JFET resistance.

When a charge amount of the pillar region 108_1 is greater than a charge amount of the drift region 107_1, and when the power semiconductor device 100_1 operates, a breakdown voltage may be increased by allowing the maximum electric field to be formed in the drift region 107_1 on the same line as the bottom surface of the pillar region 108_1. For example, the charge amount of the pillar region 108_1 may become greater than the charge amount of the drift region 107_1 by making a doping concentration of the second conductive type of impurities of the pillar region 108_1 higher than a doping concentration of the first conductive type of impurities of the drift region 107_1, thereby enhancing the withstand voltage characteristic of the power semiconductor device 100_1, such that the JFET resistance is reduced.

Figure 21:
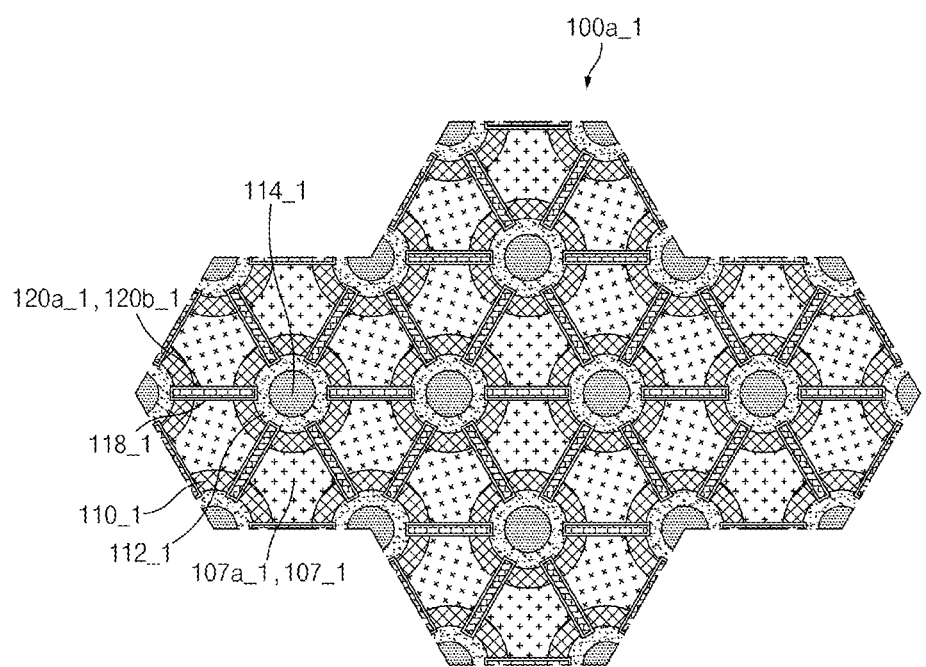
FIG. 21 is a plan view schematically illustrating the structure of a power semiconductor device, according to another embodiment of the present disclosure.

FIG. 21 is a plan view (or a horizontal sectional view) illustrating a power semiconductor device 100a_1 according to another embodiment of the present disclosure.

Referring to FIG. 21, the power semiconductor device 100a_1 shows a portion of a structure, in which a plurality of power semiconductor devices 100_1 in FIGS. 15 to 20 are arranged, and the same reference numerals of the components of power semiconductor devices 100_1 will be assigned to components of the power semiconductor device 100a_1. Accordingly, the duplication thereof will be omitted.

As the power semiconductor device 100a_1 is formed by repeating a hexagonal closed packed arrangement structure illustrated in FIGS. 15 to 20, the power semiconductor device 100a_1 may have the degree of higher integration.

Figure 22:
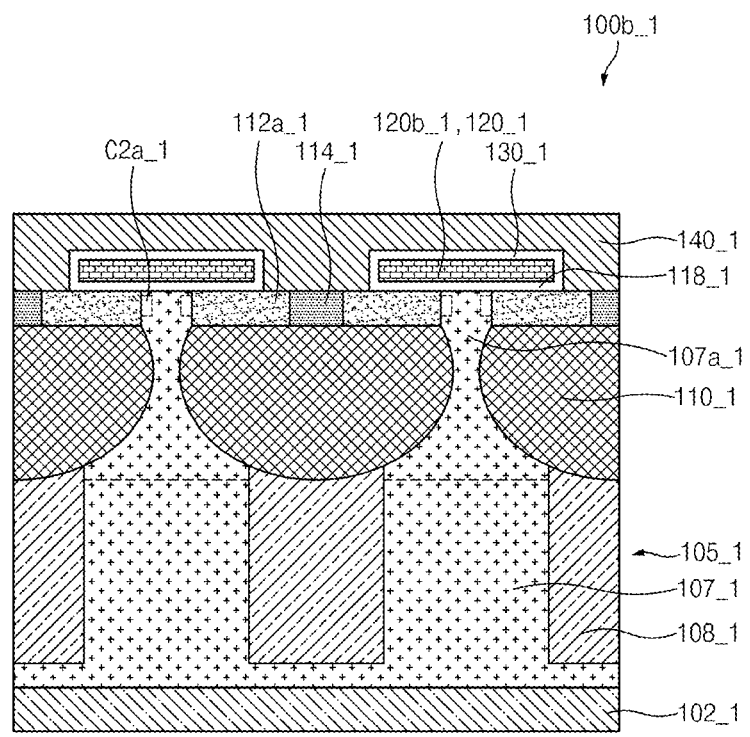
FIGS. 22 and 23 are cross-sectional views schematically illustrating the structure of a power semiconductor device, according to still another embodiment of the present disclosure.
Figure 23:
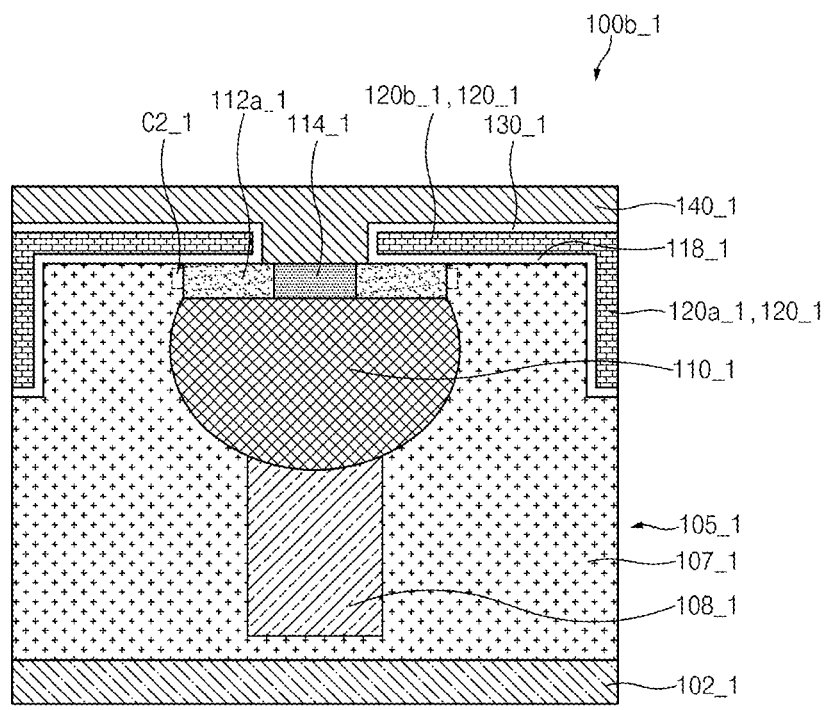

FIGS. 22 and 23 are cross-sectional views illustrating a power semiconductor device 100b_1 according to another embodiment of the present disclosure. The power semiconductor device 100b_1 may be implemented by modifying a partial configuration of the power semiconductor device 100_1 of FIGS. 15 to 20, and the description of the power semiconductor device 100b_1 and the description of the power semiconductor device 100_1 make references to each other. Accordingly, the duplicated descriptions will be omitted.

Referring to FIGS. 22 and 23, in the power semiconductor device 100b_1, a second channel region C2a_1 may be formed in a semiconductor layer 105_1 between the drift region 107_1 and the source region 112_1. For example, the second channel region C2a_1 may be formed in the semiconductor layer 105_1 between the protrusion part 107a_1 of the drift region 107_1 and the source region 112a_1. The second channel region C2a_1 may include the first conductive type of impurities to form an accumulation channel. In this case, the accumulation channel may refer to that holes are accumulated in the well region 110_1 in the P type which is the second conductive type. However, according to an embodiment of the present disclosure, when an effect of forming a first conductive type of channel is exhibited by forming the second conductive type (for example, the P type) at a lower concentration with respect to the surface of the well region 110_1, as the energy is adjusted to form the well region 110_1, or when the first conductive type of impurities are ion-implanted, the term of "accumulation channel" is used in both cases.

For example, the second channel region C2a_1 may have the doping type the same as the doping types of the source region 112a_1 and the drift region 107_1. In this case, the source region 112_1, the second channel region C2a_1, and the drift region 107_1 may have structure normally electrically connected to each other. The semiconductor layer 105_1 including SiC has negative charges, as a trap is present in the interface with the gate insulating layer. Accordingly, the band of the second channel region C2a_1 is curved upward to form a potential barrier, thereby increasing the threshold voltage. However, when a well is formed such that the second conductive concentration is reduced, the threshold voltage applied to the gate electrode layer 120_1 may be lowered.

According to an embodiment, the second channel region C2a_1 may be a portion of the drift region 107_1. In more detail, the second channel region C2a_1 may be a portion of the protrusion portion 107a_1 of the drift region 107_1. For example, the second channel region C2a_1 may be integrally formed with the drift region 107_1. Accordingly, in the power semiconductor device 100b_1, the source regions 112a_1 may directly make contact with the drift region 107_1 (for example, the protrusion part 107a_1 of the drift region 107_1), and the second channel region C2a_1 may be defined in a portion of the drift region 107_1 by the contact portion.

For example, a doping concentration of the first conductive type of impurities of the second channel region C2a_1 may be adjusted to adjust the threshold voltage.

According to an embodiment, the well region 110_1 may be formed under the source regions 112a_1 to further protrude toward the protrusion part 107a_1 of the drift region 107_1, as compared to the source regions 112a_1. In this case, the second channel region C2a_1 may be formed in the semiconductor layer 105_1 on the protruding portion of the well region 110_1. For example, the protrusion part 107a_1 of the drift region 107_1 may further extend into a groove portion between the well region 110_1, and the second part 120b_1 of the gate electrode layer 120_1, and the second channel region C2a_1 may be formed at the extending protruding part. The above structure may define the second channel region C2a_1 between the second part 120b_1 of the gate electrode layer 120_1 and the well region 110_1.

In the power semiconductor device 100b_1, the first channel region C1_1 may be provided as an accumulation channel, which is similar to the power semiconductor device 100_1 of FIGS. 15 to 20.

Figure 24:
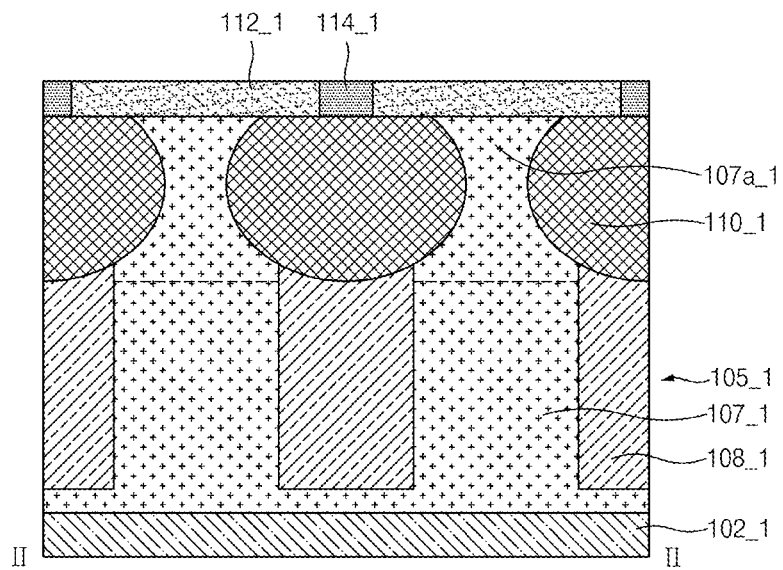
FIGS. 24 to 26 are cross-sectional views schematically illustrating a method for fabricating the power semiconductor device of FIG. 15.
Figure 25:
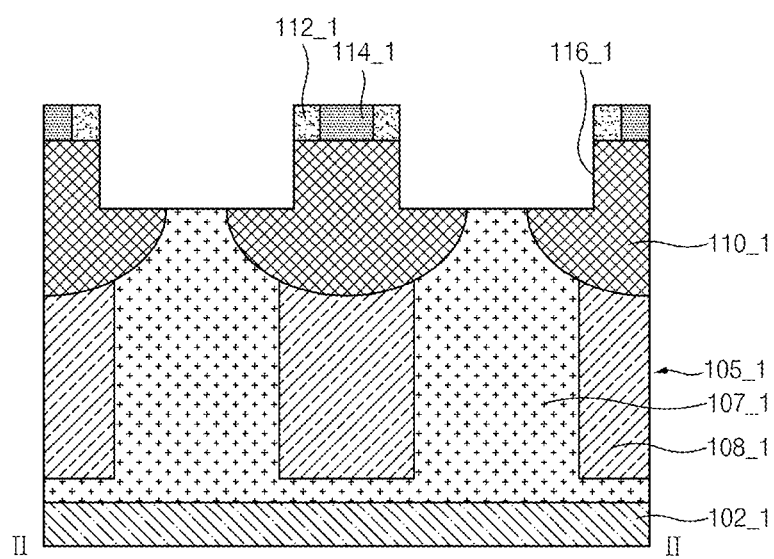
Figure 26:
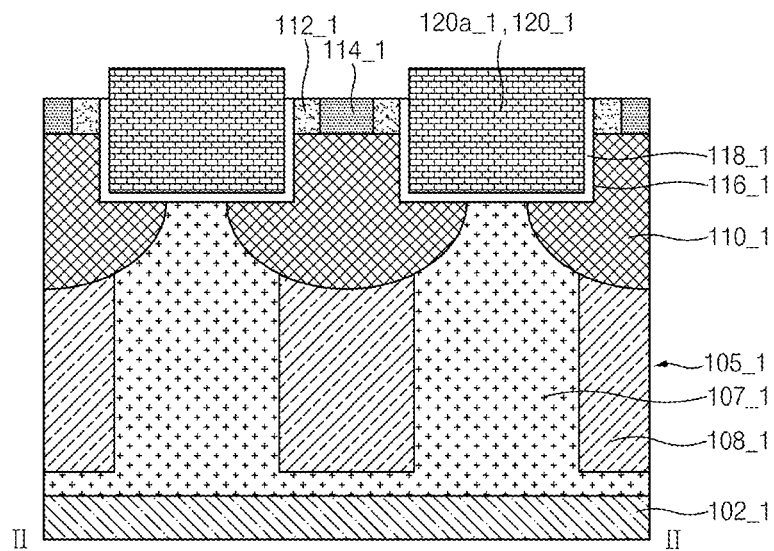
Figure 27:
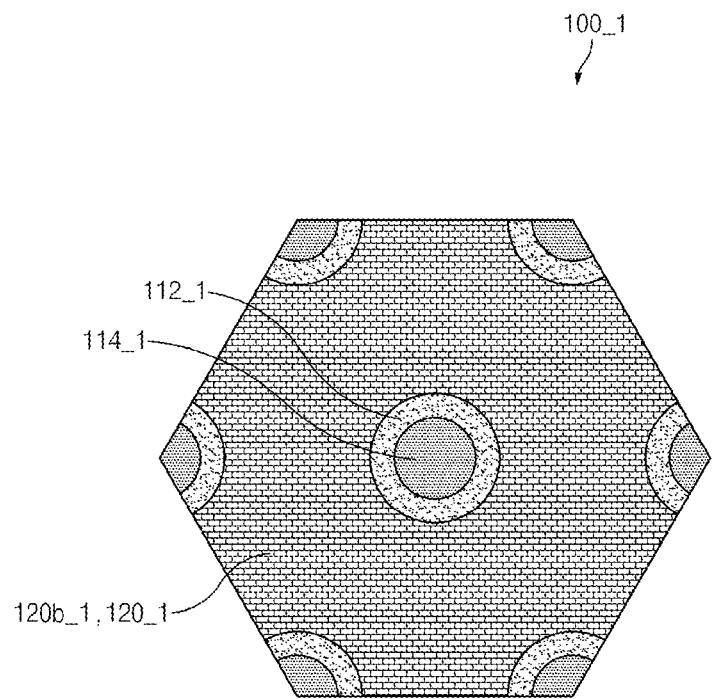
FIG. 27 is a plan view schematically illustrating the structure of the power semiconductor device of FIG. 26.

FIGS. 24 to 26, and 28 are cross-sectional views illustrating a method for fabricating the power semiconductor device 100_1, according to an embodiment of the present disclosure, and FIG. 27 is a plan view (a longitudinal-sectional view) of FIG. 26.

Referring to FIG. 24, the drift region 107_1 having the first conductive type may be formed in the semiconductor layer 105_1 including silicon carbide (SiC) to provide a vertical moving path of a charge. For example, the drift region 107_1 may be formed on the drain region 102_1 having the first conductive type. According to an embodiment, the drain region 102_1 may be provided in the form of a substrate having the first conductive type, and the drift region 107_1 may include one or more epitaxial layers formed on the substrate.

Next, the well regions 110_1 having the second conductive type may be formed in the semiconductor layer 105_1 to make contact with the drift region 107_1. Adjacent well regions 110_1 of the well regions 110_1 may be formed to be spaced apart from each other, instead of making contact with each other. In addition, the forming of the well regions 110_1 may be performed by implanting the second conductive type of impurities into the semiconductor layer 105_1. The well regions 110_1 may be actually formed to a specific depth from the surface of the semiconductor layer 105_1.

For example, the well regions 110_1 may be formed in the semiconductor layer 105_1, such that the drift region 107_1 includes the protrusion parts 107a_1, at least portions of which are surrounded by the well regions 110_1. In more detail, the well regions 110_1 may be formed by doping impurities in a conductive type opposite to that of the drift region 107_1 into the drift region 107_1.

The pillar region 108_1 may be formed in the semiconductor layer 105_1 under the well region 110_1 such that the pillar region 108_1 is connected to the well region 110_1. The pillar region 108_1 may have the second conductive type to form a super junction together with the drift region 107_1. For example, the pillar region 108_1 may be formed by implanting the second conductive type of impurities into the drift region 107_1.

The source regions 112_1 having the first conductive type may be formed in the semiconductor layer 105_1 in the well regions 110_1 or on the well regions 110_1. For example, the forming of the source regions 112_1 may be performed by implanting the first conductive type of impurities into the well regions 110_1 and the drift region 107_1. The source regions 112_1 may be actually formed at a specific depth of the well region 110_1 from the surface of the semiconductor layer 105_1.

In addition, the well contact regions 114_1 having the second conductive type may be formed in the source regions 112_1 or on the well regions 110_1. For example, the well contact regions 114_1 may be formed by implanting the second conductive type of impurities into the well regions 110_1 or into the source regions 112_1 at a high concentration. For example, the well contact regions 114_1 may be formed to have a circular shape when viewed in a plan view.

According to an embodiment, the well regions 110_1 may be formed to make contact with the drift region 107_1, such that the drift region 107_1 is connected to the surface of the semiconductor layer 105_1 while extending to pass through a space between the well regions 110_1 from the lower portions of the well regions 110_1.

According to a modification of the present embodiment, the sequence of doping impurities into the well regions 110_1, the pillar region 108_1, the well contact regions 114_1, and the source regions 112_1 may be arbitrarily changed.

In the above fabricating method, the impurity implantation or the impurity doping may be performed such that the impurities are mixed, when the impurities are ion-implanted into the semiconductor layer 105_1 or when an epitaxial layer is formed. However, an ion implantation manner using a mask pattern may be used to implant impurities into a selective region.

Alternatively, a heat treatment process for activating or diffusing the impurities may be performed after the ion implantation.

Referring to FIG. 25, the plurality of trenches 116_1 may be formed to be recessed by a specific depth into the semiconductor layer 105_1 from the surface of the semiconductor layer 105_1.

For example, the trenches 116_1 may be formed to penetrate portions of the source regions 112_1 and to be recessed to a specific depth of the well regions 110_1 and the protrusions 107a_1 of the drift region 107_1. In more detail, each of the trenches 116_1 may be formed to be recessed from the surface of the semiconductor layer 105_1 into the semiconductor layer 105_1, to connect two source regions 110_1, which are disposed at opposite sides of the trench 116_1, of the source regions 112_1 to each other, while extending by passing through the space between adjacent well regions 110_1 of the well regions 110_1.

For example, the trenches 116_1 may be formed by forming a photo mask through a photo lithography process and then by etching the semiconductor layer 105_1 using the photo mask as an etching protective layer.

Referring to FIGS. 26 and 27, the gate insulating layer 118_1 may be formed on the inner walls of the trenches 116_1 and the surface of the semiconductor layer 105_1. For example, the gate insulating layer 118_1 may be formed by oxidizing the semiconductor layer 105_1 to form an oxide or by depositing an insulating material, such as an oxide or a nitride, on the semiconductor layer 105_1.

For example, the first part 120a_1, which is filled in the trench 116_1, and the second part 120b_1 formed on the surface of the semiconductor layer 105_1 may be formed on the gate insulating layer 118_1 to form gate electrode layers 120_1. In this case, the gate electrode layer 120_1 may not be formed in the well contact region 114_1 and in a partial region of the source regions 112_1 adjacent to the well contact region 114_1. For example, the gate electrode layer 120_1 may be formed after forming a conductive layer on the gate insulating layer 118_1 and patterning the conductive layer. The gate electrode layer 120_1 may be formed by doping impurities in polysilicon or may be formed to include a conductive metal or metal silicide.

The patterning process may be performed through photo lithography and etching processes. The photo lithography process may include a process of forming a photoresist pattern as a mask layer through a photo process and a developing process, and the etching process may include a process of selectively etching an underlying structure by using the photoresist pattern.

Figure 28:
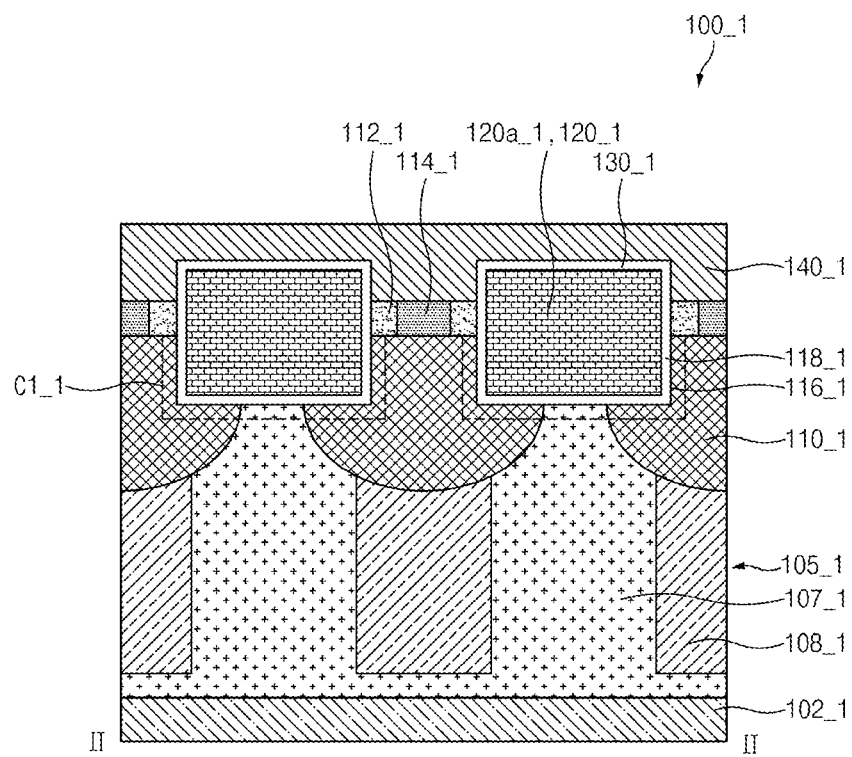
FIG. 28 is a cross-sectional view schematically illustrating a method for fabricating a power semiconductor device after the processes of FIG. 26.

Referring to FIG. 28, the interlayer insulating layer 130_1 may be formed on the gate electrode layer 120_1.

Subsequently, the source electrode layer 140_1 may be formed on the interlayer insulating layer 130_1. In addition, the source electrode layer 140_1 may be electrically connected to the source regions 112_1 and the well contact regions 114_1. For example, the source electrode layer 140_1 may be formed by forming a conductive layer, for example, a metal layer on the interlayer insulating layer 130_1 and patterning the conductive layer.

According to the fabricating method described above, the MOSFET structure having the hexagonal closed packed arrangement in the semiconductor layer 105_1 may be economically formed.

Figure 29:
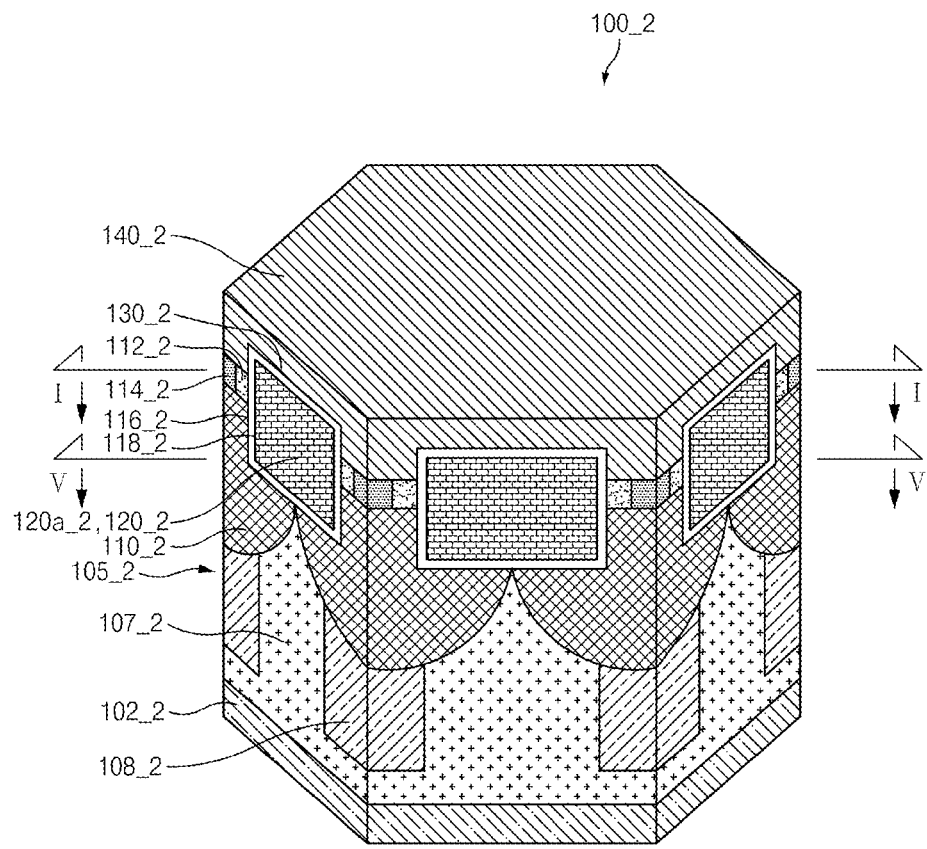
FIG. 29 is a perspective view schematically illustrating the structure of a power semiconductor device, according to an embodiment of the present disclosure.
Figure 30:
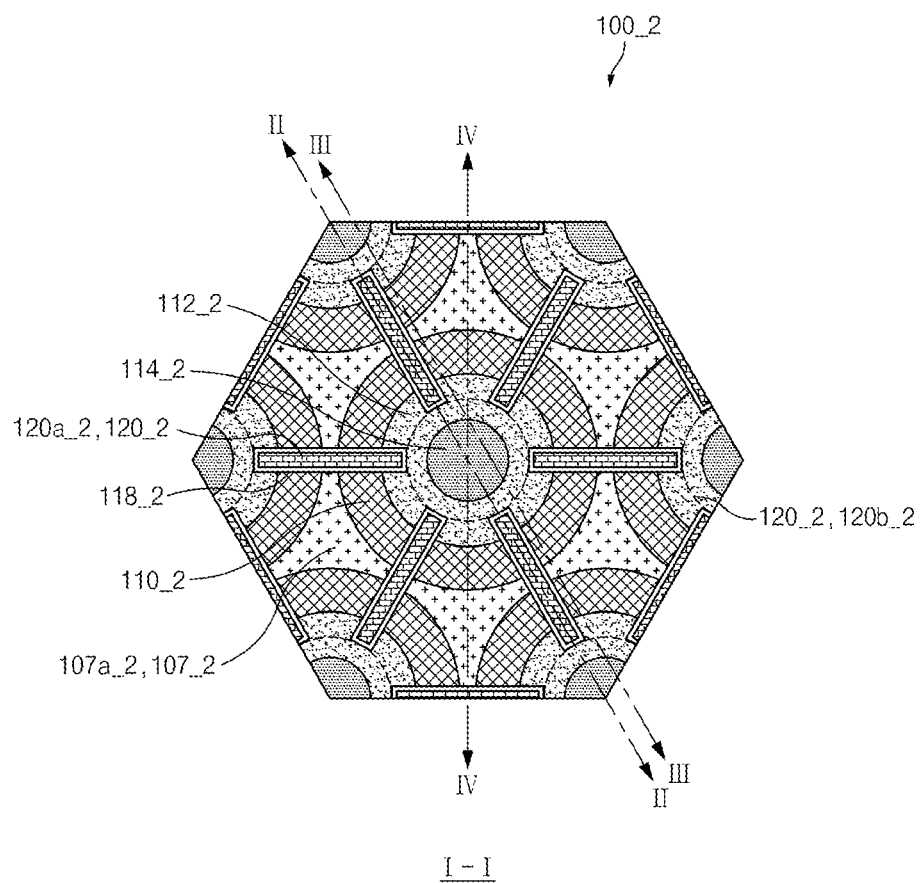
FIG. 30 is a plan view illustrating the structure taken along line I-I of FIG. 29.
Figure 31:
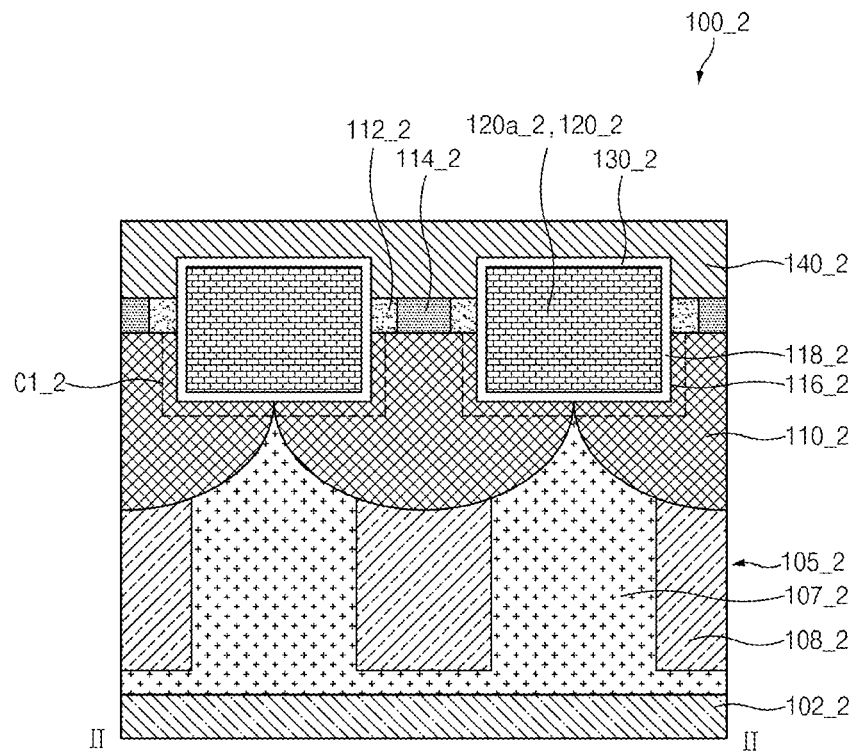
FIG. 31 is a plan view illustrating the structure taken along line II-II of FIG. 30.
Figure 32:
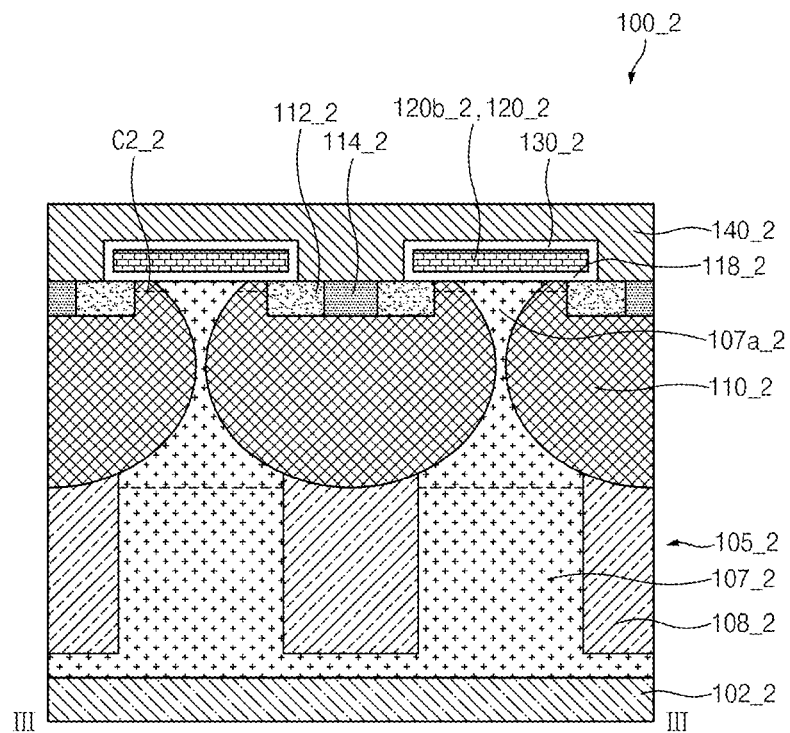
FIG. 32 is a cross-sectional view illustrating the structure taken along line III-III of FIG. 30.
Figure 33:
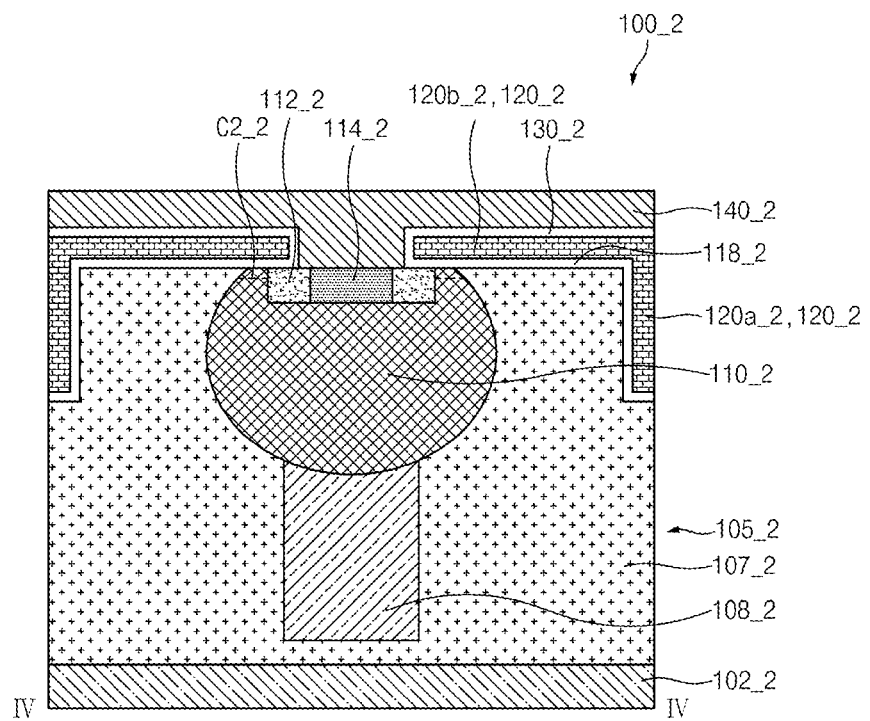
FIG. 33 is a cross-sectional view illustrating the structure taken along line IV-IV of FIG. 30.
Figure 34:
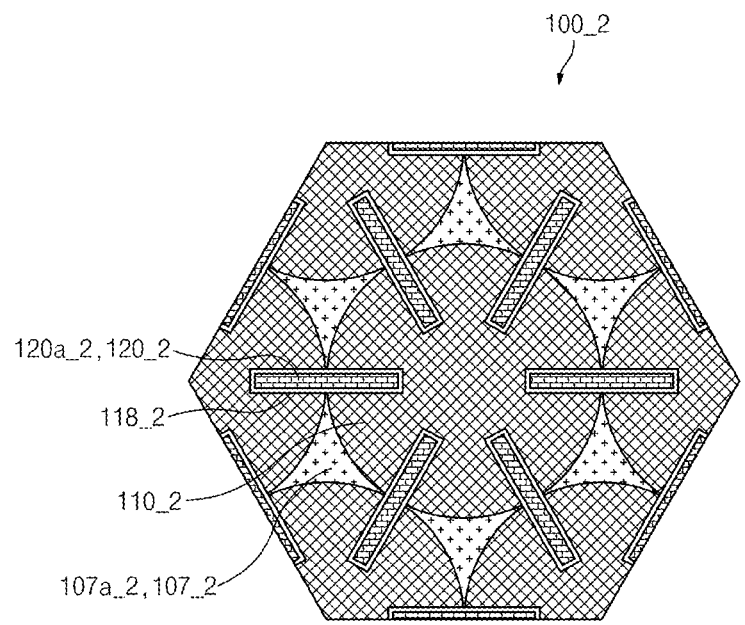
FIG. 34 is a plan view illustrating the structure taken along line V-V of FIG. 29.

FIG. 29 is a perspective view schematically illustrating the structure of a power semiconductor device, according to an embodiment of the present disclosure, and FIG. 30 is a plan view (horizontal sectional view) illustrating the structure taken along line I-I of FIG. 29. FIG. 31 is a cross-sectional view illustrating the structure taken along line II-II of FIG. 30, FIG. 32 is a cross-sectional view illustrating the structure taken along line III-III of FIG. 30, FIG. 33 is a cross-sectional view illustrating the structure taken along line IV-IV of FIG. 30, and FIG. 34 is a plan view (horizontal sectional view) illustrating the structure taken along line V-V of FIG. 29.

Referring to FIGS. 29 to 34, a power semiconductor device 100_2 may at least include a semiconductor layer 105_2, a gate insulating layer 118_2, a gate electrode layer 120_2, and a plurality of interlayer insulating layer 130_2, and a source electrode layer 140_2. For example, the power semiconductor device 100_2 may have a power MOSFET structure.

The semiconductor layer 105_2 may include a single semiconductor material layer or a plurality of semiconductor material layers. For example, the semiconductor layer 105_2 may include a single epitaxial layer or multiple epitaxial layers. Alternatively, the semiconductor layer 105_2 may include a single epitaxial layer or multiple epitaxial layers formed on a semiconductor substrate. For example, the semiconductor layer 105_2 may include silicon carbide (SiC). Alternatively, the semiconductor layer 105_2 may include at least one SiC-epitaxial layer.

As silicon carbide (SiC) has a bandgap higher than a bandgap of silicon (Si), silicon carbide (SiC) may maintain stability even at a higher temperature, as compared to silicon (Si). Further, silicon carbide (SiC) exhibits a dielectric breakdown field remarkably higher than that of silicon (Si). Accordingly, silicon carbide (SiC) may stably work even at a higher voltage. Accordingly, the power semiconductor device 100_2 having the semiconductor layer 105_2 including silicon carbide (SiC) may exhibit a more excellent heat dissipation characteristic with a higher breakdown voltage, and may exhibit a stabler operating characteristic at a higher temperature, when compared to silicon (Si)

In more detail, the semiconductor layer 105_2 may include a drain region 102_2, a drift region 107_2, a plurality of pillar regions 108_2, a plurality of well regions 110_2, a plurality of source regions 112_2, a plurality of well contact regions 114_2, and a plurality of trenches 116_2.

In this case, the drift region 107_2 may be formed in a first conductive type (for example, the N type) and may be formed by implanting the first conductive type of impurities into a portion of the semiconductor layer 105_2. For example, the drift region 107_2 may be formed by implanting the first conductive type of impurities into the SiC epitaxial layer. The drift region 107_2 may provide a moving path of charges, when the power semiconductor device 100_2 operates.

The well regions 110_2 may be formed in the semiconductor layer 105_2 and may include the second conductive type of impurities. For example, the well regions 110_2 may be formed in the semiconductor layer 105_2 to make contact with the drift region 107_2. According to an embodiment, the well region 110_2 may be formed by implanting impurities in the second conductive type (for example, the P type), which is opposite to the first conductive type, into the semiconductor layer 105_2 or the drift region 107_2.

The pillar region 108_2 may be formed in the semiconductor layer 105_2 under the well region 110_2 such that the pillar region 108_2 is connected to the well region 110_2. The pillar region 108_2 may be formed to make contact with the drift region 107_2 to form a super junction together with the drift region 107_2. For example, the pillar region 108_2 may be disposed under the well region 110_2, such that a top surface of the pillar region 108_2 makes contact with the well region 110_2, and a lateral side and a bottom surface of the pillar region 108_2 make contact with the drift region 107_2, respectively.

The pillar region 108_2 may be formed in the semiconductor layer 105_2 to have a conductive type opposite to the conductive type of the drift region 107_2, such that the pillar region 108_2 forms the super junction together with the drift region 107_2. For example, the pillar region 108_2 may include impurities in the second conductive type which is the type opposite to the type of the drift region 107_2 and the same as the type of the well region 110_2, and the doping concentration of the second conductive type of impurities of the pillar region 108_2 may be adjusted. For example, the doping concentration of the second conductive type of impurities of the pillar region 108_2 may be equal to or lighter than the doping concentration of the second conductive type of impurities of the well region 110_2, but the present disclosure is not limited thereto.

For example, FIGS. 29, 31, 32, and 33 illustrate that one pillar region 108_2 is formed integrally with the wall region 110_2 under each well region 110_2. However, according to another embodiment, the plurality of pillar regions 108_2 may be formed under the well region 110_2. In other words, the plurality of pillar regions 108_2 having a width narrower than the width of the pillar region 108_2 illustrated in FIGS. 29, 31, 32, and 33 may be formed under one well region 110_2. In this case, the plurality of pillar region 108_2 disposed under one well region 110_2 may be alternately disposed such that lateral sides of the pillar regions 108_2 make contact with the drift region 107_2.

However, according to another embodiment, a plurality of pillar regions 108_2 may be formed under the well region 110_2. According to an embodiment, the pillar region 108_2 may be formed to have a width narrower than a width of the well region 110_2 to expose at least a portion of a bottom surface of the well region 110_2, and to be retracted inward from an end portion of the well region 110_2. Accordingly, the well region 110_2 may further protrude toward a protrusion part (vertical part) 107a_2 of the drift region 107_2, as compared to the pillar region 108_2.

Source regions 112_2 may be formed in the well regions 110_2, respectively, and may be formed in the first conductive type. For example, the source regions 112_2 may be formed by implanting the first conductive type of impurities into the semiconductor layer 105_2 or the well region 110_2. The source regions 112_2 may be formed by implanting the first conductive type of impurities having a concentration higher than the concentration of the first conductive type of impurities of the drift region 107_2.

A plurality of well contact regions 114_2 may be formed in the source regions 112_2 and on the well regions 110_2. For example, the plurality of well contact regions 114_2 may be formed on the well regions 110_2 to be connected to the well regions 110_2 through the source regions 112_2. The well contact region 114_2 may include the second conductive type of impurities.

The well contact regions 114_2 may be connected to a source electrode layer 140_2. The well contact region 114_2 may be doped with the second conductive type of impurities at a higher concentration. According to an embodiment, the well contact regions 114_2 may be doped with the second conductive of impurities having a doping concentration higher than a doping concentration of the second conductive type of impurities of the well regions 110_2. For example, the well contact region 114_2 may be a P+ region.

According to an embodiment, the well contact regions 114_2 may be formed in a recess groove making contact with the well regions 110_2. In this case, the source electrode layer 140_2 may be formed to be filled in the recess groove and to be connected to the well contact region 114_2.

In addition, a drain region 102_2 may be formed in the semiconductor layer 105_2 under the drift region 107_2 and may include the first conductive type of impurities. For example, the drain region 102_2 may include the first conductive type of impurities implanted at a doping concentration higher than the concentration of the first conductive type of impurities of the drift region 107_2.

According to an embodiment, the drain region 102_2 may be provided as a SiC-substrate in the first conductive type. In this case, the drain region 102_2 may be formed as a portion of the semiconductor layer 105_2 or as a substrate separate from the semiconductor layer 105_2. In addition, the drift region 107_2 may include at least one epitaxial layer formed on the drain region 102_2.

According to an embodiment, the well regions 110_2 may be formed in the semiconductor layer 105_2, such that two adjacent well regions at least partially makes contact with each other. Two adjacent well regions 110_2 may make contact with each other at the center of the bottom surface of the trench 116_2. In addition, each of the well regions 110_2 may have a shape in which the width of the well region 110_2 is increased inwardly from the surface of the semiconductor layer 105_2 and then decreased. In detail, two adjacent well regions of the well regions 110_2 may make contact with each other, as illustrated in FIG. 34, at portions showing at least the largest width and may be spaced from each other on the surface of the semiconductor layer 105_2 as illustrated in FIG. 30.

According to an embodiment, the drift region 107_2 may be formed in the semiconductor layer 105_2 such that the drift region 107_2 is connected to the surface of the semiconductor layer 105_2 while extending to pass through a space between the well regions 110_2 from the lower portions of the well regions 110_2. For example, the drift region 107_2 may include a protrusion part 107a_2 extending to the surface of the semiconductor layer 105_2 while passing through a space between the well regions 110_2. In this case, the protrusion part 107a_2 may represent a region corresponding to the depth which is formed from the lowermost end portion of the well region 110_2 to the surface of the semiconductor layer 105_2, as illustrated in FIG. 32. In other words, the protrusion parts 107a_2 may correspond to regions positioned to make contact with the lateral side of the well regions 110_2.

A plurality of trenches 116_2 may be formed to be recessed by a specific depth inwardly from the surface (top surface) of the semiconductor layer 105_2. For example, each of the trenches 116_2 may be formed to connect two source regions 110_2, which are disposed at opposite sides of the trench 116_2, of the source regions 112_2 to each other by extending while passing through the contact portion between adjacent well regions 110_2 of the well regions 110_2. In more detail, each trench 116_2 may be formed in the type of a line linking one source region 112_2 to an adjacent source region 112_2 while passing through one well region 110_2 surrounding the source region 110_2, the protrusion part 107a_2 of the drift region 107_2, and an adjacent well region 110_2.

For example, the trenches 116_2 may be formed to penetrate portions of the source regions 112_2 and to be recessed to a specific depth of the well regions 110_2 and the protrusions 107a_2 of the drift region 107_2. Accordingly, at least opposite corners of each trench 116_2 may be surrounded by the well regions 110_2. In addition, when viewed from the cross section of the trench 116_2 taken along an extending direction thereof, a bottom surface of the trench 116_2 may be fully surrounded by the well regions 110_2. For example, adjacent well regions 110_2 of the well regions 110_2 may be formed to be spaced apart from each other on the bottom surface of each of the trenches 116_2 or in the vicinity of the bottom surface of each trench 116_2. Accordingly, opposite sides the bottom surface of the trench 116 may be surrounded by the well regions 110_2 on a line provided in a direction in which the trench 116 extends.

The gate insulating layer 118_2 may be formed on inner walls of the trenches 116_2 and at least a portion of the semiconductor layer 105_2. For example, the gate insulating layer 118_2 may be formed on the inner surfaces of the trenches 116_2 and on the surface of the semiconductor layer 105_2. The thickness of the gate insulating layer 118_2 may be uniform, or portions, which are formed on the bottom surface and a corner of the trench 116_2, of the gate insulating layer 118_2 may have thicknesses thicker than the thickness of a portion, which is formed on a sidewall of the trench 116_2, of the gate insulating layer 118, such that an electric field concentrated on the corner of the trench 116 is lowered.

For example, the gate insulating layer 118_2 may include an insulating material, such as a silicon oxide, a silicon carbide oxide, a silicon nitride, a hafnium oxide, a zirconium oxide, or an aluminum oxide, or may include a stack structure thereof.

A gate electrode layer 120_2 may be formed on the gate insulating layer 118_2. For example, the gate electrode layer 120_2 may include a first part 120a_2, which is filled in the trench 116_2, and a second part 120b_2 formed on the surface of the semiconductor layer 105_2. For example, the first part 120a_2 of the gate electrode layer 120_2 may have a trench-type gate structure, and the second part 120b_2 may have a planar-type gate structure. Accordingly, the gate electrode layer 120_2 may have a hybrid-type structure including both the trench-type gate structure and the planar-type gate structure.

For example, the second part 120b_2 of the gate electrode layer 120_2 may be formed on the protrusion parts 107a_2 of the drift region 107_2 and the well regions 110_2. In more detail, the second part 120b_2 of the gate electrode layer 120_2 may be formed on the protrusion parts 107a_2 of the drift region 107_2, which are exposed onto the surface of the semiconductor layer 105_2, on the surfaces of the well regions 110_2, and on the surface of a portion of an edge of the source regions. The well contact regions 114_2 and remaining portions of the source regions 112_2 may be disposed outside the gate electrode layer 120_2 and may be exposed from the gate electrode layer 120_2.

At least corner portions of the bottom surface of the first part 120a_2 of the gate electrode layer 120_2 may be surrounded by the well regions 110_2. In addition, when viewed from the cross section of the first part 120a_2 taken along an extending direction of the first part 120a_2, the bottom surface of the first part 120a_2 may be fully surrounded by the well regions 110_2. For example, portions, which surround the bottom surface of the first part 120a_2, of the well regions _ 110 may be the thinnest portions at the center of the bottom surface of the first part 120a_2, and may gradually become thicker toward the corner portions of the first part 120a.

For example, the gate electrode layer 120_2 may include a conductive material, such as polysilicon, metal, a metal nitride, or a metal silicide, or may include a stack structure thereof.

The interlayer insulating layer 130_2 may be formed on the gate electrode layer 120_2. For example, the interlayer insulating layer 130_2 may include an insulating material, such as an oxide layer, a nitride layer, or the stack structure thereof, for electrical insulation between the gate electrode layer 120_2 and a source electrode layer 140_2.

The source electrode layer 140_2 may be formed on the interlayer insulating layer 130_2. The source electrode layer 140_2 may be commonly connected to the source region 112_2 and the well contact region 114_2. In addition, the source electrode layer 140_2 may be electrically connected to the source regions 112_2 and the well contact regions 114_2. For example, the source electrode layer 140_2 may be connected to the source regions 112_2 and the well contact regions 114_2 through a portion thereof exposed by the gate electrode layer 120_2 and may be disposed to additionally extend along a top surface of the gate electrode layer 120_2. For example, the source electrode layer 140_2 may include a conductive material such as metal.

A first channel region C1_2 may be formed in the semiconductor layer 105_2 along the trench 116_2 to correspond to the first part 120a_2 of the gate electrode layer 120_2, such that the first channel region C1_2 is connected to the source regions 112_2 and the drift region 107_2. For example, the first channel region C1_2 may be formed in the semiconductor layer 105_2 along sidewalls of the trench 116_2 to connect the drift region 107_2 (that is, the protrusion part 107a_2 of the drift region 107_2), which is positioned under the trench 116_2 or on a lateral side of the trench 116_2, and a source region 112_2, which makes contact with the trench 116_2, to each other Accordingly, the first channel region C1_2 may have a trench-type channel structure.

A second channel region C2_2 may be formed in the semiconductor layer 105_2 under the second part 120b_2 of the gate electrode layer 120_2 such that the second channel region C2_2 makes contact with the source regions 112_2. For example, the second channel region C2_2 may be formed on the semiconductor layer 105_2 among the protrusion part 107a_2 of the drift region 107_2 and the source regions 112_2. The second channel region C2_2 may be formed to cover surfaces of the well regions 110_2. Accordingly, the second channel region C2_2 may have a planar-type channel structure.

For example, the first channel region C1_2 and the second channel region C2_2 may have the first conductive type such that an accumulation channel is formed. For example, the first channel region C1_2 and the second channel region C2_2 may have a doping type opposite to a doping type of the well regions 110_2.

For example, the accumulation channel may be formed by implanting the first conductive type (N type) of impurities into a portion of the well regions 110_2 having the second conductive type (P type) of impurities. Impurities in the first conductive type (N type), which is opposite to the second conductive type, may be implanted into some of the well regions 110_2 having the second conductive type (P type) of impurities for complete counter doping. In this case, the counter doping may refer to a process of intentionally doping impurities to adjust the electrical characteristic when a semiconductor device is fabricated, and the impurities may be varied depending on the type of a semiconductor. A doping concentration of impurities of counter doping regions 113_2 may be equal to or different from that of the remaining portions of the source regions 112_2. According to an embodiment, the doping concentration of impurities of the counter doping regions 113_2 may be lower than that of the remaining portions of the source regions 112_2 or may be higher than that of the drift region 107_2. The density of electrons is increased in a region, in which the accumulation channel is formed, thereby lowering a channel resistance between the first channel region C1_2 and the second channel region C2_2.

In addition, the first channel region C1_2 and the second channel region C2_2 may have a doping type the same as doping types of the source region 112_2 and the drift region 107_2. In this case, the source region 112_2, the first channel region C1_2 or the second channel region C2_2, and the drift region 107_2 may have structure normally electrically connected to each other. However, in the structure of the semiconductor layer 105_2 including SiC, negative charges appear due to the trap present on the interface between the gate insulating layer 118_2 and an SiC interface. Accordingly, the bands of the first channel region C1_2 and the second channel region C2_2 are curved upward while forming a potential barrier. Accordingly, the movement of the current may be blocked.

Accordingly, according to the present embodiment, even if the source regions 112_2 are formed to make contact with the vertical part 107a_2 of the drift region 107_2, when the operating voltage is applied to the gate electrode layer 120_2, a channel may be formed to allow the flow of the current. In this case, an operating voltage (threshold voltage) to be applied to the gate electrode layer 120_2 to form channels in the first channel region C1_2 or the second channel region C2_2 may be considerably lower than an operating voltage to be applied to the gate electrode layer 120_2 to form a typical channel.

For example, the first channel region C1_2 and the second channel region C2_2 may be portions of the well regions 110_2. In more detail, the first channel region C1_2 may be a portion of the well regions 110_2, which are adjacent to a lower portion of the first part 120a_2 of the gate electrode layer 120_2. In more detail, the second channel region C2_2 may correspond to a portion of the well regions 110_2, which are adjacent to a lower portion of the second part 120b_2 of the gate electrode layer 120_2. In other words, the second channel region C2_2 may be formed in a region between the protrusion part 107a_2 of the drift region 107_2 and the source region 112_2.

In this case, the first channel region C1_2 and the second channel region C2_2 may be integrally formed with the well regions 110_2 or may be formed to be continuously connected to the well regions 110. A doping concentration of the first conductive type of impurities of the first channel region C1_2 and the second channel region C2_2 may be the same as that of the remaining portion of the drift region 107_2 or may be different from each other to adjust a threshold voltage.

The second channel region C2_2 and the source region 112_2 may be formed on opposite sidewall of the vertical part 107a_2 to be connected to each other. The vertical part 107a_2 of the drift region 107_2, the second channel region C2_2, and the source region 112_2, which are connected to each other, may be a moving path of a current when the power semiconductor device 100_2 operates.

According to an embodiment, three well regions 110_2, which are adjacent to each other, among the well regions 110_2 may have equal spacing. Further, three source regions 112_2, which are adjacent to each other, among the source regions 112_2 may have equal spacing. For example, centers of three adjacent well regions 110_2 may be respectively disposed at vertexes of a regular triangle, and centers of three adjacent source regions 112_2 on the well regions 110_2 may also be respectively disposed at the vertexes of the same regular triangle. For example, the well regions 110_2 and the source regions 112_2 may be understood as indicating three parts forming a triangle as illustrated in FIG. 30.

According to an embodiment, the centers of seven adjacent well regions 110_2 among the well regions 110_2 may be respectively disposed at the center and vertexes of a regular hexagon. In addition, the centers of seven source regions 112_2 present on the seven adjacent well regions 110_2 from among the source regions 112_2 may be respectively disposed at the center and vertexes of the regular hexagon. For example, FIGS. 29 to 33 may be understood as illustrating seven well regions 110_2 and seven source regions 112_2.

In this structure, the well regions 110_2 and the source regions 112_2 may be disposed in a hexagonal closed packed arrangement structure, which is similar to a planar arrangement structure. In addition, the well regions 110_2 may have equal spacing between two adjacent well regions 110_2, and the source regions 112_2 may have equal spacing between two adjacent source regions 112_2.

In this structure, the trenches 116_2 may be disposed to form portions of lines each linking two adjacent to each other from among the center and vertexes of the regular hexagon such that seven adjacent source regions 112_2 are connected. In more detail, in FIG. 30, the trenches 116_2 may include six lines liking six source regions 112_2 disposed at the vertexes with one source region 112_2 disposed at the center of the regular hexagon, and six lines each linking two adjacent source regions from among six source regions 112_2 which are disposed at the vertexes.

According to an embodiment, the well regions 110_2 may be a portion of a spherical shape. When viewed from a plane view of the well region 110_2, the cross-section of the well region 110_2 has a circular shape at a region including the source region 112_2 and the well contact region 114_2, and has a ring shape or a doughnut shape a region, which does not include the source region 112_2 and the well contact region 114_2. Further, the well contact regions 114_2 may be formed in the ring shape or the doughnut shape, when viewed from a plane view. For example, when viewed from a plan view, the well contact regions 114_2 having the ring shape may be formed in the well regions 110_2 having the ring shape, and the source regions 112_2 having the circular shape may be formed in the well contact region 114_2 having the ring shape. The well contact regions 114_2 may be connected to the well regions 110_2, when viewed from a bottom view. When viewed from the plan view, the source regions 112_2 may be formed in a doughnut shape to surround the well contact regions 114_2. The shape when viewed from the plan view may be formed to a specific depth from the surface of the semiconductor layer 105_2.

According to an embodiment, a portion, which is formed under bottom surfaces of the trenches 116_2, of the well regions 110_2, for example, the first channel region C1_2 formed in the well regions 110_2 in the vicinity of the bottom surfaces of the trenches 116_2, may be connected to the protrusion part 107a_2 under the relevant portion.

For another example, when the whole thickness of the well region 110_2 under the bottom surface of each trench 116_2 is thicker than the thickness of the first channel region C1_2, the first channel region C1_2 may not be connected to the drift region 107_2 formed under each trench 116_2. However, when each well region 110_2 has a spherical shape, since at least a lateral side of the trench 116_2 is exposed from the well region 110_2 and is surrounded by the protrusion part 107a_2 of the drift region 107_2, the first channel region C1_2 may be connected from the protrusion part 107a_2 of the drift region 107_2, which is provided on the lateral side of the trench 116 or on the sidewall of the first part 120a_2 of the gate electrode layer 120_2, to the source region 112_2.

Although the above description has been made in that the first conductive type and the second conductive type are opposite to each other and are an N type and a P type, respectively, the first conductive type and the second conductive type may be the P type and the N type In more detail, when the power semiconductor device 100_2 is an N-type MOSFET, the drift region 107_2 may be an N− region, the source region 112_2 and the drain region 102_2 may be N+ regions, the first channel region C1_2 and the second channel region C2_2 may adjust an N concentration through the counter doping, the well region 110_2 and the pillar region 108_2 may be P− regions, and the well contact region 114_2 may be a P+ region.

According to the power semiconductor device 100_2, a depth of the well regions 110_2 may be deeper than that of the trenches 116_2 and the gate electrode layer 120_2. Accordingly, corners, which are positioned on the bottom surface of the trench 116, of the first part 120a_2 of the gate electrode layer 120_2 may be surrounded by the well regions 110_2. Further, the bottom surface of the first part 120a_2 may be fully surrounded by the well regions 110_2. Such a structure may alleviate the concentration of the electric field on a partial corner portion of the bottom surface of the trench in the trench-type gate structure.

When the operating voltage is applied to the gate electrode layer 120_2, the electric field may be concentrated to the lower corner portions of the gate electrode layer 120_2. When the electric field is concentrated, the gate insulating layer 118_2 in the relevant region may receive severe stress, so dielectric breakdown of the gate insulating layer 118_2 may be caused. Therefore, according to the present embodiment, as lower portions, which are formed in the well region 110_2, of the gate electrode layer 120_2 may be surrounded by the well region 110_2 in the P type to achieve charge sharing, thereby preventing the dielectric breakdown of the gate insulating layer 118_2, as the electric field is concentrated on corner portions of the gate insulating layer 118_2.

When the power semiconductor device 100_2 operates, a current may mainly flow in a vertical direction from the drain region 102_2 along the drift region 107_2, and may then flow to the source region 112_2 through the first channel region C1_2 and the second channel region C2_2.

The power semiconductor device 100_2 may have a hybrid structure including both the trench-type gate structure and the planar-type gate structure. In addition, the power semiconductor device 100_2 may have a regular hexagon arrangement structure and may provide the high degree of integration with the high channel density by combining the trench-type gate structure and the planar-type gate structure. In addition, when compared to the case where only a planar-type structure is provided, the power semiconductor device 100_2 may maintain the degree of integration through the addition of the trench-type structure and may improve the channel mobility.

Meanwhile, since the power semiconductor device 100_2 is used for high-power switching, the power semiconductor device 100-2 requires a high withstand voltage characteristic. When a high voltage is applied to the drain region 102_2, a depletion region may be expanded from the semiconductor layer 105_2 adjacent to the drain region 102_2 such that a voltage barrier of a channel is lowered. This phenomenon is called "drain induced barrier lowering (DIBL)".

The DIBL may make the first channel region C1_2 and the second channel region C2_2 abnormally turned on, and furthermore, may cause a punch through phenomenon, in which a depletion region is expanded between the drain region 102_2 and the source region 112_2 such that the drain region 102_2 and the source region 112 make contact with each other.

However, the power semiconductor device 100_2 described above may secure an appropriate withstand voltage characteristic by reducing the resistance between the drift region 107_2, and the first channel region C1_2 and the second channel region C2_2, and by suppressing an abnormal current flow and the punch through phenomenon caused by the DIBL, by using the pillar region 108_2 forming the super junction together with the drift region 107_2. Accordingly, even if the thickness of the drift region 107_2 forming the body is reduced, the higher breakdown voltage may be maintained.

In addition, since the current flows through the vertical parts 107a_2 of the drift region 107_2 in the power semiconductor device 100_2, the moving path of the current is reduced to increase the resistance (JFET resistance). However, according to the present embodiment, in the power semiconductor device 100_2, the JFET resistance may be reduced by using the pillar region 108_2 forming the super junction together with the drift region 107_2. For example, a charge amount in the pillar region 108_2 and a charge amount in the drift region 107_2 are adjusted to reduce the JFET resistance.

When a charge amount of the pillar region 108_2 is greater than a charge amount of the drift region 107_2, and when the power semiconductor device 100_2 operates, a breakdown voltage may be increased by allowing the maximum electric field to be formed in the drift region 107_2 on the same line as the bottom surface of the pillar region 108_2. For example, the charge amount of the pillar region 108_2 may become greater than the charge amount of the drift region 107_2 by making a doping concentration of the second conductive type of impurities of the pillar region 108_2 higher than a doping concentration of the first conductive type of impurities of the drift region 107_2, thereby enhancing the withstand voltage characteristic of the power semiconductor device 100_2, such that the JFET resistance is reduced.

Figure 35:
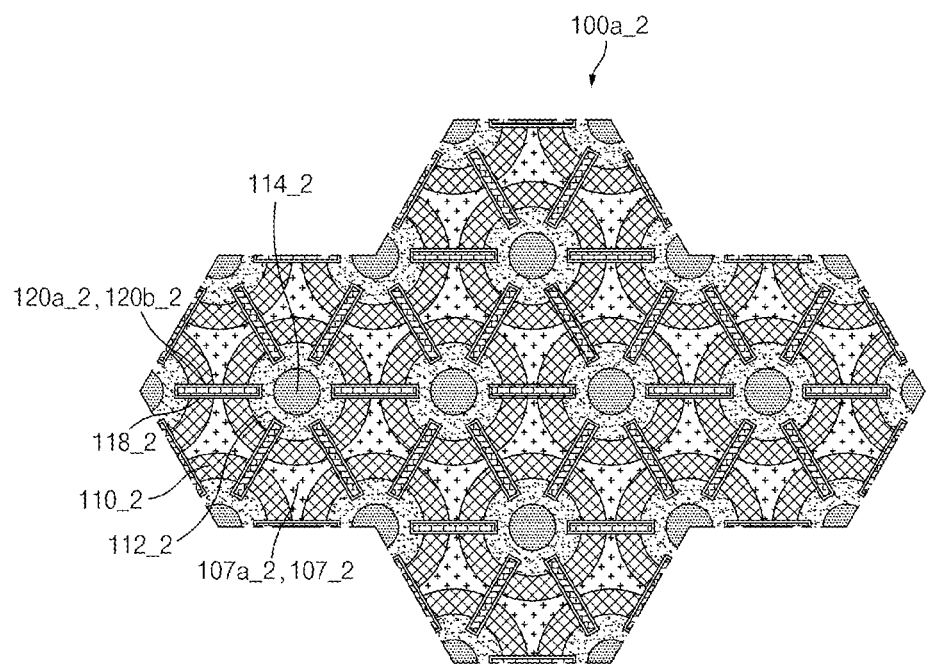
FIG. 35 is a perspective view schematically illustrating the structure of a power semiconductor device, according to an embodiment of the present disclosure.

FIG. 35 is a plan view (or a horizontal sectional view) illustrating a power semiconductor device 100a_2 according to another embodiment of the present disclosure.

Referring to FIG. 35, the power semiconductor device 100a_2 shows a portion of a structure, in which a plurality of power semiconductor devices 100_2 in FIGS. 29 to 34 are arranged, and the same reference numerals of the components of power semiconductor devices 100_2 will be assigned to components of the power semiconductor device 100a_2. Accordingly, the duplication thereof will be omitted.

As the power semiconductor device 100a_2 is formed by repeating a hexagonal closed packed arrangement structure illustrated in FIGS. 29 to 34, the power semiconductor device 100a_2 may have the degree of higher integration.

Figure 36:
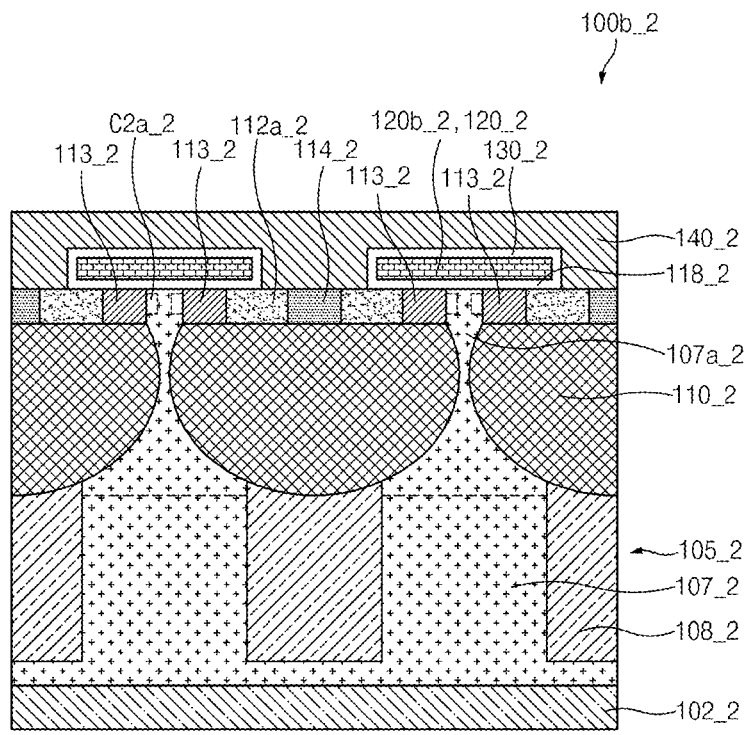
FIGS. 36 and 37 are cross-sectional views schematically illustrating the structure of a power semiconductor device, according to still another embodiment of the present disclosure.
Figure 37:
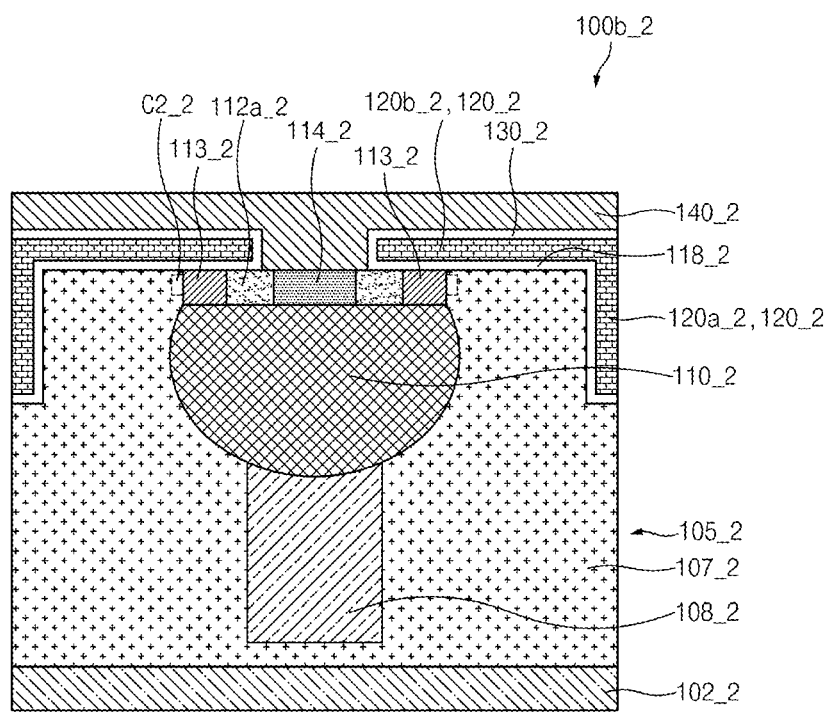

FIGS. 36 and 37 are cross-sectional views illustrating a power semiconductor device 100b_2 according to another embodiment of the present disclosure. The power semiconductor device 100b_2 may be implemented by modifying a partial configuration of the power semiconductor device 100_2 of FIGS. 29 to 34, and the description of the power semiconductor device 100b_2 and the description of the power semiconductor device 100_2 make references to each other. Accordingly, the duplicated descriptions will be omitted.

Referring to FIGS. 36 and 37, in the power semiconductor device 100b_2, a second channel region C2a_2 may be formed in a semiconductor layer 105_2 between the drift region 107_2 and the source region 112_2. For example, the second channel region C2a_2 may be formed in the semiconductor layer 105_2 between the protrusion part 107a_2 of the drift region 107_2 and the source region 112a_2. The second channel region C2a_2 may include the first conductive type of impurities to form an accumulation channel. The accumulation channel may refer to that holes are accumulated in the well region having the P type which is the second conductive type.

However, in an embodiment of the present disclosure, since the counter doping region 113_2 is formed, as electrons forming the inversion channel are previously counter-doped, the term of the "accumulation channel" is used. In this embodiment, the counter doping regions 113_2 may be separated and formed from the remaining portions of the source regions 112_2. A doping concentration of impurities of counter doping regions 113_2 may be equal to or different from that of the remaining portions of the source regions 112_2. According to an embodiment, the doping concentration of impurities of the counter doping regions 113_2 may be lower than that of the remaining portions of the source regions 112_2 or may be higher than that of the drift region 107_2.

In an embodiment of the present disclosure, the previously-counter doped region may be defined as the counter doping region 113_2 to form a channel in a portion of the source region 112a_2. For example, the second channel region C2a_2 may have the doping type the same as the doping types of the source region 112a_2 and the drift region 107_2. In this case, the source region 112_2, the second channel region C2a_2, and the drift region 107_2 may have structure normally electrically connected to each other. However, the semiconductor layer 105_2 including SiC has negative charges, as a trap is present in the interface with the gate insulating layer. Accordingly, the band of the second channel region C2a_2 is curved upward to form a potential barrier, thereby increasing the threshold voltage. Accordingly, the channel is formed through counter doping region 113_2 which is previously counter doped, to decrease the threshold voltage to be lower than the threshold voltage to be applied to the gate electrode layer 120_2 to form the typical inversion channel.

According to an embodiment, the second channel region C2a_2 may be a portion of the drift region 107_2. In more detail, the second channel region C2a_2 may be a portion of the protrusion portion 107a_2 of the drift region 107_2. For example, the second channel region C2a_2 may be integrally formed with the drift region 107_2. Accordingly, in the power semiconductor device 100b_2, the source regions 112a_2 may directly make contact with the drift region 107_2 (for example, the protrusion part 107a_2 of the drift region 107_2), and the second channel region C2a_2 may be defined in a portion of the drift region 107_2 by the contact portion.

A doping concentration of the first conductive type of impurities of the second channel region C2a_2 may be the same as that of the remaining portion of the drift region 107_2 or may be different from each other to adjust a threshold voltage.

According to an embodiment, the well region 110_2 may be formed under the source regions 112a_2 to further protrude toward the protrusion part 107a_2 of the drift region 107_2, as compared to the source regions 112a_2. In this case, the second channel region C2a_2 may be formed on a protruding portion of the well region 110_2 in the semiconductor layer 105_2. For example, the protrusion part 107a_2 of the drift region 107_2 may further extend into a groove portion between the well region 110_2, and the second part 120b_2 of the gate electrode layer 120_2, and the second channel region C2a_2 may be formed at the extending protruding part. The above structure may define the second channel region C2a_2 between the second part 120b_2 of the gate electrode layer 120_2 and the well region 110_2.

In the power semiconductor device 100b_2, the first channel region C1_2 may be provided as an accumulation channel, which is similar to the power semiconductor device 100_2 of FIGS. 29 to 34.

Figure 38:
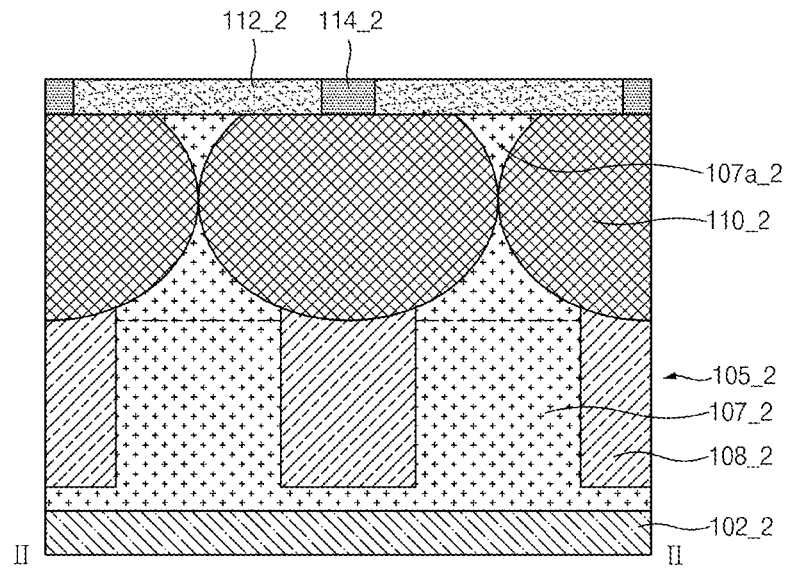
FIGS. 38 to 40 are cross-sectional views schematically illustrating a method for fabricating the power semiconductor device of FIG. 1.
Figure 39:
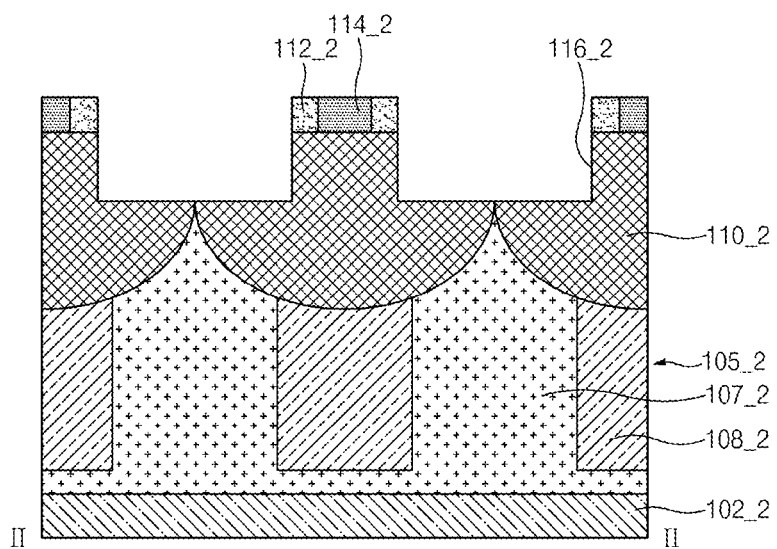
Figure 40:
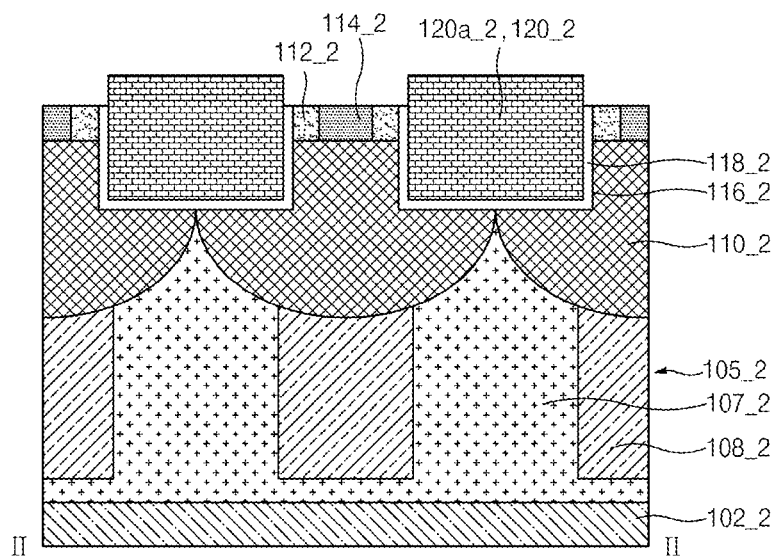
Figure 41:
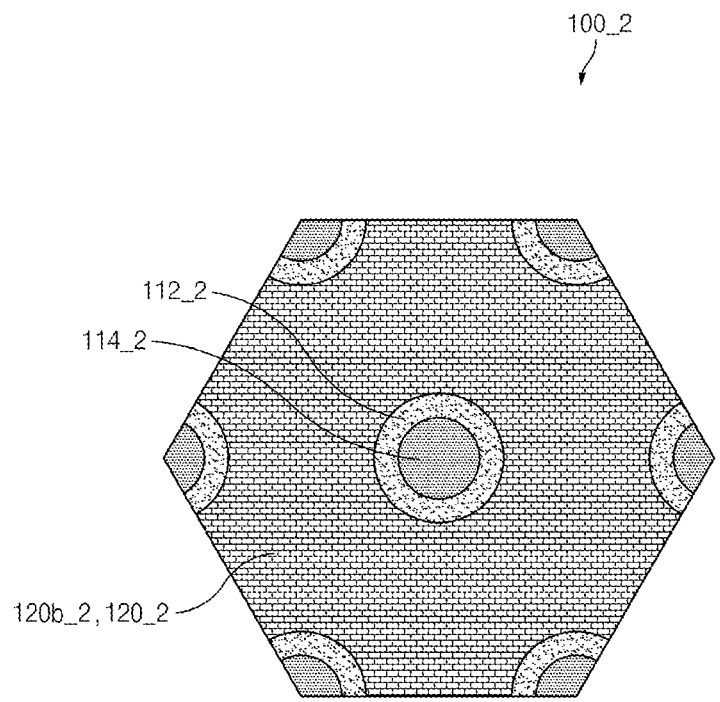
FIG. 41 is a plan view schematically illustrating the structure of the power semiconductor device of FIG. 40.

FIGS. 38 to 40, and 42 are cross-sectional views illustrating a method for fabricating the power semiconductor device 100_2, according to an embodiment of the present disclosure, and FIG. 41 is a plan view (a longitudinal-sectional view) of FIG. 40.

Referring to FIG. 38, the drift region 107_2 having the first conductive type may be formed in the semiconductor layer 105_2 including silicon carbide (SiC) to provide a vertical moving path of a charge. For example, the drift region 107_2 may be formed on the drain region 102_2 having the first conductive type. According to an embodiment, the drain region 102_2 may be provided in the form of a substrate having the first conductive type, and the drift region 107_2 may include one or more epitaxial layers formed on the substrate.

Next, the well regions 110_2 having the second conductive type may be formed in the semiconductor layer 105_2 to make contact with the drift region 107_2. Adjacent well regions 110_2 of the well regions 110_2 may be formed to at least partially make contact with each other. In addition, the forming of the well regions 110_2 may be performed by implanting the second conductive type of impurities into the semiconductor layer 105_2. The well regions 110_2 may be actually formed to a specific depth from the surface of the semiconductor layer 105_2.

For example, the well regions 110_2 may be formed in the semiconductor layer 105_2, such that the drift region 107_2 includes the protrusion parts 107a_2, at least portions of which are surrounded by the well regions 110_2. In more detail, the well regions 110_2 may be formed by doping impurities in a conductive type opposite to that of the drift region 107_2 into the drift region 107_2.

The pillar region 108_2 may be formed in the semiconductor layer 105_2 under the well region 110_2 such that the pillar region 108_2 makes contact with the well region 110_2. The pillar region 108_2 may have the second conductive type to form a super junction together with the drift region 107_2. For example, the pillar region 108_2 may be formed by implanting the second conductive type of impurities into the drift region 107_2.

The source regions 112_2 having the first conductive type may be formed in the semiconductor layer 105_2 in the well regions 110_2 or on the well regions 110_2. For example, the forming of the source regions 112_2 may be performed by implanting the first conductive type of impurities into the well regions 110_2 and the drift region 107_2. The source regions 112_2 may be actually formed at a specific depth of the well region 110_2 from the surface of the semiconductor layer 105_2.

In addition, the well contact regions 114_2 having the second conductive type may be formed in the source regions 112_2 or on the well regions 110_2. For example, the well contact regions 114_2 may be formed by implanting the second conductive type of impurities into the well regions 110_2 or into the source regions 112_2 at a high concentration. For example, the well contact regions 114_2 may be formed to have a circular shape when viewed in a plan view.

According to an embodiment, the well regions 110_2 may be formed to make contact with the drift region 107_2, such that the drift region 107_2 is connected to the surface of the semiconductor layer 107_2 while extending to pass through a space between the well regions 110_2 from the lower portions of the well regions 110_2.

According to a modification of the present embodiment, the sequence of doping impurities into the well regions 110_2, the pillar region 108_2, the well contact regions 114_2, and the source regions 112_2 may be arbitrarily changed.

In the above fabricating method, the impurity implantation or the impurity doping may be performed such that the impurities are mixed, when the impurities are ion-implanted into the semiconductor layer 105_2 or when an epitaxial layer is formed. However, an ion implantation manner using a mask pattern may be used to implant impurities into a selective region.

Alternatively, a heat treatment process for activating or diffusing the impurities may be performed after the ion implantation.

Referring to FIG. 39, the plurality of trenches 116_2 may be formed to be recessed by a specific depth into the semiconductor layer 105_2 from the surface of the semiconductor layer 105_2.

For example, the trenches 116_2 may be formed to penetrate portions of the source regions 112_2 and to be recessed to a specific depth of the well regions 110_2 and the protrusions 107a_2 of the drift region 107_2. In more detail, each of the trenches 116_2 may be formed to be recessed from the surface of the semiconductor layer 105_2 into the semiconductor layer 105_2, to connect two source regions 110_2, which are disposed at opposite sides of the trench 116_2, of the source regions 112_2 to each other, while extending by passing through the contact portion between adjacent well regions 110_2 of the well regions 110_2.

For example, the trenches 116_2 may be formed by forming a photo mask through a photo lithography process and then by etching the semiconductor layer 105_2 using the photo mask as an etching protective layer.

Referring to FIGS. 40 and 41, the gate insulating layer 118_2 may be formed on the inner walls of the trenches 116_2 and the surface of the semiconductor layer 105_2. For example, the gate insulating layer 118_2 may be formed by oxidizing the semiconductor layer 105_2 to form an oxide or by depositing an insulating material, such as an oxide or a nitride, on the semiconductor layer 105_2.

For example, the first part 120a_2, which is filled in the trench 116_2, and the second part 120b_2 formed on the surface of the semiconductor layer 105_2 may be formed on the gate insulating layer 118_2 to form gate electrode layers 120_2. In this case, the gate electrode layer 120_2 may not be formed in the well contact region 114_2 and in a partial region of the source regions 112_2 adjacent to the well contact region 114_2. For example, the gate electrode layer 120_2 may be formed after forming a conductive layer on the gate insulating layer 118_2 and patterning the conductive layer. The gate electrode layer 120_2 may be formed by doping impurities in polysilicon or may be formed to include a conductive metal or metal silicide.

The patterning process may be performed through photo lithography and etching processes. The photo lithography process may include a process of forming a photoresist pattern as a mask layer through a photo process and a developing process, and the etching process may include a process of selectively etching an underlying structure by using the photoresist pattern.

Figure 42:
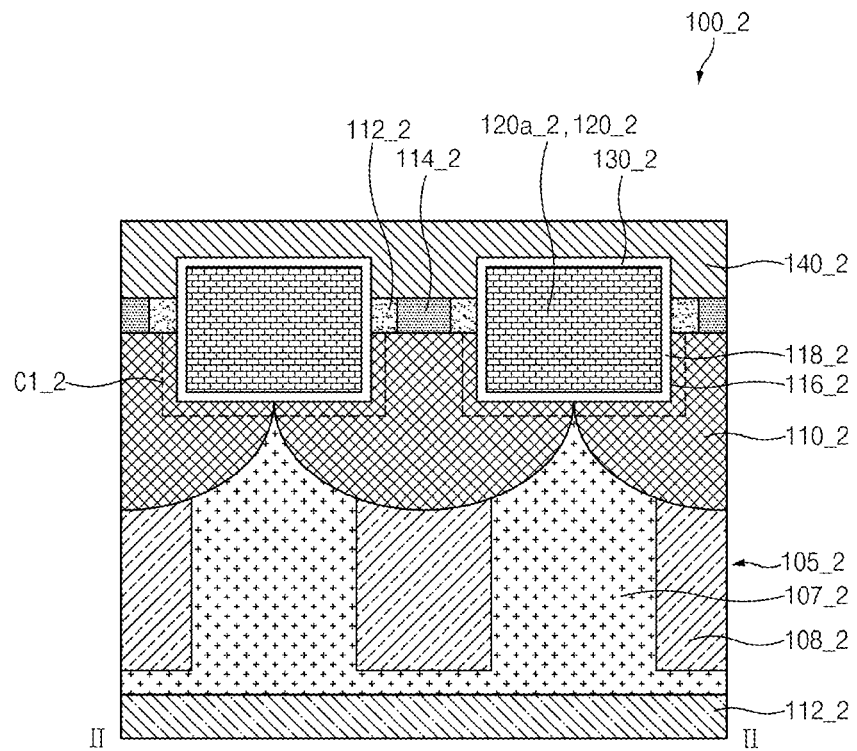
FIG. 42 is a cross-sectional view schematically illustrating a method for fabricating a power semiconductor device after the processes of FIG. 40.

Referring to FIG. 42, the interlayer insulating layer 130_2 may be formed on the gate electrode layer 120_2.

Subsequently, the source electrode layer 140_2 may be formed on the interlayer insulating layer 130_2. In addition, the source electrode layer 140_2 may be electrically connected to the source regions 112_2 and the well contact regions 114_2. For example, the source electrode layer 140_2 may be formed by forming a conductive layer, for example, a metal layer on the interlayer insulating layer 130_2 and patterning the conductive layer.

According to the fabricating method described above, the MOSFET structure having the hexagonal closed packed arrangement in the semiconductor layer 105_2 may be economically formed.

Figure 43:
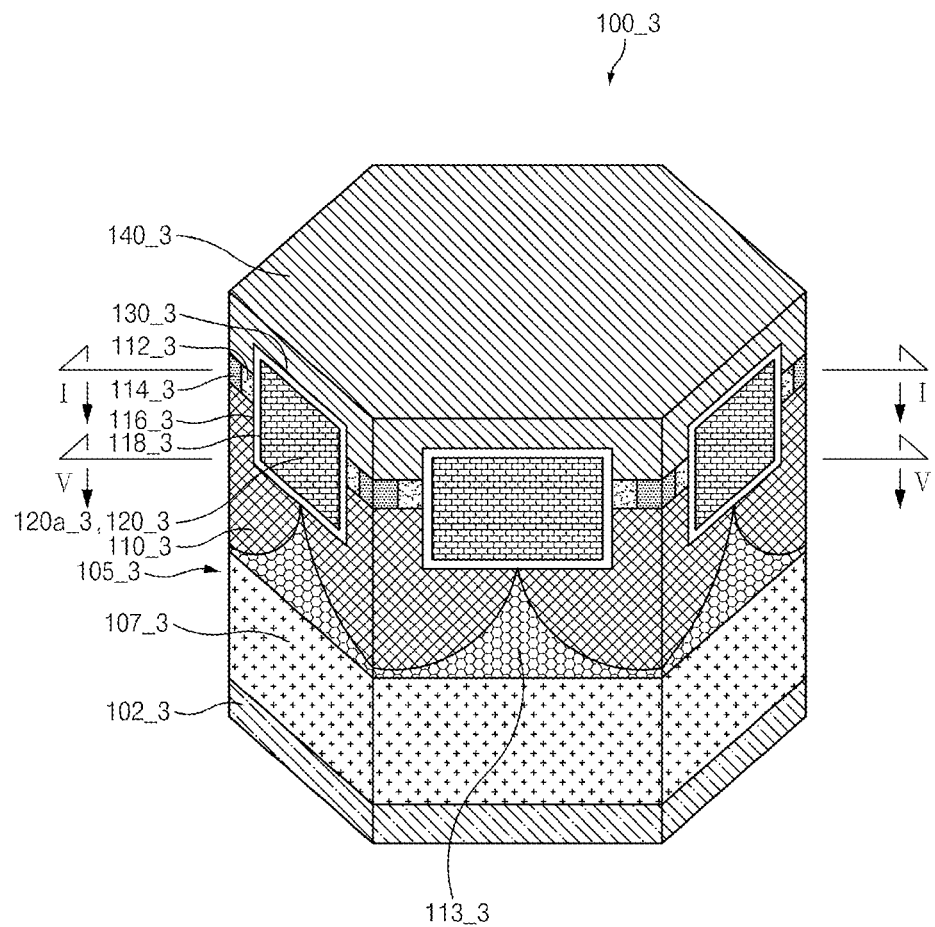
FIG. 43 is a perspective view schematically illustrating the structure of a power semiconductor device, according to an embodiment of the present disclosure.
Figure 44:
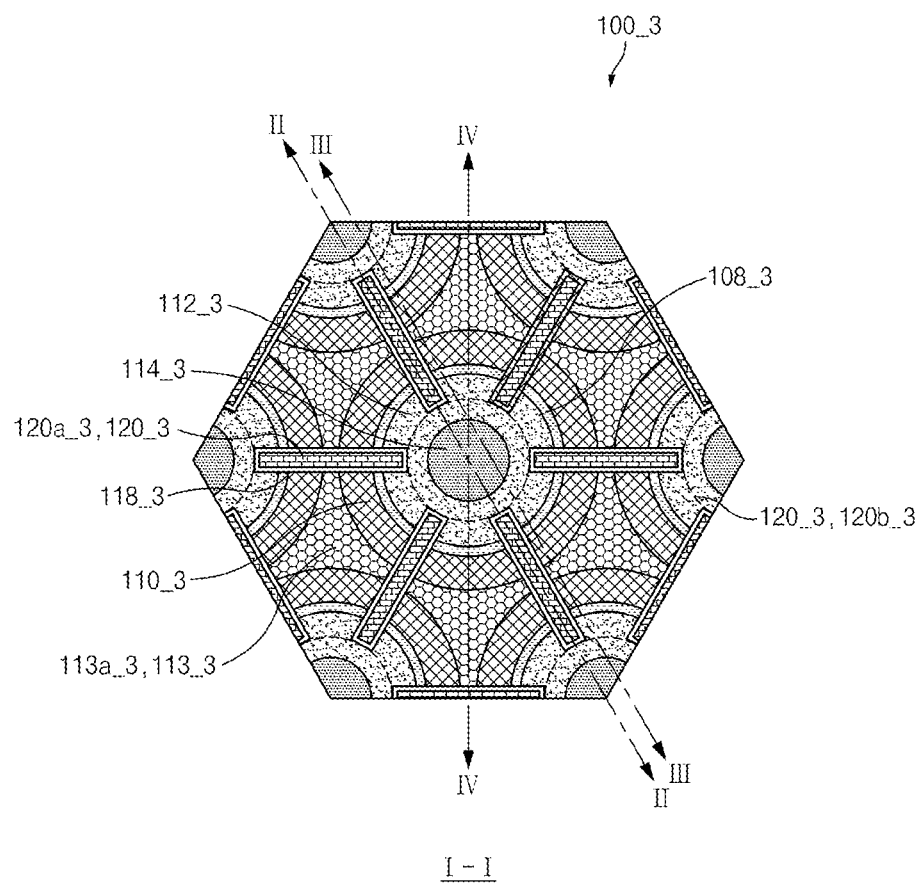
FIG. 44 is a plan view illustrating the structure taken along line I-I of FIG. 43.
Figure 45:
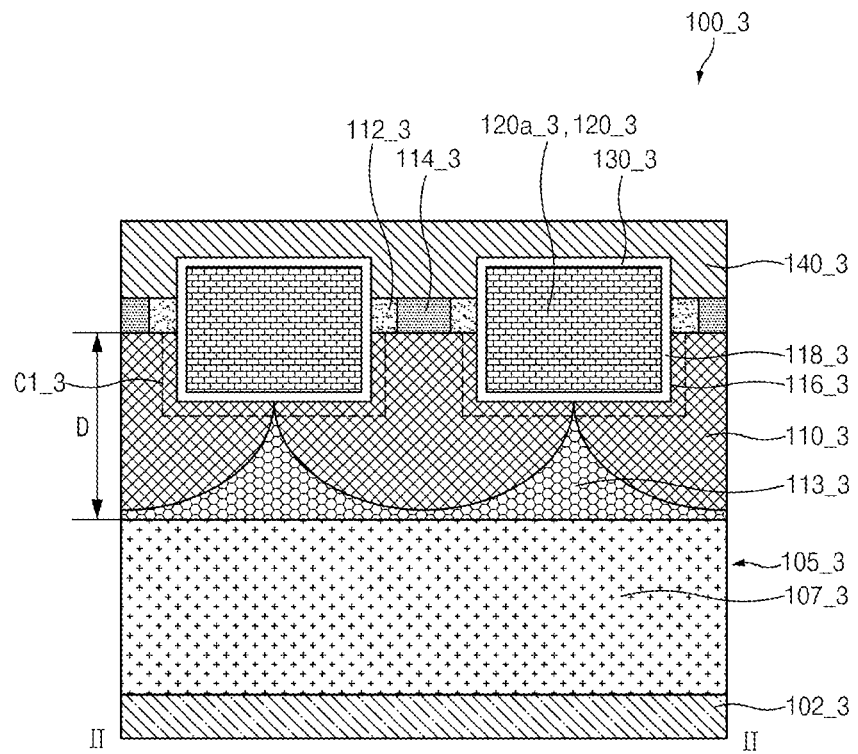
FIG. 45 is a cross-sectional view illustrating the structure taken along line II-II of FIG. 44.
Figure 46:
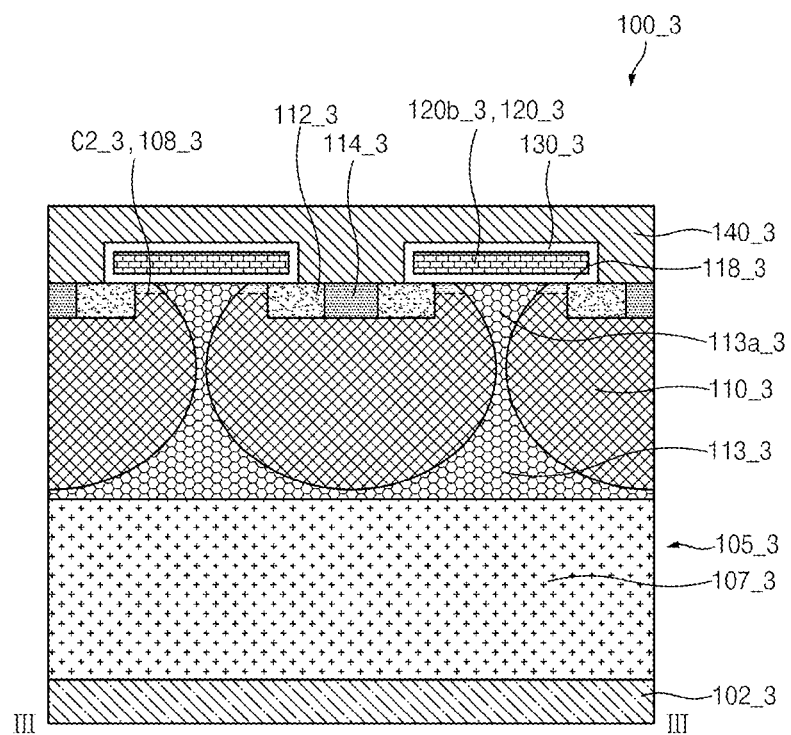
FIG. 46 is a cross-sectional view illustrating the structure taken along line III-III of FIG. 44.
Figure 47:
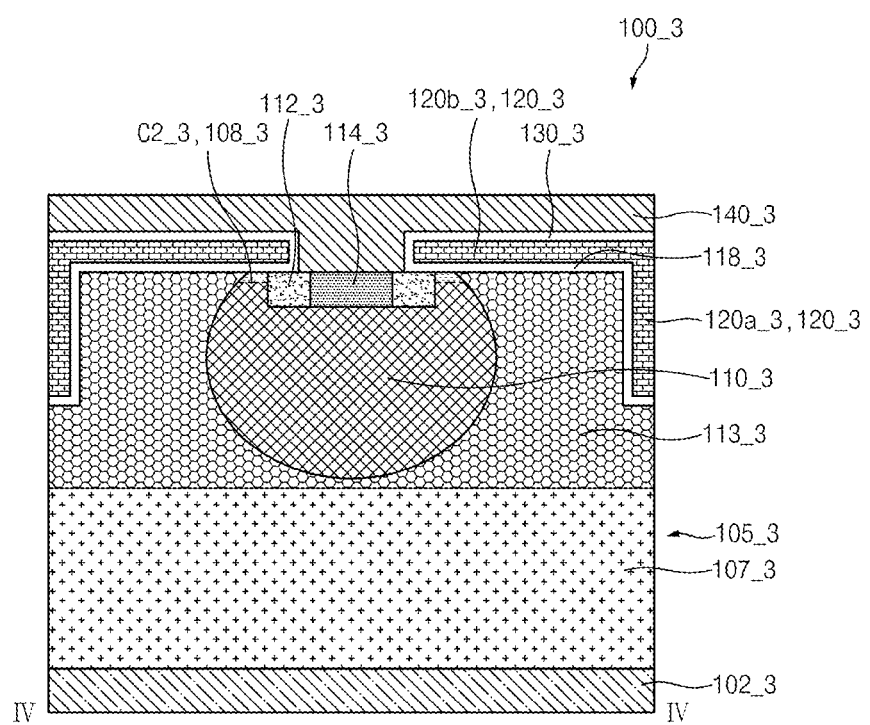
FIG. 47 is a cross-sectional view illustrating the structure taken along line IV-IV of FIG. 44.
Figure 48:
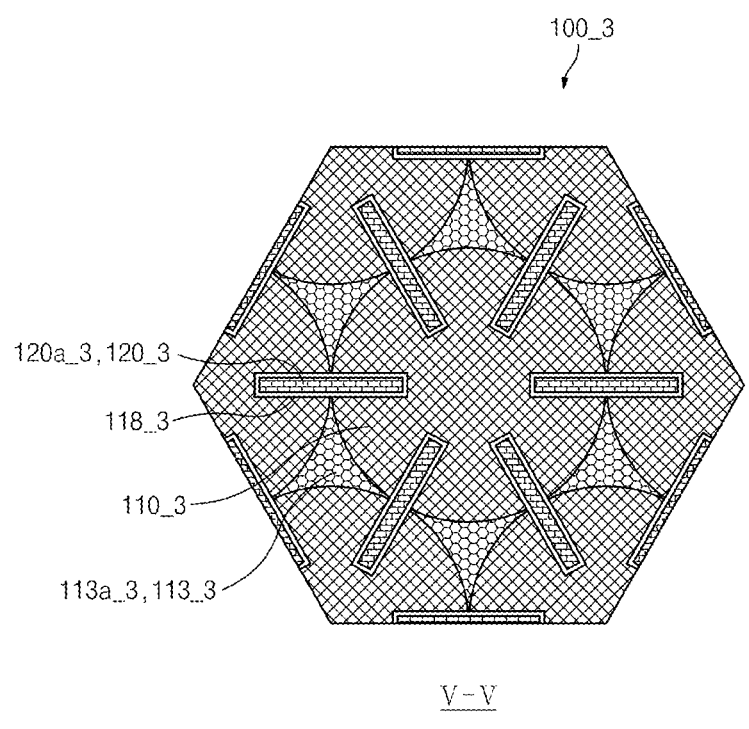
FIG. 48 is a plan view illustrating the structure taken along line V-V of FIG. 43.

FIG. 43 is a perspective view schematically illustrating the structure of a power semiconductor device, according to an embodiment of the present disclosure, and FIG. 44 is a plan view (horizontal sectional view) illustrating the structure taken along line I-I of FIG. 43. FIG. 45 is a cross-sectional view illustrating the structure taken along line II-II of FIG. 44, FIG. 46 is a cross-sectional view illustrating the structure taken along line III-III of FIG. 44, FIG. 47 is a cross-sectional view illustrating the structure taken along line IV-IT of FIG. 44, and FIG. 48 is a plan view (horizontal sectional view) illustrating the structure taken along line V-V of FIG. 43.

Referring to FIGS. 43 to 48, a power semiconductor device 100_3 may at least include a semiconductor layer 105_3, a gate insulating layer 118_3, a gate electrode layer 120_3, and a plurality of interlayer insulating layer 130_3, and a source electrode layer 140_3. For example, the power semiconductor device 100_3 may have a power MOSFET structure.

The semiconductor layer 105_3 may include a single semiconductor material layer or a plurality of semiconductor material layers. For example, the semiconductor layer 105_3 may include a single epitaxial layer or multiple epitaxial layers. Alternatively, the semiconductor layer 105_3 may include a single epitaxial layer or multiple epitaxial layers formed on a semiconductor substrate. For example, the semiconductor layer 105_3 may include silicon carbide (SiC). Alternatively, the semiconductor layer 105_3 may include at least one SiC-epitaxial layer.

As silicon carbide (SiC) has a bandgap higher than a bandgap of silicon (Si), silicon carbide (SiC) may maintain stability even at a higher temperature, as compared to silicon (Si). Further, silicon carbide (SiC) exhibits a dielectric breakdown field remarkably higher than that of silicon (Si). Accordingly, silicon carbide (SiC) may stably work even at a higher voltage. Accordingly, the power semiconductor device 100_3 having the semiconductor layer 105_3 including silicon carbide (SiC) may exhibit a more excellent heat dissipation characteristic with a higher breakdown voltage, and may exhibit a stabler operating characteristic at a higher temperature, when compared to silicon (Si)

In more detail, the semiconductor layer 105_3 may include a drain region 102_3, a first drift region 107_3, counter doping regions 108_3, a plurality of well regions 110_3, a plurality of source regions 112_3, a second drift region 113_3, a plurality of well contact regions 114_3, and a plurality of trenches 116_3.

In this case, the drift region 107_3 may be formed in a first conductive type (for example, the N type) and may be formed by implanting the first conductive type of impurities into a portion of the semiconductor layer 105_3. For example, the drift region 107_3 may be formed by implanting the first conductive type of impurities into the SiC epitaxial layer. The drift region 107_3 may provide a moving path of charges, when the power semiconductor device 100_3 operates.

The well regions 110_3 may be formed in the semiconductor layer 105_3 and may have the second conductive type of impurities. For example, the well regions 110_3 may be formed in the semiconductor layer 105_3 to make contact with at least a portion of the second drift region 113_3. According to an embodiment, the well region 110_3 may be formed by implanting impurities in the second conductive type (for example, the P type), which is opposite to the first conductive type, into the semiconductor layer 105_3 or the second drift region 113_3.

In addition, the second drift region 113_3 may be formed in the first conductive type (for example, the N type) and may be formed by implanting the first conductive type of impurities into an entire surface of an upper portion of the first drift region 107_3. The second drift region 113_3 may be formed in the semiconductor layer 105_3 under the well region 110_3 such that the second drift region 113_3 is connected to the well region 110_3. The second drift region 113_3 may be formed to make contact with an upper portion of the first drift region 107_3, a lateral side of the well region 110_3, and a lower portion of the well region 110_3. For example, the second drift region 113_3 may be disposed under the well region 110_3 such that a top surface and a lateral side of the second drift region 113_3 make contact with the well region 110_3, and a bottom surface of the second drift region 113_3 make contact with the first drift region 107_3, respectively. The second drift region 113_3 may provide a moving path of charges, when the power semiconductor device 100_3 operates.

The second drift region 113_3 may be formed in the semiconductor layer 105_3 to have the same conductive type as that of the first drift region 107_3. For example, the second drift region 113_3 may include impurities in the first conductive type which is the type the same as the type of the first drift region 107_3 and opposite to the type of the well region 110_3, and the doping concentration of the first conductive type of impurities of the second drift region 113_3 may be adjusted. For example, the doping concentration of the first conductive type of impurities of the second drift region 113_3 may be equal to or lighter than the doping concentration of the first conductive type of impurities of the first drift region 107_3, but the present disclosure is not limited thereto.

According to an embodiment of the present disclosure, as illustrated in the drawing, the bottom surface of the second drift region 113_3 may be spaced apart from the bottom surface of the well region 110_3 by a specific distance, instead of making contact with the bottom surface of the well region 110_3. However, the embodiment of the present disclosure is not limited thereto. For example, the second drift region 113_3 may make contact with the bottom surface of the well region 110_3. In other words, as illustrated in FIG. 45, the depth 'D' of the second drift region 113_3 interposed between the surface of the semiconductor layer 105_3 and the first drift region 107_3 may be sufficiently changed.

Source regions 112_3 may be formed in the well regions 110_3, respectively, and may be formed in the first conductive type. For example, the source regions 112_3 may be formed by implanting the first conductive type of impurities into the semiconductor layer 105_3 or the well region 110_3. The source regions 112_3 may be formed by implanting the first conductive type of impurities having a concentration higher than the concentration of the first conductive type of impurities of the first drift region 107_3.

A plurality of well contact regions 114_3 may be formed in the source regions 112_3 and on the well regions 110_3. For example, the plurality of well contact regions 114_3 may be formed on the well regions 110_3 to be connected to the well regions 110_3 through the source regions 112_3. The well contact region 114_3 may include the second conductive type of impurities.

The well contact regions 114_3 may be connected to the source electrode layer 140_3. The well contact region 114_3 may be doped with the second conductive type of impurities at a higher concentration. According to an embodiment, the well contact regions 114_3 may be doped with the second conductive of impurities having a doping concentration higher than a doping concentration of the second conductive type of impurities of the well regions 110_3. For example, the well contact region 114_3 may be a P+ region.

According to an embodiment, the well contact regions 114_3 may be formed in a recess groove making contact with the well regions 110_3. In this case, the source electrode layer 140_3 may be formed to be filled in the recess groove and to be connected to the well contact region 114_3.

In addition, the drain region 102_3 may be formed in the semiconductor layer 105_3 under the first drift region 107_3 and may include the first conductive type of impurities. For example, the drain region 102_3 may include the first conductive type of impurities implanted at a doping concentration higher than the concentration of the first conductive type of impurities of the first drift region 107_3.

According to an embodiment, the drain region 102_3 may be provided as a SiC-substrate in the first conductive type. In this case, the drain region 102_3 may be formed as a portion of the semiconductor layer 105_3 or as a substrate separate from the semiconductor layer 105_3. In addition, the first drift region 107_3 may include at least one epitaxial layer formed on the drain region 102_3.

According to an embodiment, the well regions 110_3 may be formed in the semiconductor layer 105_3 such that two adjacent well regions of the well regions 110_3 at least partially contact each other. Two adjacent well regions 110_3 may make contact with each other at the center of the bottom surface of the trench 116_3. In addition, each of the well regions 110_3 may have a shape in which the width of the well region 110_3 is increased inwardly from the surface of the semiconductor layer 105_3 and then decreased. In detail, two adjacent well regions of the well regions 110_3 may make contact with each other, as illustrated in FIG. 48, at portions showing at least the largest width and may be spaced from each other on the surface of the semiconductor layer 105_3 as illustrated in FIG. 44.

According to an embodiment, the second drift region 113_3 may be formed in the semiconductor layer 105_3 such that the second drift region 113_3 is connected to the surface of the semiconductor layer 105_3 while extending to pass through a space between the well regions 110_3 from the lower portions of the well regions 110_3. For example, the second drift region 113_3 may include a protrusion part 113a_3 extending to the surface of the semiconductor layer 105_3 while passing through a space between the well regions 110_3. In this case, the protrusion part 113a_3 may represent a region corresponding to the depth which is formed from the lowermost end portion of the well region 110_3 to the surface of the semiconductor layer 105_3, as illustrated in FIG. 44. In other words, the protrusion parts 113a_3 may correspond to regions positioned to make contact with the lateral side of the well regions 110_3.

A plurality of trenches 116_3 may be formed to be recessed by a specific depth inwardly from the surface (top surface) of the semiconductor layer 105_3. For example, each of the trenches 116_3 may be formed to connect two source regions 112_3, which are disposed at opposite sides of the trench 116_3, of the source regions 112_3, while extending by passing through the contact portion between adjacent well regions 110_3 of the well regions 110_3. In more detail, each trench 116_3 may be formed in the type of a line linking one source region 112_3 to an adjacent source region 112_3 while passing through one well region 110_3 surrounding the source region 112_3, the protrusion part 113a_3 of the second drift region 113_3, and an adjacent well region 110_3.

For example, the trenches 116_3 may be formed to penetrate portions of the source regions 112_3 and to be recessed to a specific depth of the well regions 110_3 and the protrusions 113a_3 of the second drift region 113_3. Accordingly, at least opposite corners of each trench 116_3 may be surrounded by the well regions 110_3. In addition, when viewed from the cross section of the trench 116_3 taken along an extending direction thereof, a bottom surface of the trench 116_3 may be fully surrounded by the well regions 110_3. For example, adjacent well regions 110_3 of the well regions 110_3 may be formed to make contact with each other on the bottom surface of each trench 116_3 or in the vicinity of the bottom surface of each trench 116_3. Accordingly, opposite sides the bottom surface of the trench 116 may be surrounded by the well regions 110_3 on a line provided in a direction in which the trench 116_3 extends.

The gate insulating layer 118_3 may be formed on inner walls of the trenches 116_3 and at least a portion of the semiconductor layer 105_3. For example, the gate insulating layer 118_3 may be formed on the inner surfaces of the trench 116_3 and on the surface of the semiconductor layer 105_3. The thickness of the gate insulating layer 118_3 may be uniform, or portions, which are formed on the bottom surface and a corner of the trench 116_3, of the gate insulating layer 118_3 may have thicknesses thicker than the thickness of a portion, which is formed on a sidewall of the trench 116_3, of the gate insulating layer 118, such that an electric field concentrated on the corner of the trench 116_3 is lowered.

For example, the gate insulating layer 118_3 may include an insulating material, such as a silicon oxide, a silicon carbide oxide, a silicon nitride, a hafnium oxide, a zirconium oxide, or an aluminum oxide, or may include a stack structure thereof.

A gate electrode layer 120_3 may be formed on the gate insulating layer 118_3. For example, the gate electrode layer 120_3 may include a first part 120a_3, which is filled in the trench 116_3, and a second part 120b_3 formed on the surface of the semiconductor layer 105_3. For example, the first part 120a_3 of the gate electrode layer 120_3 may have a trench-type gate structure, and the second part 120b_3 may have a planar-type gate structure. Accordingly, the gate electrode layer 120_3 may have a hybrid-type structure including both the trench-type gate structure and the planar-type gate structure.

For example, the second part 120b_3 of the gate electrode layer 120_3 may be formed on the protrusion parts 113a_3 of the second drift region 113_3 and the well regions 110_3. In more detail, the second part 120b_3 of the gate electrode layer 120_3 may be formed on the protrusion parts 113a_3 of the second drift region 113_3, which are exposed onto the surface of the semiconductor layer 105_3, on the surfaces of the well regions 110_3, and on the surface of a portion of an edge of the source regions. The well contact regions 114_3 and remaining portions of the source regions 112_3 may be disposed outside the gate electrode layer 120_3 and may be exposed from the gate electrode layer 120_3.

At least corner portions of the bottom surface of the first part 120a_3 of the gate electrode layer 120_3 may be surrounded by the well regions 110_3. In addition, when viewed from the cross section of the first part 120a_3 taken along an extending direction of the first part 120a_3, the bottom surface of the first part 120a_3 may be surrounded by the well regions 110_3. For example, portions, which surround the bottom surface of the first part 120a_3, of the well regions 110_3 may be the thinnest portions at the center of the bottom surface of the first part 120a_3, and may gradually become thicker toward the corner portions of the first part 120a.

For example, the gate electrode layer 120_3 may include a conductive material, such as polysilicon, metal, a metal nitride, or a metal silicide, or may include a stack structure thereof.

The interlayer insulating layer 130_3 may be formed on the gate electrode layer 120_3. For example, the interlayer insulating layer 130_3 may include an insulating material, such as an oxide layer, a nitride layer, or the stack structure thereof, for electrical insulation between the gate electrode layer 120_3 and the source electrode layer 140_3.

A source electrode layer 140_3 may be formed on the interlayer insulating layer 130_3. The source electrode layer 140_3 may be commonly connected to the source region 112_3 and the well contact region 114_3. In addition, the source electrode layer 140_3 may be electrically connected to the source regions 112_3 and the well contact regions 114_3. For example, the source electrode layer 140_3 may be connected to the source regions 112_3 and the well contact regions 114_3 through a portion thereof exposed by the gate electrode layer 120_3 and may be disposed to additionally extend along a top surface of the gate electrode layer 120_3. For example, the source electrode layer 140_3 may include a conductive material such as metal.

A first channel region C1_3 may be formed in the semiconductor layer 105_3 along the trench 116_3 to correspond to the first part 120a_3 of the gate electrode layer 120_3, such that the first channel region C1_3 is connected to the source regions 112_3 and the second drift region 113_3. For example, the first channel region C1_3 may be formed in the semiconductor layer 105_3 along sidewalls of the trench 116_3 to connect the second drift region 113_3 (that is, the protrusion part 113a_3 of the second drift region 113_3), which is positioned under the trench 116_3 or on a lateral side of the trench 116_3, and source regions 112_3, which make contact with the trench 116_3, to each other Accordingly, the first channel region C1_3 may have a trench-type channel structure.

A second channel region C2_3 may be formed in the semiconductor layer 105_3 under the second part 120b_3 of the gate electrode layer 120_3 such that the second channel region C2_3 makes contact with the source regions 112_3. For example, the second channel region C2_3 may be formed on the semiconductor layer 105_3 among the protrusion 113a_3 of the second drift region 113_3 and the source regions 112_3. The second channel region C2_3 may be formed to cover surfaces of the well regions 110_3. Accordingly, the second channel region C2_3 may have a planar-type channel structure.

For example, the first channel region C1_3 and the second channel region C2_3 may have the first conductive type such that an accumulation channel is formed. For example, the first channel region C1_3 and the second channel region C2_3 may have a doping type opposite to a doping type of the well regions 110_3.

For example, the accumulation channel may be formed by implanting the first conductive type (N type) of impurities into a portion of the well regions 110_3 having the second conductive type (P type) of impurities. Impurities in the first conductive type (N type), which is opposite to the second conductive type, may be implanted into some of the well regions 110_3 having the second conductive type (P type) of impurities for complete counter doping. In this case, the counter doping may refer to a process of intentionally doping impurities to adjust the electrical characteristic, when a semiconductor device is fabricated, and the impurities may be varied depending on the type of a semiconductor. A doping concentration of impurities of counter doping regions 108_3 may be equal to or different from that of the remaining portions of the source regions 112_3. According to an embodiment, the doping concentration of impurities of the counter doping regions 108_3 may be lower than that of the remaining portions of the source regions 112_3 or may be higher than that of the first drift region 107_3. The density of electrons is increased in a region, in which the accumulation channel is formed, thereby lowering a channel resistance between the first channel region C1_3 and the second channel region C2_3.

In addition, the first channel region C1_3 and the second channel region C2_3 may have a doping type the same as doping types of the source region 112_3 and the second drift region 113_3. In this case, the source region 112_3, the first channel region C1_3 or the second channel region C2_3, and the second drift region 113_3 may have structure normally electrically connected to each other. However, in the structure of the semiconductor layer 105_3 including SiC, negative charges appear due to the trap present on the interface between the gate insulating layer 118_3 and an SiC interface. Accordingly, the bands of the first channel region C1_3 and the second channel region C2_3 are curved upward while forming a potential barrier. Accordingly, the movement of the current may be blocked.

Accordingly, according to the present embodiment, even if the source regions 112_3 are formed to make contact with the vertical parts (protrusion part) 113a_3 of the second drift region 113_3, when the operating voltage is applied to the gate electrode layer 120_3, a channel may be formed to allow the flow of the current. In this case, an operating voltage (threshold voltage) to be applied to the gate electrode layer 120_3 to form channels in the first channel region C1_3 or the second channel region C2_3 may be considerably lower than an operating voltage to be applied to the gate electrode layer 120_3 to form a typical channel.

For example, the first channel region C1_3 and the second channel region C2_3 may be portions of the well regions 110_3. In more detail, the first channel region C1_3 may be a portion of the well regions 110_3, which are adjacent to a lower portion of the first part 120a_3 of the gate electrode layer 120_3. In more detail, the second channel region C2_3 may correspond to a portion of the well regions 110_3, which are adjacent to a lower portion of the second part 120b_3 of the gate electrode layer 120_3. In other words, the second channel region C2_3 may be formed in a region between the protrusion part 113a_3 of the second drift region 113_3 and the source region 112_3.

In this case, the first channel region C1_3 and the second channel region C2_3 may be integrally formed with the well regions 110_3 or may be formed to be continuously connected to the well regions 110. A doping concentration of the first conductive type of impurities of the first channel region C1_3 and the second channel region C2_3 may be the same as that of another portion of the second drift region 113_3 or may be different from each other to adjust a threshold voltage.

The second channel region C2_3 and the source region 112_3 may be formed on opposite sidewall of the vertical part (protrusion part) 113a_3 to be connected to each other. The vertical part 113a_3 of the second drift region 113_3, the second channel region C2_3, and the source region 112_3, which are connected to each other, may be a moving path of a current when the power semiconductor device 100_3 operates.

According to an embodiment, three well regions 110_3, which are adjacent to each other, among the well regions 110_3 may have equal spacing. Further, three source regions 112_3, which are adjacent to each other, among the source regions 112_3 may have equal spacing. For example, centers of three adjacent well regions 110_3 may be respectively disposed at vertexes of a regular triangle, and centers of three adjacent source regions 112_3 on the well regions 110_3 may also be respectively disposed at the vertexes of the same regular triangle. For example, the well regions 110_3 and the source regions 112_3 may be understood as indicating three parts forming a triangle as illustrated in FIG. 44.

According to an embodiment, the centers of seven adjacent well regions 110_3 among the well regions 110_3 may be respectively disposed at the center and vertexes of a regular hexagon. In addition, the centers of seven source regions 112_3 present on the seven adjacent well regions 110_3 from among the source regions 112_3 may be respectively disposed at the center and vertexes of the regular hexagon. For example, FIGS. 43 to 47 may be understood as illustrating seven well regions 110_3 and seven source regions 112_3.

In this structure, the well regions 110_3 and the source regions 112_3 may be disposed in a hexagonal closed packed arrangement structure, which is similar to a planar arrangement structure. In addition, the well regions 110_3 may have equal spacing between two adjacent well regions 110_3, and the source regions 112_3 may have equal spacing between two adjacent source regions 112_3.

In this structure, the trenches 116_3 may be disposed to form portions of lines each linking two adjacent to each other from among the center and vertexes of the regular hexagon such that seven adjacent source regions 112_3 are connected. In more detail, in FIG. 44, the trenches 116_3 may include six lines liking six source regions 112_3 disposed at the vertexes with one source region 112_3 disposed at the center of the regular hexagon, and six lines each linking two adjacent source regions from among six source regions 112_3 which are disposed at the vertexes.

According to an embodiment, the well regions 110_3 may be a portion of a spherical shape. When viewed from a plane view of the well region 110_3, the cross-section of the well region 110_3 has a circular shape at a region including the source region 112_3 and the well contact region 114_3, and has a ring shape or a doughnut shape a region, which does not include the source region 112_3 and the well contact region 114_3. Further, the well contact regions 114_3 may be formed in the ring shape or the doughnut shape, when viewed from a plane view. For example, when viewed from a plan view, the well contact regions 114_3 having the ring shape may be formed in the well regions 110_3 having the ring shape, and the source regions 112_3 having the circular shape may be formed in the well contact region 114_3 having the ring shape. The well contact regions 114_3 may be connected to the well regions 110_3, when viewed from a bottom view. When viewed from the plan view, the source regions 112_3 may be formed in a doughnut shape to surround the well contact regions 114_3. The shape when viewed from the plan view may be formed to a specific depth from the surface of the semiconductor layer 105_3.

According to an embodiment, a portion, which is formed under bottom surfaces of the trenches 116_3, of the well regions 110_3, for example, the first channel region C1_3 formed in the well regions 110_3 in the vicinity of the bottom surfaces of the trenches 116_3, may be connected to the protrusion part 113a_3 under the relevant portion.

For another example, when the whole thickness of the well region 110_3 under the bottom surface of each trench 116_3 is thicker than the thickness of the first channel region C1_3, the first channel region C1_3 may not be connected to the second drift region 113_3 formed under each trench 116_3. However, when each well region 110_3 has a spherical shape, since at least a lateral side of the trench 116_3 is exposed from the well region 110_3 and is surrounded by the protrusion 113a_3 of the second drift region 113_3, the first channel region C1_3 may be connected from the protrusion 113a_3 of the second drift region 113_3, which is provided on the lateral side of the trench 116 or on the sidewall of the first part 120a_3 of the gate electrode layer 120_3, to the source region 112_3.

Although the above description has been made in that the first conductive type and the second conductive type are opposite to each other and are an N type and a P type, respectively, the first conductive type and the second conductive type may be the P type and the N type In more detail, when the power semiconductor device 100_3 is an N-type MOSFET, the first drift region 107_3 may be an N-region, the source region 112_3 and the drain region 102_3 may be N+ regions, the first channel region C1_3 and the second channel region C2_3 may adjust an N concentration through the counter doping, the well region 110_3 may be P− regions, and the well contact region 114_3 may be a P+ region.

According to the power semiconductor device 100_3, a depth of the well regions 110_3 may be deeper than that of the trenches 116_3 and the gate electrode layer 120_3. Accordingly, opposite corners, which are positioned on the bottom surface of the trench 116_3, of the first part 120a_3 of the gate electrode layer 120_3 may be surrounded by the well regions 110_3. Further, the bottom surface of the first part 120a_3 may be fully surrounded by the well regions 110_3. Such a structure may alleviate the concentration of the electric field on a partial corner portion of the bottom surface of the trench in the trench-type gate structure.

When the operating voltage is applied to the gate electrode layer 120_3, the electric field may be concentrated to the lower corner portions of the gate electrode layer 120_3. When the electric field is concentrated, the gate insulating layer 118_3 in the relevant region may receive severe stress, so dielectric breakdown of the gate insulating layer 118_3 may be caused. Therefore, according to the present embodiment, as lower portions, which are formed in the well region 110_3, of the gate electrode layer 120_3 may be surrounded by the well region 110_3 in the P type to achieve charge sharing, thereby preventing the dielectric breakdown of the gate insulating layer 118_3, as the electric field is concentrated on corner portions of the gate insulating layer 118_3.

When the power semiconductor device 100_3 operates, a current may mainly flow in a vertical direction from the drain region 102_3 along the second drift region 113_3 through the first drift region 107_3, and may then flow to the source region 112_3 through the first channel region C1_3 and the second channel region C2_3.

The power semiconductor device 100_3 may have a hybrid structure including both the trench-type gate structure and the planar-type gate structure. In addition, the power semiconductor device 100_3 may have a regular hexagon arrangement structure and may provide the high degree of integration with the high channel density by combining the trench-type gate structure and the planar-type gate structure. In addition, when compared to the case where only a planar-type structure is provided, the power semiconductor device 100_3 may maintain the degree of integration through the addition of the trench-type structure and may improve the channel mobility.

In the power semiconductor device 100_3 described above, the accumulation channel may be formed through the counter doping regions 108_3 to reduce the channel resistance of the first channel region C1_3 and the second channel region C2_3, and the second drift region 113_3 having the conductive type the same as that of the first drift region 107_3 may be formed on the entire surface of the upper portion of the first drift region 107_3 to reduce a resistance (JFET resistance) in the flow of a current through the vertical parts 113a_3.

Figure 49:
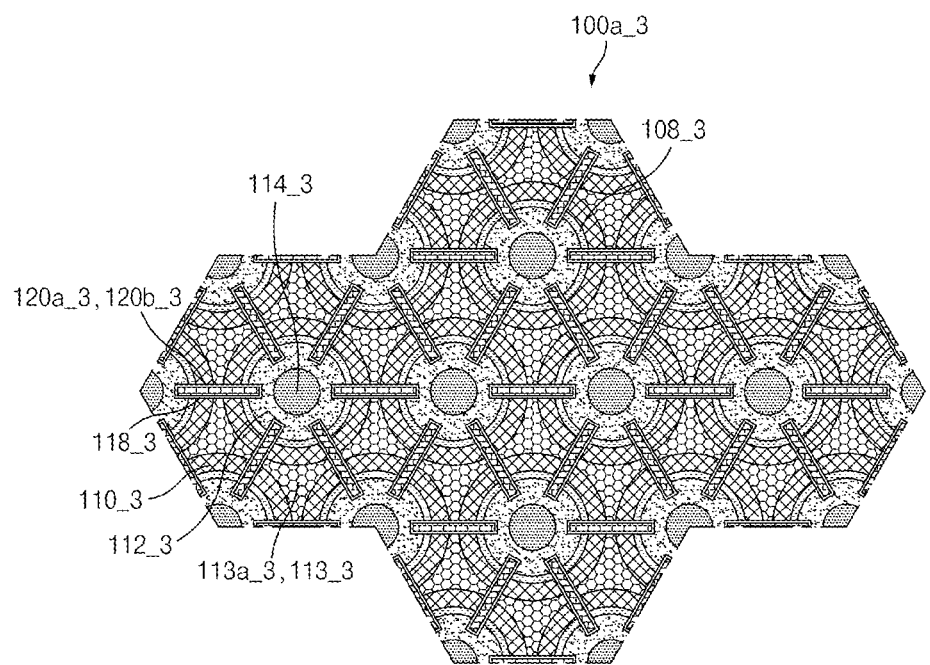
FIG. 49 is a plan view schematically illustrating the structure of a power semiconductor device, according to another embodiment of the present disclosure.

FIG. 49 is a plan view (or a horizontal sectional view) illustrating a power semiconductor device 100a_3 according to another embodiment of the present disclosure.

Referring to FIG. 49, the power semiconductor device 100a_3 shows a portion of a structure, in which a plurality of power semiconductor devices 100_3 in FIGS. 43 to 48 are arranged, and the same reference numerals of the components of power semiconductor devices 100_3 will be assigned to components of the power semiconductor device 100a_3. Accordingly, the duplication thereof will be omitted.

As the power semiconductor device 100a_3 is formed by repeating a hexagonal closed packed arrangement structure illustrated in FIGS. 43 to 48, the power semiconductor device 100a_3 may have the degree of higher integration.

Figure 50:
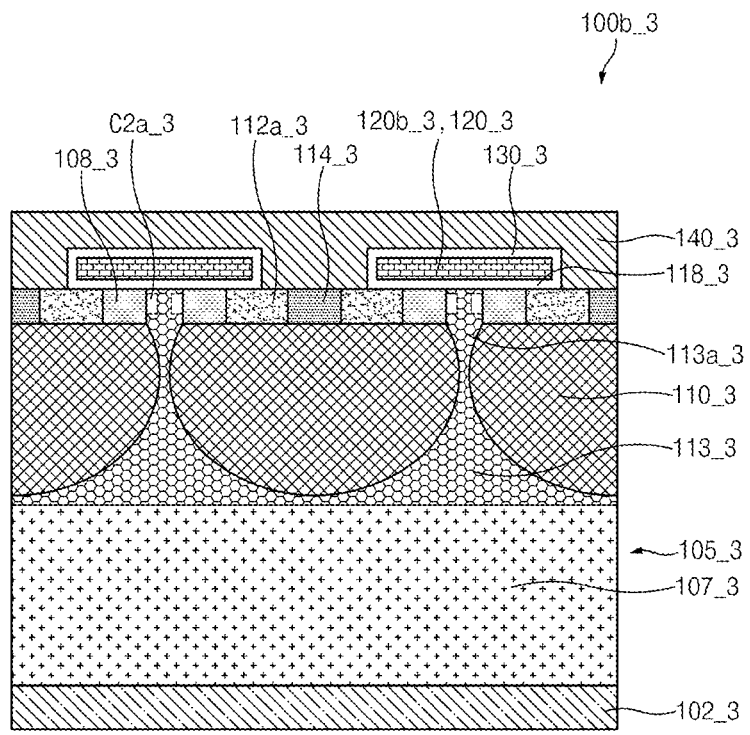
FIGS. 50 and 51 are cross-sectional views schematically illustrating the structure of a power semiconductor device, according to still another embodiment of the present disclosure.
Figure 51:
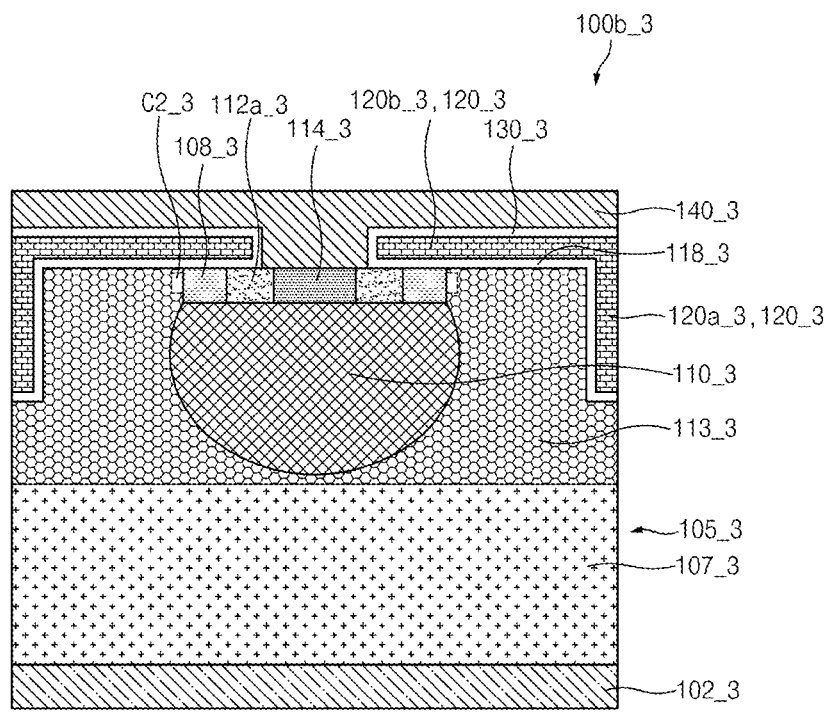

FIGS. 50 and 51 are cross-sectional views schematically illustrating the structure of a power semiconductor device, according to still another embodiment of the present disclosure; The power semiconductor device 100b_3 may be implemented by modifying a partial configuration of the power semiconductor device 100_3 of FIGS. 43 to 48, and the description of the power semiconductor device 100b_3 and the description of the power semiconductor device 100_3 make references to each other. Accordingly, the duplicated descriptions will be omitted.

Referring to FIGS. 50 and 51, in the power semiconductor device 100b_3, a second channel region C2a_3 may be formed in a semiconductor layer 105_3 between the second drift region 113_3 and the source region 112_3. For example, the second channel region C2a_3 may be formed in the semiconductor layer 105_3 between the protrusion part 113a_3 of the second drift region 113_3 and the source region 112a_3. The second channel region C2a_3 may include the first conductive type of impurities to form an accumulation channel. The accumulation channel may refer to that holes are accumulated in the well region having the P type which is the second conductive type.

However, in an embodiment of the present disclosure, since the counter doping region 108_3 is formed, as electrons forming the inversion channel are previously counter-doped, the term of the "accumulation channel" is used. In this embodiment, the counter doping regions 108_3 may be formed to be separated from the remaining portions of the source regions 112_3. A doping concentration of impurities of the counter doping region 108_3 may be equal to or different from that of the remaining source regions 112_3. According to an embodiment, the doping concentration of impurities of the counter doping regions 108_3 may be lower than that of the remaining source regions 112_3 or may be higher than that of the drift region 113_3.

In an embodiment of the present disclosure, the previously-counter doped region may be defined as the counter doping region 108_3 to form a channel in a portion of the source region 112a_3. For example, the second channel region C2a_3 may have the doping type the same as the doping types of the source region 112a_3 and the second drift region 113_3. In this case, the source region 112_3, the second channel region C2a_3, and the second drift region 113_3 may have structure normally electrically connected to each other. The semiconductor layer 105_3 including SiC has negative charges, as a trap is present in the interface with the gate insulating layer. Accordingly, the band of the second channel region C2a_3 is curved upward to form a potential barrier, thereby increasing the threshold voltage. Accordingly, the channel is formed through counter doping region 108_3 which is previously counter doped, to decrease the threshold voltage to be lower than the threshold voltage to be applied to the gate electrode layer 120_3 to form the typical inversion channel.

According to an embodiment, the second channel region C2a_3 may be a portion of the second drift region 113_3. In more detail, the second channel region C2a_3 may be a portion of the protrusion portion 113a_3 of the second drift region 113_3. For example, the second channel region C2a_3 may be integrally formed with the second drift region 113_3. Accordingly, in the power semiconductor device 100b_3, the source regions 112a_3 may directly make contact with the second drift region 113_3 (for example, the protrusion 113a_3 of the second drift region 113_3), and the second channel region C2a_3 may be defined in a portion of the drift region 107_3 by the contact portion.

A doping concentration of the first conductive type of impurities of the second channel region C2a_3 may be the same as that of the remaining portion of the drift region 113_3 or may be different from each other to adjust a threshold voltage.

According to an embodiment, the well region 110_3 may be formed under the source regions 112a_3 to further protrude toward the protrusion part 113a_3 of the second drift region 113_3, as compared to the source regions 112a_3. In this case, the second channel region C2a_3 may be formed in the semiconductor layer 105_3 on the protruding portion of the well region 110_3. For example, the protrusion 113a_3 of the second drift region 113_3 may further extend into a groove portion between the well region 110_3, and the second part 120b_3 of the gate electrode layer 120_3, and the second channel region C2a_3 may be formed at the extending protruding part. The above structure may define the second channel region C2a_3 between the second part 120b_3 of the gate electrode layer 120_3 and the well region 110_3.

In the power semiconductor device 100b_3, the first channel region C1_3 may be provided as an accumulation channel, which is similar to the power semiconductor device 100_3 of FIGS. 43 to 48.

Figure 53:
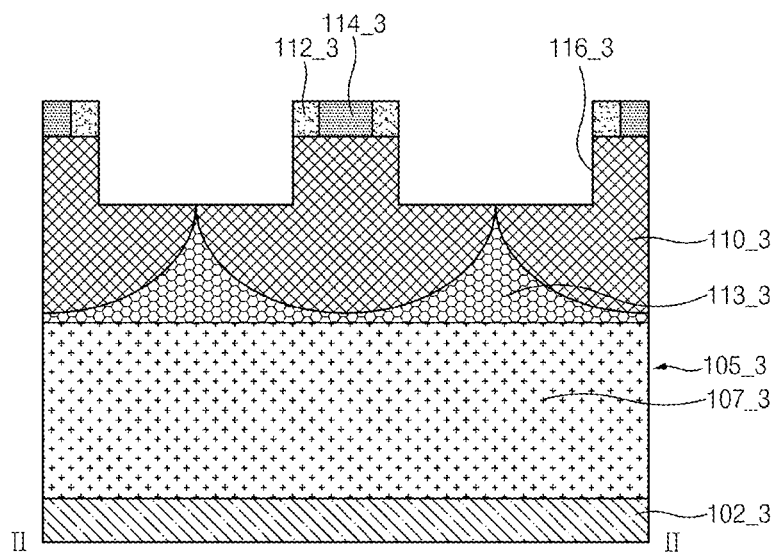
Figure 54:
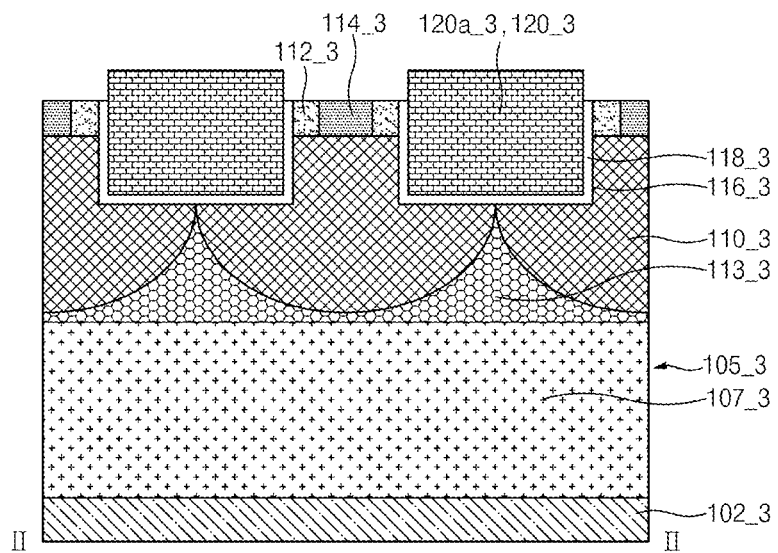
Figure 55:
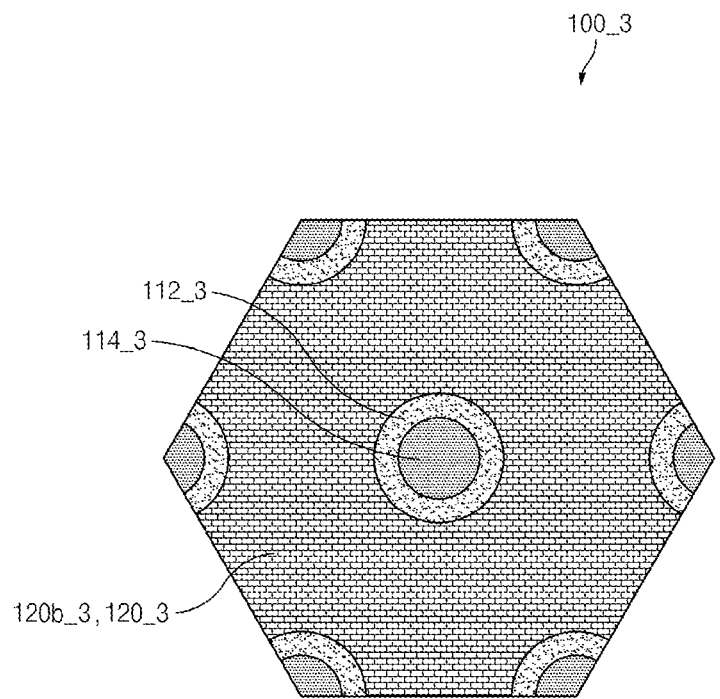
FIG. 55 is a plan view schematically illustrating the structure of the power semiconductor device of FIG. 54.
Figure 56:
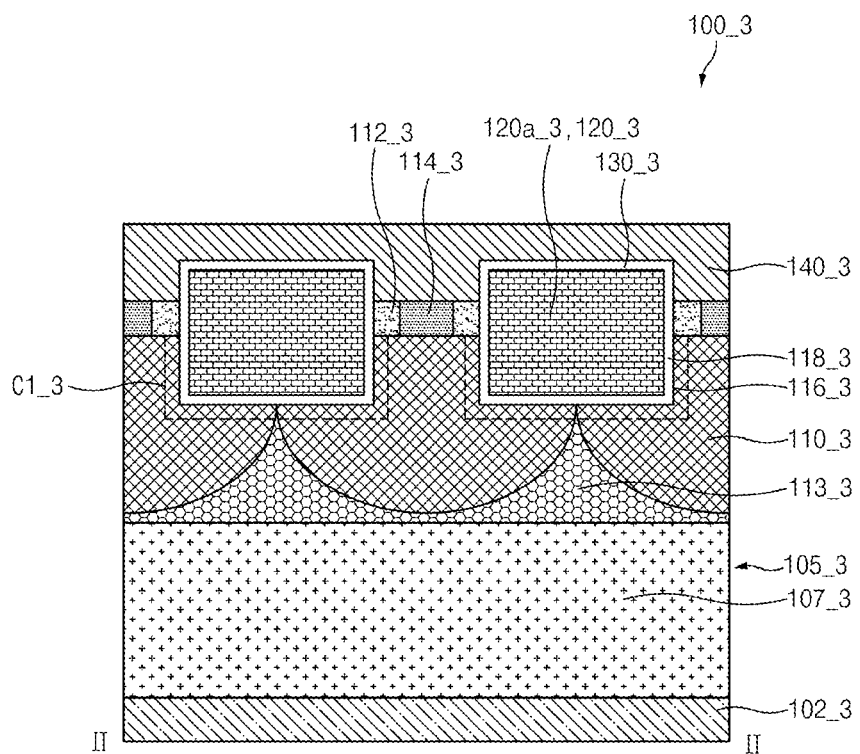
FIG. 56 is a cross-sectional view schematically illustrating a method for fabricating a power semiconductor device after the processes of FIG. 54.

FIGS. 52 to 54, and 56 are cross-sectional views illustrating a method for fabricating the power semiconductor device 100_3, according to an embodiment of the present disclosure, and FIG. 55 is a plan view (a longitudinal-sectional view) of FIG. 56.

Figure 52:
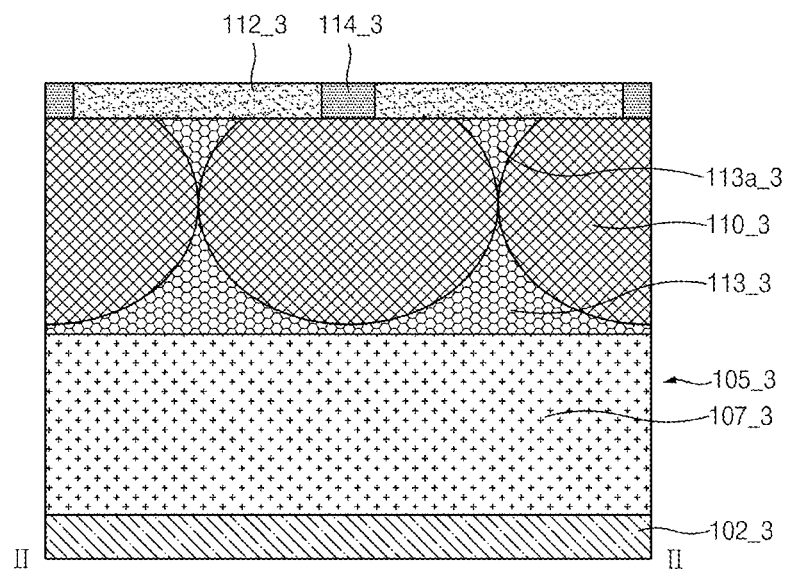
FIGS. 52 to 54 are cross-sectional views schematically illustrating a method for fabricating the power semiconductor device of FIG. 43.

Referring to FIG. 52, the first drift region 107_3 having the first conductive type may be formed in the semiconductor layer 105_3 including silicon carbide (SiC) to provide a vertical moving path of a charge. For example, the first drift region 107_3 may be formed on the drain region 102_3 having the first conductive type. According to an embodiment, the drain region 102_3 may be provided in the form of a substrate having the first conductive type, and the first drift region 107_3 may include one or more epitaxial layers formed on the substrate.

Next, the second drift region 113_3 having the first conductive type may be formed to make contact with the entire surface of the upper portion of the first drift region 107_3. For example, the forming of the second drift region 113_3 may be performed by implanting the first conductive type of impurities into the first drift region 107_3. According to an embodiment, the second drift region 113_3 may be formed by doping the first drift region 107_3 with impurities having the first conductive type the same as that of the first drift region 107_3 and having a doping concentration of the impurities of the first drift region 107_3. The second drift region 113_3 may be actually formed to a specific depth from the surface of the semiconductor layer 105_3.

Next, the well regions 110_3 having the second conductive type may be formed in the semiconductor layer 105_3 to make contact with the second drift region 113_3. For example, adjacent well regions 110_3 of the well regions 110_3 may be formed to at least partially make contact with each other. In addition, the forming of the well regions 110_3 may be performed by implanting the second conductive type of impurities into the semiconductor layer 105_3. The well regions 110_3 may be actually formed to a specific depth from the surface of the semiconductor layer 105_3.

For example, the well regions 110_3 may be formed in the semiconductor layer 105_3, such that the second drift region 113_3 includes the protrusion parts 113a_3, at least portions of which are surrounded by the well regions 110_3. In more detail, the well regions 110_3 may be formed by doping impurities in a conductive type opposite to that of the second drift region 113_3 into the second drift region 113_3.

The source regions 112_3 having the first conductive type may be formed in the semiconductor layer 105_3 in the well regions 110_3 or on the well regions 110_3. For example, the forming of the source regions 112_3 may be performed by implanting the first conductive type of impurities into the well regions 110_3 and the second drift region 113_3. The source regions 112_3 may be actually formed at a specific depth of the well region 110_3 from the surface of the semiconductor layer 105_3.

In addition, the well contact regions 114_3 having the second conductive type may be formed in the source regions 112_3 or on the well regions 110_3. For example, the well contact regions 114_3 may be formed by implanting the second conductive type of impurities into the well regions 110_3 or into the source regions 112_3 at a high concentration. For example, the well contact regions 114_3 may be formed to have a circular shape when viewed in a plan view.

According to an embodiment, the well regions 110_3 may be formed to make contact with the second drift region 113_3, such that the second drift region 113_3 is connected to the surface of the semiconductor layer 105_3 while extending to pass through a space between the well regions 110_3 from the lower portions of the well regions 110_3.

According to a modification of the present embodiment, the sequence of doping impurities into the well regions 110_3, the counter doping region 108_3, the first drift region 107_3, the second drift region 113_3, the well contact regions 114_3, and the source regions 112_3 may be arbitrarily changed.

In the above fabricating method, the impurity implantation or the impurity doping may be performed such that the impurities are mixed, when the impurities are ion-implanted into the semiconductor layer 105_3 or when an epitaxial layer is formed. However, an ion implantation manner using a mask pattern may be used to implant impurities into a selective region.

Alternatively, a heat treatment process for activating or diffusing the impurities may be performed after the ion implantation.

Referring to FIG. 53, the plurality of trenches 116_3 may be formed to be recessed by a specific depth into the semiconductor layer 105_3 from the surface of the semiconductor layer 105_3.

For example, the trenches 116_3 may be formed to penetrate portions of the source regions 112_3 and to be recessed to a specific depth of the well regions 110_3 and the protrusions 113a_3 of the second drift region 113_3. In more detail, each of the trenches 116_3 may be formed to be recessed from the surface of the semiconductor layer 105_3 into the semiconductor layer 105_3, to connect two source regions 110_3, which are disposed at opposite sides of the trench 116_3, of the source regions 112_3, while extending by passing through the contact portion between adjacent well regions 110_3 of the well regions 110_3.

For example, the trenches 116_3 may be formed by forming a photo mask through a photo lithography process and then by etching the semiconductor layer 105_3 using the photo mask as an etching protective layer.

Referring to FIGS. 54 and 55, the gate insulating layer 118_3 may be formed on the inner walls of the trenches 116_3 and the surface of the semiconductor layer 105_3. For example, the gate insulating layer 118_3 may be formed by oxidizing the semiconductor layer 105_3 to form an oxide or by depositing an insulating material, such as an oxide or a nitride, on the semiconductor layer 105_3.

For example, the first part 120a_3, which is filled in the trench 116_3, and the second part 120b_3 formed on the surface of the semiconductor layer 105_3 may be formed on the gate insulating layer 118_3 to form gate electrode layers 120_3. In this case, the gate electrode layer 120_3 may not be formed in the well contact region 114_3 and in a partial region of the source regions 112_3 adjacent to the well contact region 114_3. For example, the gate electrode layer 120_3 may be formed after forming a conductive layer on the gate insulating layer 118_3 and patterning the conductive layer. The gate electrode layer 120_3 may be formed by doping impurities in polysilicon or may be formed to include a conductive metal or metal silicide.

The patterning process may be performed through photo lithography and etching processes. The photo lithography process may include a process of forming a photoresist pattern as a mask layer through a photo process and a developing process, and the etching process may include a process of selectively etching an underlying structure by using the photoresist pattern.

Referring to FIG. 56, the interlayer insulating layer 130_3 may be formed on the gate electrode layer 120_3.

Subsequently, the source electrode layer 140_3 may be formed on the interlayer insulating layer 130_3. In addition, the source electrode layer 140_3 may be electrically connected to the source regions 112_3 and the well contact regions 114_3. For example, the source electrode layer 140_3 may be formed by forming a conductive layer, for example, a metal layer on the interlayer insulating layer 130_3 and patterning the conductive layer.

According to the fabricating method described above, the MOSFET structure having the hexagonal closed packed arrangement in the semiconductor layer 105_3 may be economically formed.

Figure 57:
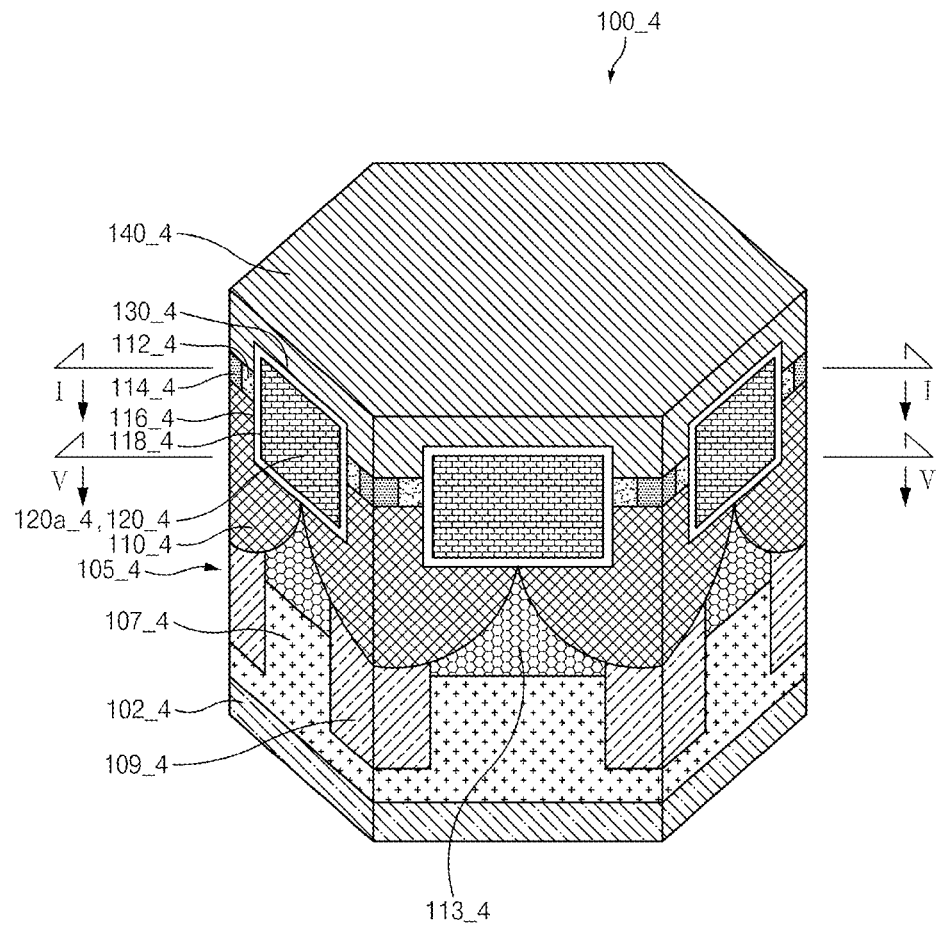
FIG. 57 is a perspective view schematically illustrating the structure of a power semiconductor device, according to an embodiment of the present disclosure.
Figure 58:
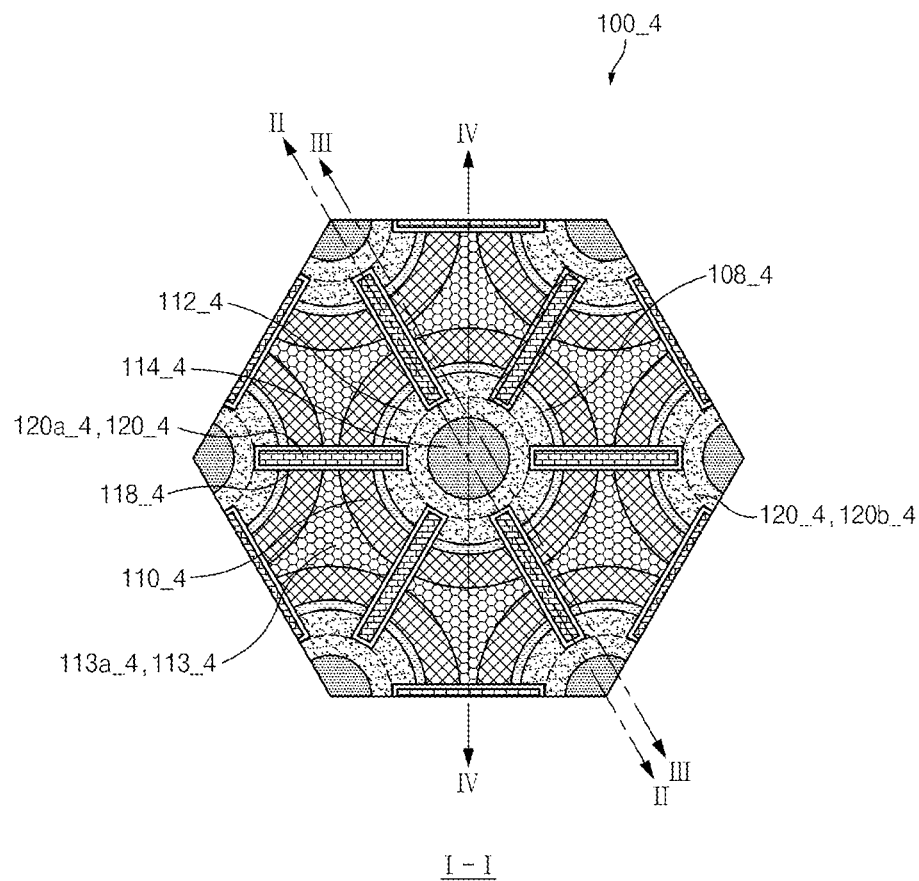
FIG. 58 is a plan view illustrating the structure taken along line I-I of FIG. 57.
Figure 59:
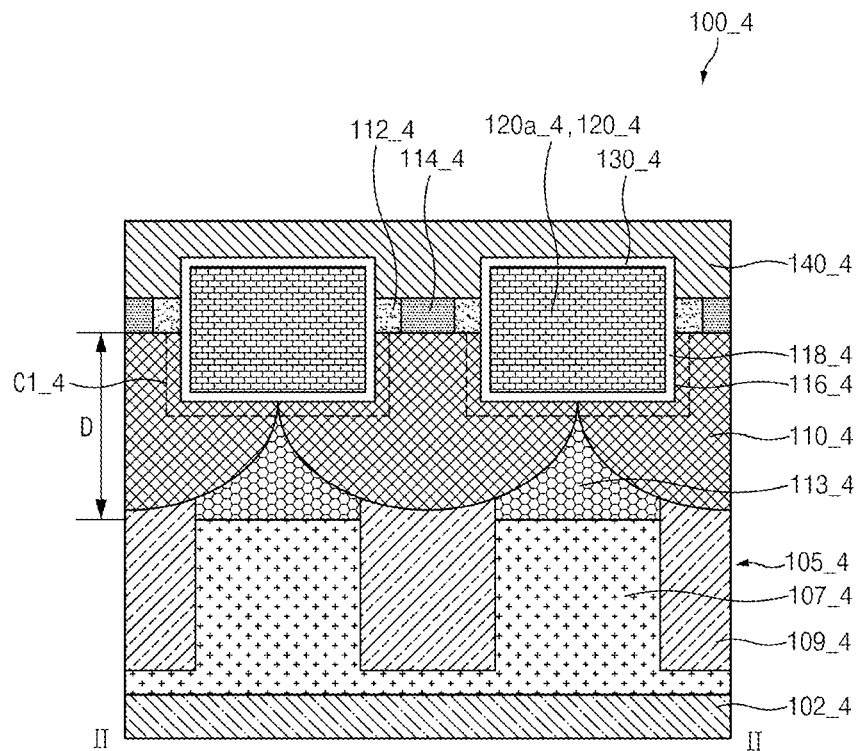
FIG. 59 is a cross-sectional view illustrating the structure taken along line II-II of FIG. 58.
Figure 60:
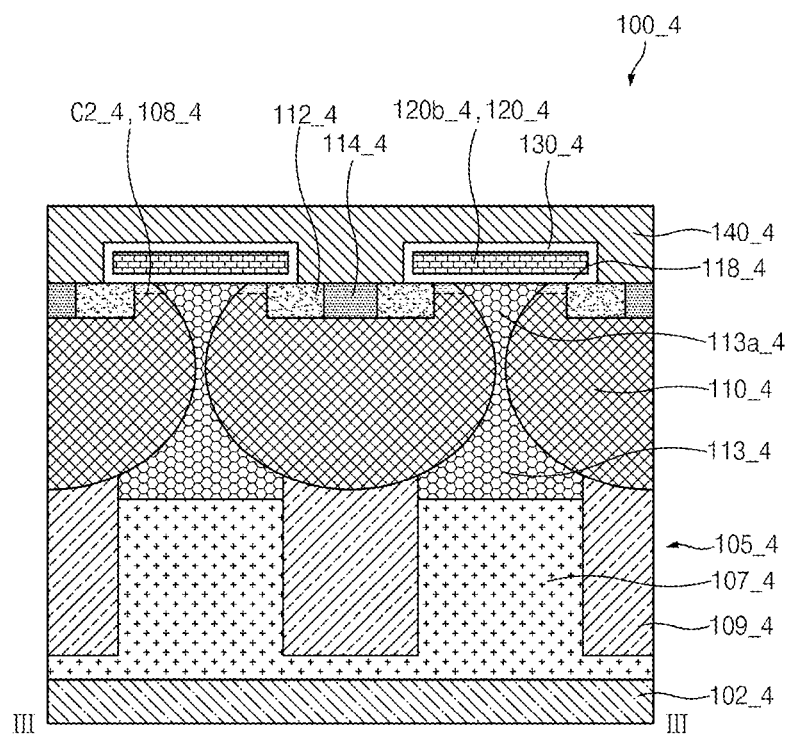
FIG. 60 is a cross-sectional view illustrating the structure taken along line III-III of FIG. 58.
Figure 61:
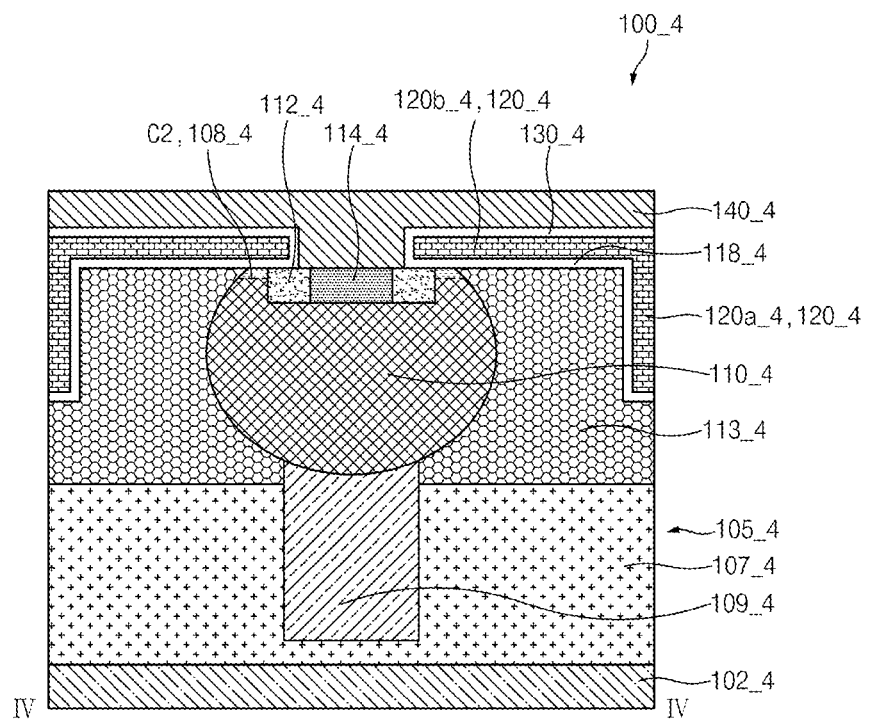
FIG. 61 is a cross-sectional view illustrating the structure taken along line IV-IV of FIG. 58.
Figure 62:
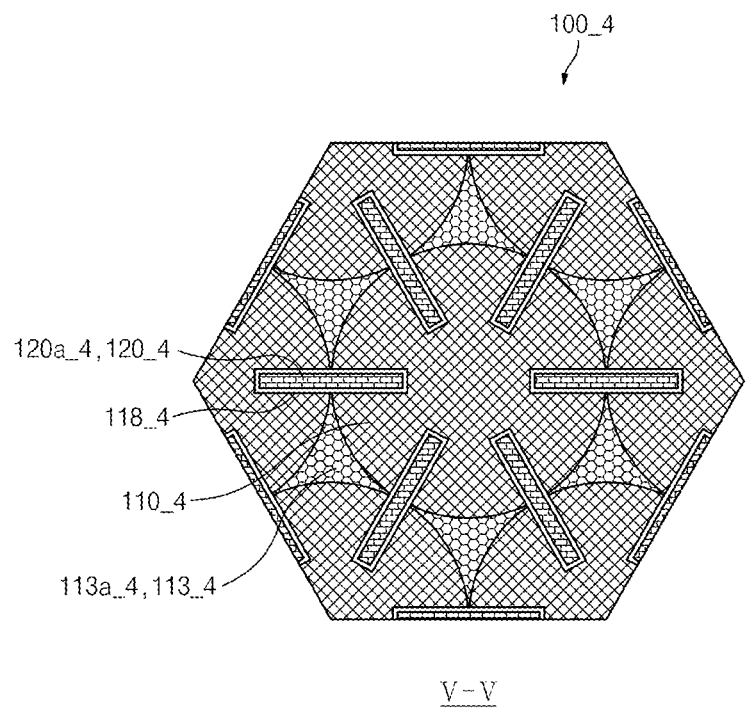
FIG. 62 is a plan view illustrating the structure taken along line V-V of FIG. 57.

FIG. 57 is a perspective view schematically illustrating the structure of a power semiconductor device, according to an embodiment of the present disclosure, and FIG. 58 is a plan view (horizontal sectional view) illustrating the structure taken along line I-I of FIG. 57. FIG. 59 is a cross-sectional view illustrating the structure taken along line II-II of FIG. 58, FIG. 60 is a cross-sectional view illustrating the structure taken along line III-III of FIG. 58, FIG. 61 is a cross-sectional view illustrating the structure taken along line IV-IV of FIG. 58, and FIG. 62 is a plan view (horizontal sectional view) illustrating the structure taken along line V-V of FIG. 57.

Referring to FIGS. 57 to 62, a power semiconductor device 100_4 may at least include a semiconductor layer 105_4, a gate insulating layer 118_4, a gate electrode layer 120_4, and a plurality of interlayer insulating layer 130_4, and a source electrode layer 140_4. For example, the power semiconductor device 100_4 may have a power MOSFET structure.

The semiconductor layer 105_4 may include a single semiconductor material layer or a plurality of semiconductor material layers. For example, the semiconductor layer 105_4 may include a single epitaxial layer or multiple epitaxial layers. Alternatively, the semiconductor layer 105_4 may include a single epitaxial layer or multiple epitaxial layers formed on a semiconductor substrate. For example, the semiconductor layer 105_4 may include silicon carbide (SiC). Alternatively, the semiconductor layer 105_4 may include at least one SiC-epitaxial layer.

As silicon carbide (SiC) has a bandgap higher than a bandgap of silicon (Si), silicon carbide (SiC) may maintain stability even at a higher temperature, as compared to silicon (Si). Further, silicon carbide (SiC) exhibits a dielectric breakdown field remarkably higher than that of silicon (Si). Accordingly, silicon carbide (SiC) may stably work even at a higher voltage. Accordingly, the power semiconductor device 100_4 having the semiconductor layer 105_4 including silicon carbide (SiC) may exhibit a more excellent heat dissipation characteristic with a higher breakdown voltage, and may exhibit a stabler operating characteristic at a higher temperature, when compared to silicon (Si)

In more detail, the semiconductor layer 105_4 may include a drain region 102_4, a first drift region 107_4, a counter doping regions 108_4, a plurality of pillar regions 109_4, a plurality of well regions 110_4, a plurality of source regions 112_4, a second drift region 113_4, a plurality of well contact regions 114_4, and a plurality of trenches 116_4.

In this case, the first drift region 107_4 may be formed in a first conductive type (for example, the N type) and may be formed by implanting the first conductive type of impurities into a portion of the semiconductor layer 105_4. For example, the first drift region 107_4 may be formed by implanting the first conductive type of impurities into the SiC epitaxial layer. The first drift region 107_4 may provide a moving path of charges, when the power semiconductor device 100_4 operates.

The well regions 110_4 may be formed in the semiconductor layer 105_4 and may have the second conductive type of impurities. For example, the well regions 110_4 may be formed in the semiconductor layer 105_4 to make contact with at least a portion of the second drift region 113_4. According to an embodiment, the well region 110_4 may be formed by implanting impurities in the second conductive type (for example, the P type), which is opposite to the first conductive type, into the semiconductor layer 105_4 or the second drift region 113_4.

In this case, the second drift region 113_4 may be formed in a first conductive type (for example, the N type) and may be formed by implanting the first conductive type of impurities into an entire surface of the upper portion of the first drift region 107_4. The second drift region 113_4 may be formed in the semiconductor layer 105_4 under the well region 110_4 such that the second drift region 113_4 is connected to the well region 110_4. The second drift region 113_4 may be formed to make contact with an upper portion of the first drift region 107_4, the lateral side of the well region 110_4, and a lower portion of the well region 110_4. For example, the second drift region 113_4 may be disposed under the well region 110_4 such that a top surface and a lateral side of the second drift region 113_4 makes contact with the well region 110_4, and a bottom surface of the second drift region 113_4 makes contact with the first drift region 107_4. The second drift region 113_4 may provide a moving path of charges, when the power semiconductor device 100_4 operates.

The second drift region 113_4 may be formed in the semiconductor layer 105_4 such that the second drift region 113_4 has the same conductive type as the first drift region 107_4. For example, the second drift region 113_4 may include impurities in the first conductive type which is the type the same as the type of the drift region 107_1 and opposite to the type of the well region 110_1, and the doping concentration of the first conductive type of impurities of the second drift region 113_4 may be adjusted. For example, the doping concentration of the second conductive type of impurities of the second drift region 113_4 may be equal to or lighter than the doping concentration of the second conductive type of impurities of the well region 107_4, but the present disclosure is not limited thereto.

According to an embodiment of the present disclosure, as illustrated in the drawing, the bottom surface of the second drift region 113_4 may be spaced apart from the bottom surface of the well region 110_4 by a specific distance, instead of making contact with the bottom surface of the well region 110_4. However, the embodiment of the present disclosure is not limited thereto. For example, the second drift region 113_4 may make contact with the bottom surface of the well region 110_4. In other words, as illustrated in FIG. 59, the depth 'D' of the second drift region 113_4 interposed between the surface of the semiconductor layer 105_4 and the first drift region 107_4 may be sufficiently changed.

The pillar region 109_4 may be formed in the semiconductor layer 105_4 under the well region 110_4 such that the pillar region 109_4 is connected to the well region 110_4. The pillar region 109_4 may be formed to make contact with the first drift region 107_4 to form a super junction with the first drift region 107_4. For example, the pillar region 109_4 may be disposed under the well region 110_4 such that a top surface of the pillar region 109_4 makes contact with the well region 110_4, and a lateral side and a bottom surface of the pillar region 109_4 make contact with the first drift region 107_4, respectively. According to an embodiment, a lateral side of the pillar region 109_4 may be partially provided in the second drift region 113_4 while making contact with the second drift region 113_4.

The pillar region 109_4 may be formed in the semiconductor layer 105_4 to have a conductive type opposite to the conductive type of the first drift region 107_4 such that the pillar region 109_4 forms the super junction with the first drift region 107_4. For example, the pillar region 109_4 may include impurities in the second conductive type which is the type opposite to the type of the first drift region 107_4 and the same as the type of the well region 110_4, and the doping concentration of the second conductive type of impurities of the pillar region 109_4 may be adjusted. For example, the doping concentration of the second conductive type of impurities of the pillar region 109_4 may be equal to or lighter than the doping concentration of the second conductive type of impurities of the well region 110_4, but the present disclosure is not limited thereto.

For example, FIGS. 57, 59, 60, and 61 illustrate that one pillar region 109_4 is formed integrally with the well region 110_4 under each well region 110_4. However, according to another embodiment, a plurality of pillar regions 109_4 may be formed under the well region 110_4. In other words, the plurality of pillar regions 109_4 having a width narrower than the width of the pillar region 109_4 illustrated in FIGS. 57, 59, 60, and 61 may be formed under one well region 110_4. In this case, the plurality of pillar region 109_4 disposed under one well region 110_4 may be alternately disposed such that lateral sides of the pillar regions 109_4 make contact with the first drift region 107_4.

However, according to another embodiment, the pillar region 109_4 may be formed under the well region 110_4. According to an embodiment, the pillar region 109_4 may be formed to have a width narrower than a width of the well region 110_4 to expose at least a portion of a bottom surface of the well region 110_4, and to be retracted inward from an end portion of the well region 110_4. Accordingly, the well region 110_4 may further protrude toward a protrusion part 113a_4 of the second drift region 113_4, as compared to the pillar region 109_4.

Source regions 112_4 may be formed in the well regions 110_4, respectively, and may be formed in the first conductive type. For example, the source regions 112_4 may be formed by implanting the first conductive type of impurities into the semiconductor layer 105_4 or the well region 110_4. The source regions 112_4 may be formed by implanting the first conductive type of impurities having a concentration higher than the concentration of the first conductive type of impurities of the first drift region 107_4.

A plurality of well contact regions 114_4 may be formed in the source regions 112_4 and on the well regions 110. For example, the well contact regions 114_4 may be formed on the well regions 110_4 to be connected to the well regions 110_4 through the source regions 112_4. The well contact region 114_4 may include the second conductive type of impurities.

The well contact regions 114_4 may be connected to the source electrode layer 140_4. The well contact region 114_4 may be doped with the second conductive type of impurities at a higher concentration. According to an embodiment, the well contact regions 114_4 may be doped with the second conductive of impurities having a doping concentration higher than a doping concentration of the second conductive type of impurities of the well regions 110_4. For example, the well contact region 114_4 may be a P+ region.

According to an embodiment, the well contact regions 114_4 may be formed in a recess groove making contact with the well regions 110_4. In this case, the source electrode layer 140_4 may be formed to be filled in the recess groove and to be connected to the well contact region 114_4.

In addition, a drain region 102_4 may be formed in the semiconductor layer 105_4 under the first drift region 107_4 and may include the first conductive type of impurities. For example, the drain region 102_4 may include the first conductive type of impurities implanted at a doping concentration higher than the concentration of the first conductive type of impurities of the first drift region 107_4.

According to an embodiment, the drain region 102_4 may be provided as a SiC-substrate in the first conductive type. In this case, the drain region 102_4 may be formed as a portion of the semiconductor layer 105_4 or as a substrate separate from the semiconductor layer 105_4. In addition, the first drift region 107_4 may include at least one epitaxial layer formed on the drain region 102_4.

According to an embodiment, the well regions 110_4 may be disposed in the semiconductor layer 105_4 such that two adjacent well regions make at least partially contact with each other. Two adjacent well regions 110_4 may make contact with each other at the center of the bottom surface of the trench 116_4. In addition, each of the well regions 110_4 may have a shape in which the width of the well region 110_4 is increased inwardly from the surface of the semiconductor layer 105_4 and then decreased. In detail, two adjacent well regions of the well regions 110_4 may make contact with each other, as illustrated in FIG. 62, at portions showing at least the largest width and may be spaced from each other on the surface of the semiconductor layer 105_4 as illustrated in FIG. 58.

According to an embodiment, the second drift region 113_4 may be formed in the semiconductor layer 105_4 such that the second drift region 113_4 is connected to the surface of the semiconductor layer 105_4 while extending to pass through a space between the well regions 110_4 from the lower portions of the well regions 110_4. For example, the second drift region 113_4 may include a protrusion part 113a_4 extending to the surface of the semiconductor layer 105_4 while passing through a space between the well regions 110_4. In this case, the protrusion part 113a_4 may represent a region corresponding to the depth which is formed from the lowermost end portion of the well region 113_4 to the surface of the semiconductor layer 105_4, as illustrated in FIG. 60. In other words, the protrusion parts 113a_4 may correspond to regions positioned to make contact with the lateral side of the well regions 110_4.

A plurality of trenches 116_4 may be formed to be recessed by a specific depth inwardly from the surface (top surface) of the semiconductor layer 105_4. For example, each of the trenches 116_4 may be formed to connect two source regions 112_4, which are disposed at opposite sides of the trench 116_4, of the source regions 112_4 to each other, while extending by passing through the contact portion between adjacent well regions 110_4 of the well regions 110_4. In more detail, each trench 116_4 may be formed in the type of a line linking one source region 112_4 to an adjacent source region 112_4 while passing through one well region 110_4 surrounding the source region 112_4, the protrusion part 113a_4 of the second drift region 113_4, and an adjacent well region 110.

For example, the trenches 116_4 may be formed to penetrate portions of the source regions 112_4 and to be recessed to a specific depth of the well regions 110_4 and the protrusions 113a_4 of the second drift region 113_4. Accordingly, at least opposite corners of each trench 116_4 may be surrounded by the well regions 110_4. In addition, when viewed from the cross section of the trench 116_4 taken along an extending direction thereof, a bottom surface of the trench 116_4 may be fully surrounded by the well regions 110_4. For example, adjacent well regions 110_4 of the well regions 110_4 may be formed to make contact with each other on the bottom surface of each of the trenches 116_4 or in the vicinity of the bottom surface of each trench 116_4. Accordingly, opposite sides the bottom surface of the trench 116_4 may be surrounded by the well regions 110_4 on a line provided in a direction in which the trench 116_4 extends.

The gate insulating layer 118_4 may be formed on inner walls of the trenches 116_4 and at least a portion of the semiconductor layer 105_4. For example, the gate insulating layer 118_4 may be formed on the inner surfaces of the trenches 116_4 and on the surface of the semiconductor layer 105_4. The thickness of the gate insulating layer 118_4 may be uniform, or portions, which are formed on the bottom surface and a corner of the trench 116_4, of the gate insulating layer 118_4 may have thicknesses thicker than the thickness of a portion, which is formed on a sidewall of the trench 116_4, of the gate insulating layer 118, such that an electric field concentrated on the corner of the trench 116_4 is lowered.

For example, the gate insulating layer 118_4 may include an insulating material, such as a silicon oxide, a silicon carbide oxide, a silicon nitride, a hafnium oxide, a zirconium oxide, or an aluminum oxide, or may include a stack structure thereof.

A gate electrode layer 120_4 may be formed on the gate insulating layer 118_4. For example, the gate electrode layer 120_4 may include a first part 120a_4, which is filled in the trench 116_4, and a second part 120b_4 formed on the surface of the semiconductor layer 105_4. For example, the first part 120a_4 of the gate electrode layer 120_4 may have a trench-type gate structure, and the second part 120b_4 may have a planar-type gate structure. Accordingly, the gate electrode layer 120_4 may have a hybrid-type structure including both the trench-type gate structure and the planar-type gate structure.

For example, the second part 120b_4 of the gate electrode layer 120_4 may be formed on the protrusion parts 113a_4 of the second drift region 113_4 and the well regions 110_4. In more detail, the second part 120b_4 of the gate electrode layer 120_4 may be formed on the protrusion parts 113a_4 of the second drift region 113_4, which are exposed onto the surface of the semiconductor layer 105_4, on the surfaces of the well regions 110_4, and on the surface of a portion of an edge of the source regions. The well contact regions 114_4 and remaining portions of the source regions 112_4 may be disposed outside the gate electrode layer 120_4 and may be exposed from the gate electrode layer 120_4.

At least corner portions of the bottom surface of the first part 120a_4 of the gate electrode layer 120_4 may be surrounded by the well regions 110_4. In addition, when viewed from the cross section of the first part 120a_4 taken along an extending direction of the first part 120a_4, the bottom surface of the first part 120a_4 may be fully surrounded by the well regions 110_4. For example, portions, which surround the bottom surface of the first part 120a_4, of the well regions 110_4 may be the thinnest portions at the center of the bottom surface of the first part 120a_4, and may gradually become thicker toward the corner portions of the first part 120a_4.

For example, the gate electrode layer 120_4 may include a conductive material, such as polysilicon, metal, a metal nitride, or a metal silicide, or may include a stack structure thereof.

The interlayer insulating layer 130_4 may be formed on the gate electrode layer 120_4. For example, the interlayer insulating layer 130_4 may include an insulating material, such as an oxide layer, a nitride layer, or the stack structure thereof, for electrical insulation between the gate electrode layer 120_4 and the source electrode layer 140_4.

A source electrode layer 140_4 may be formed on the interlayer insulating layer 130_4. The source electrode layer 140_4 may be commonly connected to the source region 112_4 and the well contact region 114_4. In addition, the source electrode layer 140_4 may be electrically connected to the source regions 112_4 and the well contact regions 114_4. For example, the source electrode layer 140_4 may be connected to the source regions 112_4 and the well contact regions 114_4 through a portion thereof exposed by the gate electrode layer 120_4 and may be disposed to additionally extend along a top surface of the gate electrode layer 120_4. For example, the source electrode layer 140_4 may include a conductive material such as metal.

A first channel region $C1\_4$ may be formed in the semiconductor layer 105_4 along the trench 116_4 to correspond to the first part 120a_4 of the gate electrode layer 120_4, such that the first channel region $C1\_4$ is connected to the source regions 112_4 and the second drift region 113_4. For example, the first channel region $C1\_4$ may be formed in the semiconductor layer 105_4 along sidewalls of the trench 116_4 to connect the second drift region 113_4 (that is, the protrusion part 113a_4 of the second drift region 113_4), which is positioned under the trench 116_4 or on a lateral side of the trench 116_4, and the source region 112_4, which makes contact with the trench 116_4, to each other Accordingly, the first channel region $C1\_4$ may have a trench-type channel structure.

A second channel region C2_4 may be formed in the semiconductor layer 105_4 under the second part 120b_4 of the gate electrode layer 120_4 such that the second channel region C2_4 makes contact with the source regions 112_4. For example, the second channel region C2_4 may be formed on the semiconductor layer 105_4 among the protrusion 113a_4 of the second drift region 113_4 and the source regions 112_4. The second channel region C2_4 may be formed to cover surfaces of the well regions 110_4. Accordingly, the second channel region C2_4 may have a planar-type channel structure.

For example, the first channel region C1_4 and the second channel region C2_4 may have the first conductive type such that an accumulation channel is formed. For example, the first channel region C1_4 and the second channel region C2_4 may have a doping type opposite to a doping type of the well regions 110_4.

For example, the accumulation channel may be formed by implanting the first conductive type (N type) of impurities into a portion of the well regions 110_4 having the second conductive type (P type) of impurities. Impurities in the first conductive type (N type), which is opposite to the second conductive type, may be implanted into some of the well regions 110_4 having the second conductive type (P type) of impurities for complete counter doping. In this case, the counter doping may refer to a process of intentionally doping impurities to adjust the electrical characteristic when a semiconductor device is fabricated, and the impurities may be varied depending on the type of a semiconductor. A doping concentration of impurities of the counter doping regions 108_4 may be equal to or different from that of the remaining portions of the source regions 112_4. According to an embodiment, the doping concentration of impurities of the counter doping regions 108_4 may be lower than that of the remaining portions of the source regions 112_4 or may be higher than that of the first drift region 107_4. The density of electrons is increased in a region, in which the accumulation channel is formed, thereby lowering a channel resistance between the first channel region C1_4 and the second channel region C2_4.

In addition, the first channel region C1_4 and the second channel region C2_4 may have a doping type the same as doping types of the source region 112_4 and the second drift region 113_4. In this case, the source region 112_4, the first channel region C1_4 or the second channel region C2_4, and the second drift region 113_4 may have structure normally electrically connected to each other. However, in the structure of the semiconductor layer 105_4 including SiC, negative charges appear due to the trap present on the interface between the gate insulating layer 118_4 and an SiC interface. Accordingly, the bands of the first channel region C1_4 and the second channel region C2_4 are curved upward while forming a potential barrier. Accordingly, the movement of the current may be blocked.

Accordingly, according to the present embodiment, even if the source regions 112_4 are formed to make contact with the vertical parts (protrusion parts) 113a_4 of the second drift region 113_4, when the operating voltage is applied to the gate electrode layer 120_4, a channel may be formed to allow the flow of the current. In this case, an operating voltage (threshold voltage) to be applied to the gate electrode layer 120_4 to form channels in the first channel region C1_4 or the second channel region C2_4 may be considerably lower than an operating voltage to be applied to the gate electrode layer 120_4 to form a typical channel.

For example, the first channel region C1_4 and the second channel region C2_4 may be portions of the well regions 110_4. In more detail, the first channel region C1_4 may be a portion of the well regions 110_4, which are adjacent to a lower portion of the first part 120a_4 of the gate electrode layer 120_4. In more detail, the second channel region C2_4 may correspond to a portion of the well regions 110_4, which are adjacent to a lower portion of the second part 120b_4 of the gate electrode layer 120_4. In other words, the second channel region C2_4 may be formed in a region between the protrusion part 113a_4 of the second drift region 113_4 and the source region 112_4.

In this case, the first channel region C1_4 and the second channel region C2_4 may be integrally formed with the well regions 110_4 or may be formed to be continuously connected to the well regions 110. A doping concentration of the second conductive type of impurities of the first channel region C1_4 and the second channel region C2_4 may be the same as that of the remaining portion of the second drift region 113_4 or may be different from each other to adjust a threshold voltage.

The second channel region C2_4 and the source region 112_4 may be formed on opposite sidewall of the vertical part 113a_4 to be connected to each other. The vertical part 113a_4 of the second drift region 113_4, the second channel region C2_4, and the source region 112_4, which are connected to each other, may be a moving path of a current when the power semiconductor device 100_4 operates.

According to an embodiment, three well regions 110_4, which are adjacent to each other, among the well regions 110_4 may have equal spacing. Further, three source regions 112_4, which are adjacent to each other, among the source regions 112_4 may have equal spacing. For example, centers of three adjacent well regions 110_4 may be respectively disposed at vertexes of a regular triangle, and centers of three adjacent source regions 112_4 on the well regions 110_4 may also be respectively disposed at the vertexes of the same regular triangle. For example, the well regions 110_4 and the source regions 112_4 may be understood as indicating three parts forming a triangle as illustrated in FIG. 58.

According to an embodiment, the centers of seven adjacent well regions 110_4 among the well regions 110_4 may be respectively disposed at the center and vertexes of a regular hexagon. In addition, the centers of seven source regions 112_4 present on the seven adjacent well regions 110_4 from among the source regions 112_4 may be respectively disposed at the center and vertexes of the regular hexagon. For example, FIGS. 57 to 61 may be understood as illustrating seven well regions 110_4 and seven source regions 112_4.

In this structure, the well regions 110_4 and the source regions 112_4 may be disposed in a hexagonal closed packed arrangement structure, which is similar to a planar arrangement structure. In addition, the well regions 110_4 may have equal spacing between two adjacent well regions 110_4, and the source regions 112_4 may have equal spacing between two adjacent source regions 112_4.

In this structure, the trenches 116_4 may be disposed to form portions of lines each linking two adjacent to each other from among the center and vertexes of the regular hexagon such that seven adjacent source regions 112_4 are connected. In more detail, in FIG. 58, the trenches 116_4 may include six lines liking six source regions 112_4 disposed at the vertexes with one source region 112_4 disposed at the center of the regular hexagon, and six lines each linking two adjacent source regions from among six source regions 112_4 which are disposed at the vertexes.

According to an embodiment, the well regions 110_4 may be a portion of a spherical shape. When viewed from a plane view of the well region 110_4, the cross-section of the well region 110_4 has a circular shape at a region including the source region 112_4 and the well contact region 114_4, and has a ring shape or a doughnut shape a region, which does not include the source region 112_4 and the well contact region 114_4. Further, the well contact regions 114_4 may be formed in the ring shape or the doughnut shape, when viewed from a plane view. For example, when viewed from a plan view, the well contact regions 114_4 having the ring shape may be formed in the well regions 110_4 having the ring shape, and the source regions 112_4 having the circular shape may be formed in the well contact region 114_4 having the ring shape. The well contact regions 114_4 may be connected to the well regions 110_4, when viewed from a bottom view. When viewed from the plan view, the source regions 112_4 may be formed in a doughnut shape to surround the well contact regions 114_4. The shape when viewed from the plan view may be formed to a specific depth from the surface of the semiconductor layer 105_4.

According to an embodiment, a portion, which is formed under bottom surfaces of the trenches 116_4, of the well regions 110_4, for example, the first channel region C1_4 formed in the well regions 110_4 in the vicinity of the bottom surfaces of the trenches 116_4, may be connected to the protrusion part 113a_4 under the relevant portion.

For another example, when the whole thickness of the well region 110_4 under the bottom surface of each trench 116_4 is thicker than the thickness of the first channel region C1_4, the first channel region C1_4 may not be connected to the second drift region 113_4 formed under each trench 116_4. However, when each well region 110_4 has a spherical shape, since at least a lateral surface of the trench 116_4 is exposed from the well region 110_4 and is surrounded by the protrusion 113a_4 of the second drift region 113_4, the first channel region C1_4 may be connected from the protrusion 113a_4 of the second drift region 113_4, which is provided on the lateral side of the trench 116 or on the sidewall of the first part 120a_4 of the gate electrode layer 120_4, to the source region 112_4.

Although the above description has been made in that the first conductive type and the second conductive type are opposite to each other and are an N type and a P type, respectively, the first conductive type and the second conductive type may be the P type and the N type In more detail, when the power semiconductor device 100_4 is an N-type MOSFET, the first drift region 107_4 may be an N-region, the source region 112_4 and the drain region 102_4 may be N+ regions, the first channel region C1_4 and the second channel region C2_4 may adjust an N concentration through the counter doping, the well region 110_4 and the pillar region 109_4 may be P− regions, and the well contact region 114_4 may be a P+ region.

According to the power semiconductor device 100_4, a depth of the well regions 110_4 may be deeper than that of the trenches 116_4 and the gate electrode layer 120_4. Accordingly, corners, which are positioned on the bottom surface of the trench 116, of the first part 120a_4 of the gate electrode layer 120_4 may be surrounded by the well regions 110_4. Further, the bottom surface of the first part 120a_4 may be fully surrounded by the well regions 110_4. Such a structure may alleviate the concentration of the electric field on a partial corner portion of the bottom surface of the trench in the trench-type gate structure.

When the operating voltage is applied to the gate electrode layer 120_4, the electric field may be concentrated to the lower corner portions of the gate electrode layer 120_4. When the electric field is concentrated, the gate insulating layer 118_4 in the relevant region may receive severe stress, so dielectric breakdown of the gate insulating layer 118_4 may be caused. Therefore, according to the present embodiment, as lower portions, which are formed in the well region 110_4, of the gate electrode layer 120_4 may be surrounded by the well region 110_4 in the P type to achieve charge sharing, thereby preventing the dielectric breakdown of the gate insulating layer 118_4, as the electric field is concentrated on corner portions of the gate insulating layer 118_4.

When the power semiconductor device 100_4 operates, a current may mainly flow in a vertical direction from the drain region 102_4 along the second drift region 113_4 through the first drift region 107_4, and may then flow to the source region 112_4 through the first channel region C1_4 and the second channel region C2_4.

The power semiconductor device 100_4 may have a hybrid structure including both the trench-type gate structure and the planar-type gate structure. In addition, the power semiconductor device 100_4 may have a regular hexagon arrangement structure and may provide the high degree of integration with the high channel density by combining the trench-type gate structure and the planar-type gate structure. In addition, when compared to the case where only a planar-type structure is provided, the power semiconductor device 100_4 may maintain the degree of integration through the addition of the trench-type structure and may improve the channel mobility.

The power semiconductor device 100_4 described above forms the accumulation channel through the counter doping regions 108_4 to reduce the channel resistance in the first channel region C1_4 and the second channel region C2_4. In addition, the second drift region 113_4 having the same conductive type as that of the first drift region 107_4 is formed on an entire surface of the upper portion of the first drift region 107_4, to reduce the resistance (JFET resistance) in the flow of a current flowing through the vertical parts 113a_4.

Meanwhile, since the power semiconductor device 100_4 is used for high-power switching, the power semiconductor device 100_4 requires a high withstand voltage characteristic. When a high voltage is applied to the drain region 102_4, a depletion region may be expanded from the semiconductor layer 105_4 adjacent to the drain region 102_4 such that a voltage barrier of a channel is lowered. This phenomenon is called "drain induced barrier lowering (DIBL)".

The DIBL may make the first channel region C1_4 and the second channel region C2_4 abnormally turned on, and furthermore, may cause a punch through phenomenon, in which a depletion region is expanded between the drain region 102_4 and the source region 112_4 such that the drain region 102_4 and the source region 112_4 make contact with each other.

However, the power semiconductor device 100_4 described above may secure an appropriate withstand voltage characteristic by reducing the resistance between the first drift region 107_4, and the first channel region C1_4 and the second channel region C2_4, and suppressing an abnormal current flow and the punch through phenomenon caused by the DIBL, by using the pillar region 109_4 forming the super junction with the first drift region 107_4. Accordingly, even if the thickness of the first drift region 107_4 forming the body is reduced, the higher breakdown voltage may be maintained.

In addition, since the current flows through the vertical parts 113a_4 of the second drift region 113_4 in the power semiconductor device 100_4, the moving path of the current is reduced to increase the resistance (JFET resistance). However, according to the present embodiment, in the power semiconductor device 100_4, the JFET resistance may be reduced by using the pillar region 109_4 forming the super junction together with the first drift region 107_4. For example, a charge amount in the pillar region 109_4 and a charge amount in the first drift region 107_4 are adjusted to reduce the JFET resistance.

When the charge amount of the pillar region 109_4 is greater than the charge amount of the first drift region 107_4, and when the power semiconductor device 100_4 operates, a breakdown voltage may be increased by allowing the maximum electric field to be formed in the first drift region 107_4 on the same line as the bottom surface of the pillar region 109_4. For example, the charge amount of the pillar region 109_4 may become greater than the charge amount of the first drift region 107_4 by making a doping concentration of the second conductive type of impurities of the pillar region 109_4 higher than a doping concentration of the first conductive type of impurities of the first drift region 107_4, thereby enhancing the withstand voltage characteristic of the power semiconductor device 100_4, such that the JFET resistance is reduced.

Figure 63:
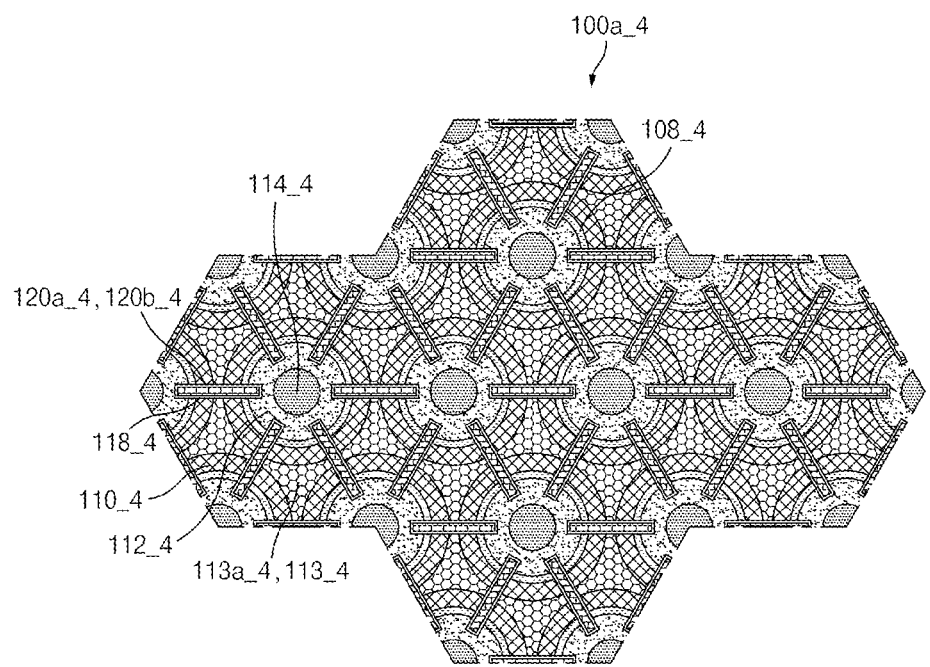
FIG. 63 is a plan view schematically illustrating the structure of a power semiconductor device, according to another embodiment of the present disclosure.

FIG. 63 is a plan view (or a horizontal sectional view) illustrating a power semiconductor device 100a_4 according to another embodiment of the present disclosure.

Referring to FIG. 63, the power semiconductor device 100a_4 shows a portion of a structure, in which a plurality of power semiconductor devices 100_4 in FIGS. 57 to 62 are arranged, and the same reference numerals of the components of power semiconductor devices 100_4 will be assigned to components of the power semiconductor device 100a_4. Accordingly, the duplication thereof will be omitted.

As the power semiconductor device 100a_4 is formed by repeating a hexagonal closed packed arrangement structure illustrated in FIGS. 57 to 62, the power semiconductor device 100a_4 may have the degree of higher integration.

Figure 64:
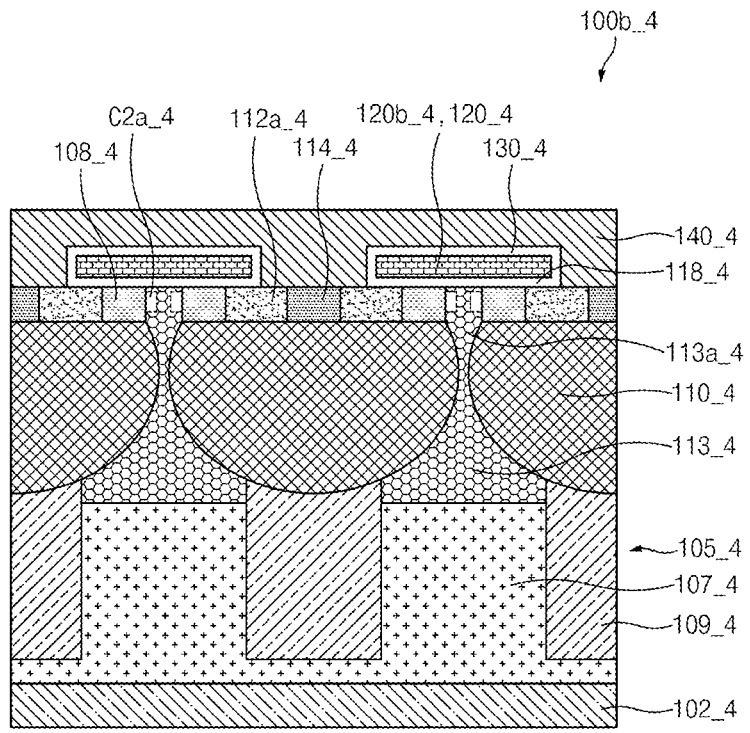
FIGS. 64 and 65 are cross-sectional views schematically illustrating the structure of a power semiconductor device, according to still another embodiment of the present disclosure.
Figure 65:
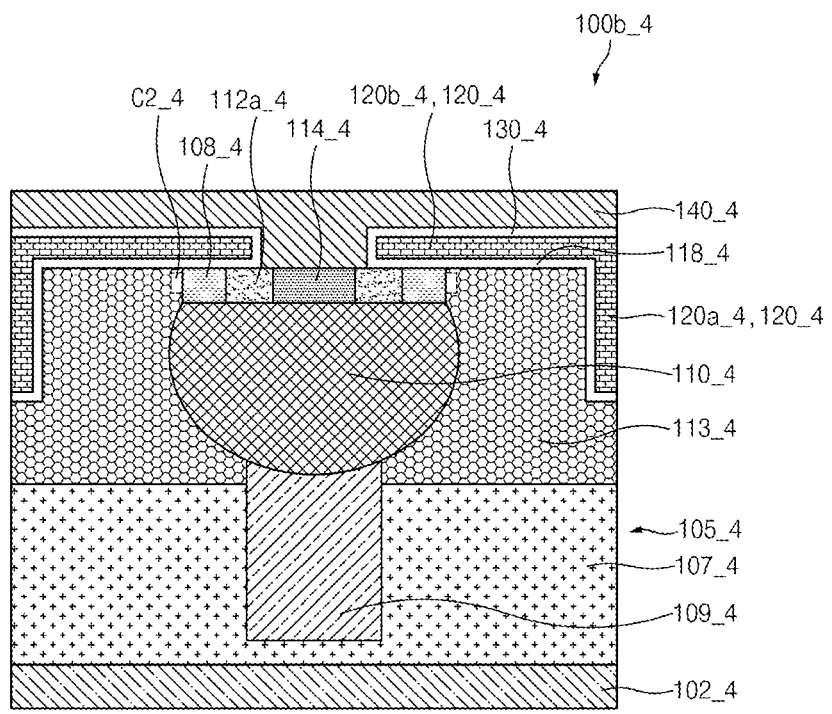

FIGS. 64 and 65 are cross-sectional views schematically illustrating the structure of a power semiconductor device, according to still another embodiment of the present disclosure; The power semiconductor device 100b_4 may be implemented by modifying a partial configuration of the power semiconductor device 100_4 of FIGS. 57 to 62, and the description of the power semiconductor device 100b_4 and the description of the power semiconductor device 100_4 make references to each other. Accordingly, the duplicated descriptions will be omitted.

Referring to FIGS. 64 and 65, in the power semiconductor device 100b_4, a second channel region C2a_4 may be formed in a semiconductor layer 105_4 between the second drift region 113_4 and the source region 112_4. For example, the second channel region C2a_4 may be formed in the semiconductor layer 105_4 between the protrusion part 113a_4 of the second drift region 113_4 and the source region 112a_4. The second channel region C2a_4 may include the first conductive type of impurities to form an accumulation channel. The accumulation channel may refer to that holes are accumulated in the well region having the P type which is the second conductive type.

However, in an embodiment of the present disclosure, since the counter doping region 108_4 is formed, as electrons forming the inversion channel are previously counter-doped, the term of the "accumulation channel" is used. In this embodiment, the counter doping regions 108_4 may be formed to be separated from the remaining portions of the source regions 112_4. A doping concentration of impurities of counter doping regions 108_4 may be equal to or different from that of the remaining portions of the source regions 112_4. According to an embodiment, the doping concentration of impurities of the counter doping regions 108_4 may be lower than that of the remaining portions of the source regions 112_4 or may be higher than that of the second drift region 113_4.

In an embodiment of the present disclosure, the previously-counter doped region may be defined as the counter doping region 108_4 to form a channel in a portion of the source region 112a_4. For example, the second channel region C2a_4 may have the doping type the same as the doping types of the source region 112a_4 and the second drift region 113_4. In this case, the source region 112_4, the second channel region C2a_4, and the second drift region 113_4 may have structure normally electrically connected to each other. The semiconductor layer 105_4 including SiC has negative charges, as a trap is present in the interface with the gate insulating layer. Accordingly, the band of the second channel region C2a_4 is curved upward to form a potential barrier, thereby increasing the threshold voltage. Accordingly, the channel is formed through counter doping region 108_4 which is previously counter doped, to decrease the threshold voltage to be lower than the threshold voltage to be applied to the gate electrode layer 120_4 to form the typical inversion channel.

According to an embodiment, the second channel region C2a_4 may be a portion of the second drift region 113_4. In more detail, the second channel region C2a_4 may be a portion of the protrusion portion 113a_4 of the second drift region 113_4. For example, the second channel region C2a_4 may be integrally formed with the second drift region 113_4. Accordingly, in the power semiconductor device 100b_4, the source regions 112a_4 may directly make contact with the second drift region 113_4 (for example, the protrusion 113a_4 of the second drift region 113_4), and the second channel region C2a_4 may be defined in a portion of the drift region 107_4 by the contact portion.

For example, a doping concentration of the first conductive type of impurities of the second channel region C2a_4 may be the same as that of the remaining portion of the second drift region 113_4 or may be different from each other to adjust a threshold voltage.

According to an embodiment, the well region 110_4 may be formed under the source regions 112a_4 to further protrude toward the protrusion part 113a_4 of the second drift region 113_4, as compared to the source regions 112a_4. In this case, the second channel region C2a_4 may be formed in the semiconductor layer 105_4 on the protruding portion of the well region 110_4. For example, the protrusion part 113a_4 of the second drift region 113_4 may further extend into a groove portion between the well region 110_4, and the second part 120b_4 of the gate electrode layer 120_4, and the second channel region C2a_4 may be formed at the extending protruding part. The above structure may define the second channel region C2a_4 between the second part 120b_4 of the gate electrode layer 120_4 and the well region 110_4.

In the power semiconductor device 100b_4, the first channel region C1_4 may be provided as an accumulation channel, which is similar to the power semiconductor device 100_4 of FIGS. 57 to 62.

Figure 66:
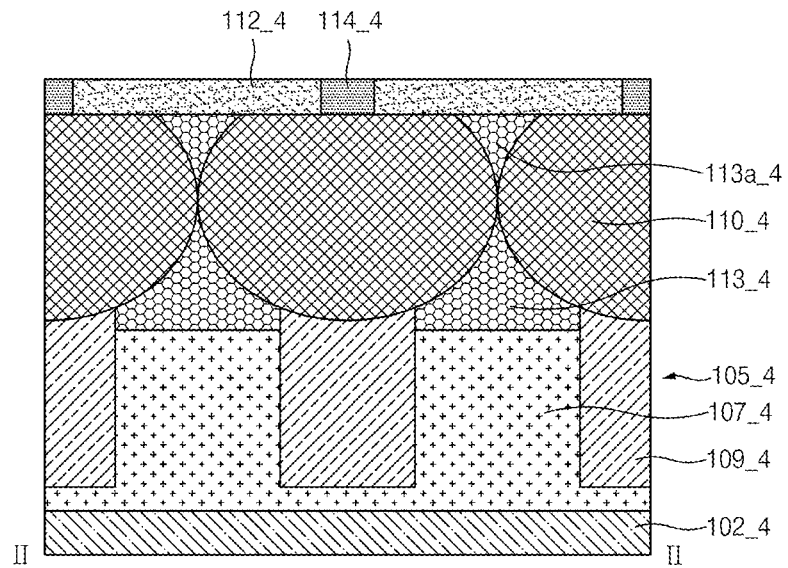
FIGS. 66 to 68 are cross-sectional views schematically illustrating a method for fabricating the power semiconductor device of FIG. 57.
Figure 67:
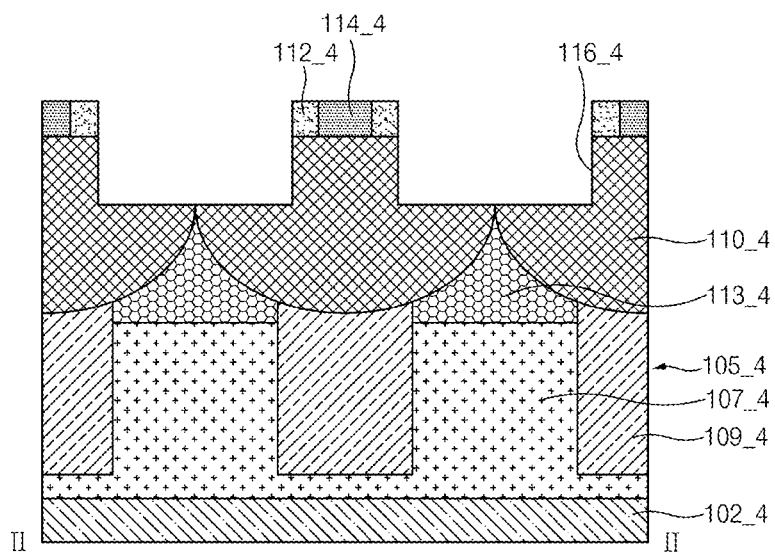
Figure 68:
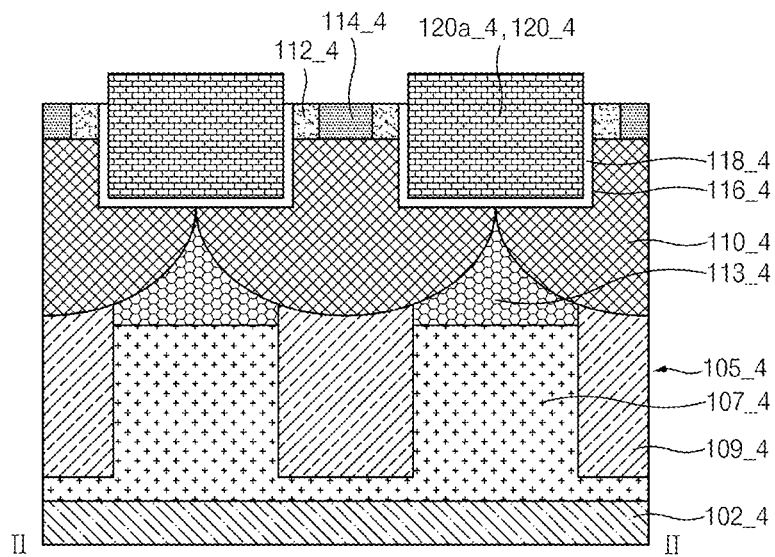
Figure 69:
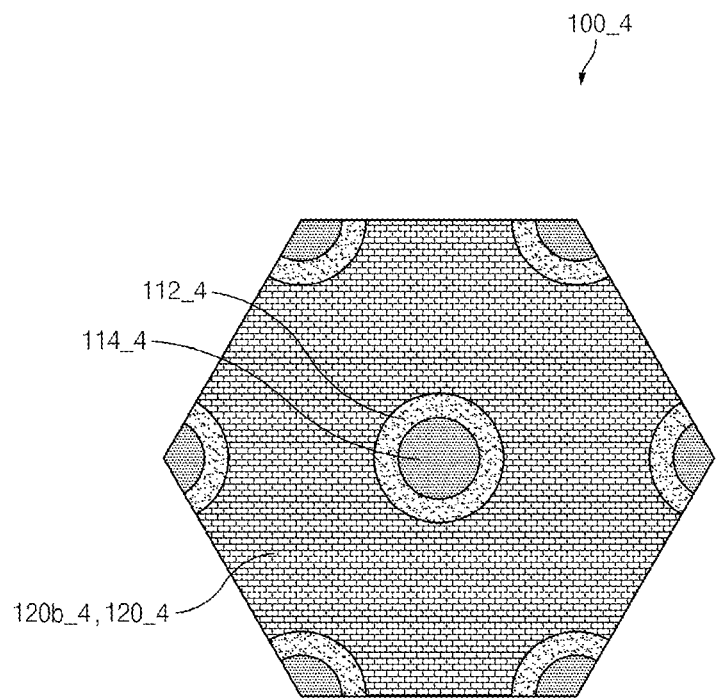
FIG. 69 is a plan view schematically illustrating the structure of the power semiconductor device of FIG. 68.

FIGS. 66 to 68, and 70 are cross-sectional views illustrating a method for fabricating the power semiconductor device 100_4, according to an embodiment of the present disclosure, and FIG. 69 is a plan view (a longitudinal-sectional view) of FIG. 68.

Referring to FIG. 66, the first drift region 107_4 having the first conductive type may be formed in the semiconductor layer 105_4 including silicon carbide (SiC) to provide a vertical moving path of a charge. For example, the first drift region 107_4 may be formed on the drain region 102_4 having the first conductive type. According to an embodiment, the drain region 102_4 may be provided in the form of a substrate having the first conductive type, and the first drift region 107_4 may include one or more epitaxial layers formed on the substrate.

Next, the second drift region 113_4 having the first conductive type may be formed to make contact with the entire surface of the upper portion of the first drift region 107_4. For example, the forming of the second drift region 113_4 may be performed by implanting the first conductive type of impurities into the first drift region 107_4. According to an embodiment, the second drift region 113_4 may be formed by doping the first drift region 107_4 with impurities having the first conductive type the same as that of the first drift region 107_4 and having a doping concentration of the impurities of the first drift region 107_4. The second drift region 113_4 may be actually formed to a specific depth from the surface of the semiconductor layer 105_4.

The pillar region 109_4 may be formed in the semiconductor layer 110_4 under the well region 110_4 such that the pillar region 109_4 is connected to the well region 105_4. The pillar region 109_4 may have the second conductive type to form a super junction together with the first drift region 107_4. For example, the pillar region 109_4 may be formed by implanting the second conductive type of impurities into the first drift region 107_4.

Next, the well regions 110_4 having the second conductive type may be formed in the semiconductor layer 105_4 to make contact with the second drift region 113_4. Adjacent well regions 110_4 of the well regions 110_4 may be formed to at least partially make contact with each other. In addition, the forming of the well regions 110_4 may be performed by implanting the second conductive type of impurities into the semiconductor layer 105_4. The well regions 110_4 may be actually formed to a specific depth from the surface of the semiconductor layer 105_4.

For example, the well regions 110_4 may be formed in the semiconductor layer 105_4, such that the second drift region 113_4 includes the protrusion parts 113a_4, at least portions of which are surrounded by the well regions 110_4. In more detail, the well regions 110_4 may be formed by doping impurities in a conductive type opposite to that of the second drift region 113_4 into the second drift region 113_4.

The source regions 112_4 having the first conductive type may be formed in the semiconductor layer 105_4 in the well regions 110_4 or on the well regions 110_4. For example, the forming of the source regions 112_4 may be performed by implanting the first conductive type of impurities into the well regions 110_4 and the second drift region 113_4. The source regions 112_4 may be actually formed at a specific depth of the well region 110_4 from the surface of the semiconductor layer 105_4.

In addition, the well contact regions 114_4 having the second conductive type may be formed in the source regions 112_4 or on the well regions 110_4. For example, the well contact regions 114_4 may be formed by implanting the second conductive type of impurities into the well regions 110_4 or into the source regions 112_4 at a high concentration. For example, the well contact regions 114_4 may be formed to have a circular shape when viewed in a plan view.

According to an embodiment, the well regions 110_4 may be formed to make contact with the second drift region 113_4, such that the second drift region 113_4 is connected to the surface of the semiconductor layer 107_4 while extending to pass through a space between the well regions 110_4 from the lower portions of the well regions 110_4.

According to a modification of the present embodiment, the sequence of doping impurities into the well regions 110_1, the counter doping region 108_4, the pillar region 109_4, the first drift region 107_4, the second drift region 113_4, the well contact regions 114_4, and the source regions 112_4 may be arbitrarily changed.

In the above fabricating method, the impurity implantation or the impurity doping may be performed such that the impurities are mixed, when the impurities are ion-implanted into the semiconductor layer 105_4 or when an epitaxial layer is formed. However, an ion implantation manner using a mask pattern may be used to implant impurities into a selective region.

Alternatively, a heat treatment process for activating or diffusing the impurities may be performed after the ion implantation.

Referring to FIG. 67, the plurality of trenches 116_4 may be formed to be recessed by a specific depth into the semiconductor layer 105_4 from the surface of the semiconductor layer 105_4.

For example, the trenches 116_4 may be formed to penetrate portions of the source regions 112_4 and to be recessed to a specific depth of the well regions 110_4 and the protrusions 113a_4 of the second drift region 113_4. In more detail, each of the trenches 116_4 may be formed to be recessed from the surface of the semiconductor layer 105_4 into the semiconductor layer 105_4, to connect two source regions 110_4, which are disposed at opposite sides of the trench 116_4, of the source regions 112_4 to each other, while extending by passing through the contact portion between adjacent well regions 110_4 of the well regions 110_4.

For example, the trenches 116_4 may be formed by forming a photo mask through a photo lithography process and then by etching the semiconductor layer 105_4 using the photo mask as an etching protective layer.

Referring to FIGS. 68 and 69, the gate insulating layer 118_4 may be formed on the inner walls of the trenches 116_4 and the surface of the semiconductor layer 105_4. For example, the gate insulating layer 118_4 may be formed by oxidizing the semiconductor layer 105_4 to form an oxide or by depositing an insulating material, such as an oxide or a nitride, on the semiconductor layer 105_4.

For example, the first part 120a_4, which is filled in the trench 116_4, and the second part 120b_4 formed on the surface of the semiconductor layer 105_4 may be formed on the gate insulating layer 118_4 to form gate electrode layers 120_4. In this case, the gate electrode layer 120_4 may not be formed in the well contact region 114_4 and in a partial region of the source regions 112_4 adjacent to the well contact region 114_4. For example, the gate electrode layer 120_4 may be formed after forming a conductive layer on the gate insulating layer 118_4 and patterning the conductive layer. The gate electrode layer 120_4 may be formed by doping impurities in polysilicon or may be formed to include a conductive metal or metal silicide.

The patterning process may be performed through photo lithography and etching processes. The photo lithography process may include a process of forming a photoresist pattern as a mask layer through a photo process and a developing process, and the etching process may include a process of selectively etching an underlying structure by using the photoresist pattern.

Figure 70:
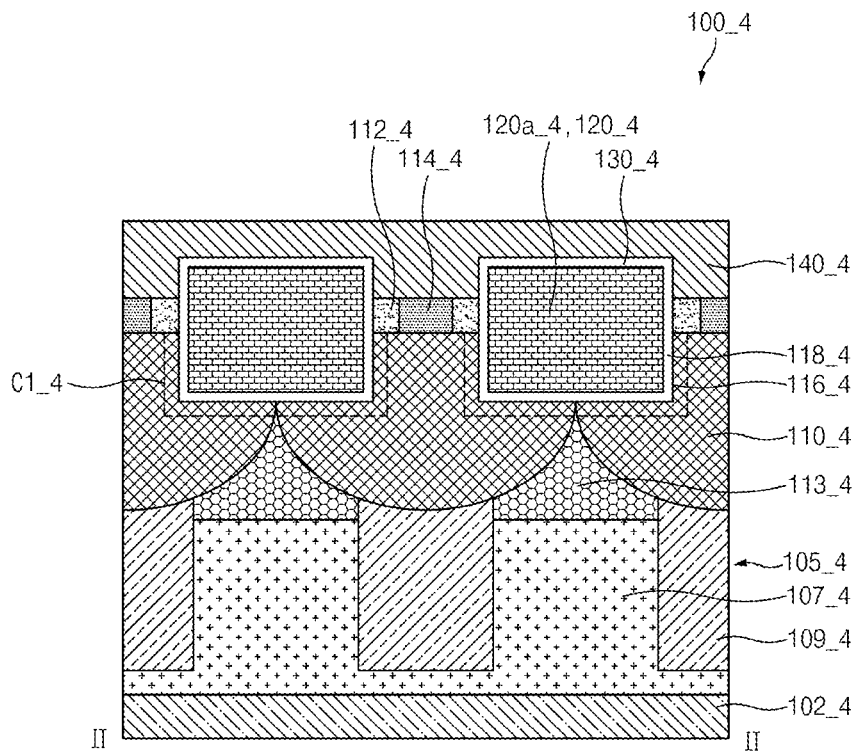
FIG. 70 is a cross-sectional view schematically illustrating a method for fabricating a power semiconductor device after the processes of FIG. 68.

Referring to FIG. 70, the interlayer insulating layer 130_4 may be formed on the gate electrode layer 120_4.

Subsequently, the source electrode layer 140_4 may be formed on the interlayer insulating layer 130_4. In addition, the source electrode layer 140_4 may be electrically connected to the source regions 112_4 and the well contact regions 114_4. For example, the source electrode layer 140_4 may be formed by forming a conductive layer, for example, a metal layer on the interlayer insulating layer 130_4 and patterning the conductive layer.

According to the fabricating method described above, the MOSFET structure having the hexagonal closed packed arrangement in the semiconductor layer 105_4 may be economically formed.

As described above, in the power semiconductor device according to an embodiment of the present disclosure, the super junction is formed in a three-dimension MOSFET structure having hexagonal closed packed arrangement. When viewed in a vertical aspect, charges are more shared spatially. Accordingly, a higher breakdown voltage may be formed as compared to a second-dimension MOSFET structure, under the condition in which the drift region 107 (epitaxial layer) has an equal thickness. In addition, the thickness of the epitaxial layer is more reduced under the equal breakdown voltage. Accordingly, the drift resistance may be reduced, and the whole resistance (Rsp) may be reduced. When viewed in a lateral aspect, and when depletion is completely achieved, the effect of sharing charges is laterally produced even between the pillar region 108 and the drain region 102 (epitaxial layer). Accordingly, the maximum size of the electric field, which is applied across between the trench-type gate insulating layer or the planar-type gate insulating layer, is lowered, thereby improving the reliability of the oxide layer.

In addition, in the power semiconductor device according to an embodiment of the present disclosure, the maximum size of the electric field, which is applied across between the trench-type gate insulating layer or the planar-type gate insulating layer, is lowered in the three-dimension MOSFET structure having hexagonal closed packed arrangement, thereby improving the reliability of the oxide layer.

As described above, the power semiconductor device according to an embodiment of the present disclosure may have the following effects.

First, the current may flow through the channel (or an inversion channel (which is provided under the planar-type gate electrode layer and on the sidewall of the trench-type gate structure, thereby increasing the channel density, such that the degree of integration is increased.

Second, as the pillar region is formed in the drift region, the thickness of the epitaxial layer may be more reduced under the condition of the same breakdown voltage. Accordingly, the drift resistance may be reduced, and the whole specific resistance (Rsp) value may be reduced.

Third, the maximum size of the electric field applied to the insulating layer is reduced due to the effect of sharing charges through the plurality of well regions, and the well region which protects the corners of the trench. Accordingly, the dielectric breakdown in the gate insulating layer may be delayed and the reliability may be improved.

Fourth, the impurity concentrations of the pillar region and the drift region may be adjusted, thereby reducing the JFET resistance and reducing the Rsp value.

Fifth, the JFET resistance may be reduced and a specific resistance (Rsp) may be reduced, in the flow of the current in the vicinity of the well region by implanting impurities, which is in the conducive type the same as the conductive type of the drift region, into the entire surface of the upper portion of the drift region.

Sixth, the channel resistance may be reduced by partially implanting impurities, which is in the type opposite to the type of the well regions, into the well regions, such that counter-doping is achieved.

Of course, these effects are exemplary, and the scope of the present disclosure is not limited by these effects.

However, this is only an example embodiment, and it will be understood that various modifications and other equivalent embodiments are possible from this point by those skilled in the art. The technical protection scope of the present disclosure will be defined by the technical spirit of the technical solutions of the present disclosure.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. A power semiconductor device comprising:
a semiconductor layer of silicon carbide (SiC);
a plurality of well regions disposed in the semiconductor layer such that two adjacent well regions at least partially make contact with each other, and having a second conductive type, wherein, as viewed from a plan view, the plurality of well regions includes seven well regions adjacent to each other and a center of each of the seven well regions is disposed at either a center of a regular hexagon or a vertex of the regular hexagon;
a plurality of source regions disposed on the plurality of well regions, respectively, in the semiconductor layer, and having a first conductive type opposite to the second conductive type;
a drift region disposed in the semiconductor layer while extending to a surface of the semiconductor layer from lower portions of the plurality of well regions through a region between the plurality of well regions, and having the first conductive type;
a plurality of trenches disposed to be recessed into the semiconductor layer from the surface of the semiconductor layer, wherein each trench connects two source regions of the plurality of source regions to each other while passing through a contact portion between the adjacent well regions of the plurality of well regions;
a gate insulating layer disposed on an inner wall of each of the plurality of trenches;
a gate electrode layer disposed on the gate insulating layer and including a first part disposed in each of the plurality of trenches and a second part disposed on the semiconductor layer; and
a pillar region positioned under each of the plurality of well regions to make contact with the drift region and the plurality of well regions in the semiconductor layer, and having the second conductive type.

2. The power semiconductor device of claim 1, wherein the drift region includes protrusion parts extending to the surface of the semiconductor layer among three well regions, which are adjacent to each other from among the plurality of well regions, and wherein the second part of the gate electrode layer is disposed on the adjacent well regions among the plurality of well regions and the protrusion part of the drift region.

3. The power semiconductor device of claim 1,
wherein the plurality of source regions includes seven source regions adjacent to each other and a center of each of the seven source regions is disposed at either the center of the regular hexagon or a vertex of the regular hexagon.

4. The power semiconductor device of claim 3, wherein each of the plurality of trenches includes a portion of a line linking two adjacent source regions to each other from among the plurality of source regions disposed at the center and vertexes of the regular hexagon, such that the seven adjacent source regions are connected.

5. The power semiconductor device of claim 1, further comprising:
a first channel region disposed in the semiconductor layer to correspond to the first part of the gate electrode layer and to be connected to the source regions making contact with the drift region and the plurality of trenches along the plurality of trenches; and
a second channel region disposed under the second part of the gate electrode layer and disposed in the semiconductor layer to make contact with the plurality of source regions.

6. The power semiconductor device of claim 5, wherein the first channel region and the second channel region together include an inversion channel having the first conductive type, in the plurality of well regions having the second conductive type, or together include an accumulation channel having the first conductive type when surfaces of the plurality of well regions include the second conductive type at a lower concentration than the interior of the plurality of well regions, and
wherein the first channel region and the second channel region are portions of the plurality of well regions.

7. The power semiconductor device of claim 1, wherein the plurality of source regions includes:
counter doping regions, respectively, and the counter doping regions include impurities of the first conductive type and contact the drift region.

8. The power semiconductor device of claim 7, wherein a first channel region and a second channel region have the first conductive type and together include an inversion channel or an accumulation channel through counter doping, and
wherein the first channel region and the second channel region are portions of the plurality of well regions.

9. The power semiconductor device of claim 7, wherein a portion of the plurality of well regions include an accumulation channel including the first conductive type of impurities.

10. The power semiconductor device of claim 1, further comprising:
a plurality of well contact regions disposed in the plurality of source regions and on the plurality of well regions and having the second conductive type; and
a source electrode layer connected to the plurality of source regions and the plurality of well contact regions.

11. The power semiconductor device of claim 10, wherein the plurality of well contact regions are disposed in a circular shape, when viewed from the plan view, and
wherein the plurality of source regions are disposed in a circular shape surrounding the plurality of well contact regions.

12. The power semiconductor device of claim 1, wherein a bottom surface of the first part of the gate electrode layer is surrounded by the plurality of well regions, when viewed from a cross-sectional view taken in an extending direction of the first part of the gate electrode layer.

13. The power semiconductor device of claim 1, wherein the semiconductor layer includes a single epitaxial layer.

14. The power semiconductor device of claim 1, wherein the semiconductor layer includes multiple epitaxial layers.

15. The power semiconductor device of claim 1, wherein the pillar region is disposed in the drift region.

16. The power semiconductor device of claim 1, wherein the plurality of well regions surrounds the plurality of trenches.

17. The power semiconductor device of claim 1, wherein the pillar region has a width narrower than a width of one well region among the plurality of well regions.

* * * * *